United States Patent
Empedocles et al.

(10) Patent No.: US 7,083,104 B1
(45) Date of Patent: Aug. 1, 2006

(54) APPLICATIONS OF NANO-ENABLED LARGE AREA MACROELECTRONIC SUBSTRATES INCORPORATING NANOWIRES AND NANOWIRE COMPOSITES

(75) Inventors: Stephen A. Empedocles, Menlo Park, CA (US); David P. Stumbo, Belmont, CA (US); Chunming Niu, Palo Alto, CA (US); Xiangfeng Duan, Mountain View, CA (US)

(73) Assignee: Nanosys, Inc., Palo Alto, CA (US)

( * ) Notice: Subject to any disclaimer, the term of this patent is extended or adjusted under 35 U.S.C. 154(b) by 0 days.

(21) Appl. No.: 11/226,187

(22) Filed: Sep. 14, 2005

Related U.S. Application Data

(62) Division of application No. 10/674,071, filed on Sep. 30, 2003.

(60) Provisional application No. 60/493,005, filed on Aug. 7, 2003, provisional application No. 60/474,065, filed on May 29, 2003, provisional application No. 60/468,276, filed on May 7, 2003, provisional application No. 60/445,421, filed on Feb. 5, 2003, provisional application No. 60/414,323, filed on Sep. 30, 2002.

(51) Int. Cl.
  *G06K 19/06* (2006.01)
(52) U.S. Cl. ............... 235/491; 235/492; 340/572.7
(58) Field of Classification Search ........... 235/492, 235/491; 340/570.7; 438/99, 382, 486
  See application file for complete search history.

(56) References Cited

U.S. PATENT DOCUMENTS

| | | | |
|---|---|---|---|
| 5,920,078 A | 7/1999 | Frey | |
| 5,962,863 A | 10/1999 | Russell et al. | |
| 6,256,767 B1 | 7/2001 | Kuekes et al. | |
| 6,274,007 B1 | 8/2001 | Smirnov et al. | |
| 6,438,025 B1 | 8/2002 | Skarupo | |
| 6,447,663 B1 | 9/2002 | Lee et al. | |
| 6,566,704 B1 | 5/2003 | Choi et al. | |
| 6,586,785 B1 | 7/2003 | Flagan et al. | |
| 6,672,925 B1 | 1/2004 | Talin et al. | |
| 6,706,566 B1 | 3/2004 | Avouris et al. | |
| 6,760,245 B1 | 7/2004 | Eaton et al. | |
| 6,790,425 B1 | 9/2004 | Smalley et al. | |
| 6,798,000 B1 | 9/2004 | Luyken et al. | |

(Continued)

FOREIGN PATENT DOCUMENTS

WO  WO-2004040671  5/2004

OTHER PUBLICATIONS

Chung, S-W et al., "Silicon nanowire devices" Appl. Phys Lett (2000) 76(15):2068-2070.

(Continued)

*Primary Examiner*—Thien M. Le
*Assistant Examiner*—Daniel A. Hess
(74) *Attorney, Agent, or Firm*—Andrew L. Filler

(57) ABSTRACT

Macroelectronic substrate materials incorporating nanowires are described. These are used to provide underlying electronic elements (e.g., transistors and the like) for a variety of different applications. Methods for making the macroelectronic substrate materials are disclosed. One application is for transmission an reception of RF signals in small, lightweight sensors. Such sensors can be configured in a distributed sensor network to provide security monitoring. Furthermore, a method and apparatus for a radio frequency identification (RFID) tag is described. The RFID tag includes an antenna and a beam-steering array. The beam-steering array includes a plurality of tunable elements. A method and apparatus for an acoustic cancellation device and for an adjustable phase shifter that are enabled by nanowires are also described.

35 Claims, 50 Drawing Sheets

U.S. PATENT DOCUMENTS

| | | |
|---|---|---|
| 6,815,218 B1 | 11/2004 | Jacobson et al. |
| 6,903,717 B1 | 6/2005 | Takahashi et al. |
| 2001/0054709 A1 | 12/2001 | Heath et al. |
| 2002/0117659 A1 | 8/2002 | Lieber et al. |
| 2002/0127495 A1 | 9/2002 | Scherer |
| 2002/0130311 A1 | 9/2002 | Lieber et al. |
| 2002/0130353 A1 | 9/2002 | Lieber et al. |
| 2002/0163079 A1 | 11/2002 | Awano |
| 2002/0173083 A1 | 11/2002 | Avouris et al. |
| 2002/0175408 A1 | 11/2002 | Majumdar et al. |
| 2002/0180306 A1 | 12/2002 | Hunt et al. |
| 2003/0012723 A1 | 1/2003 | Clarke |
| 2003/0042562 A1 | 3/2003 | Giebeler et al. |
| 2003/0089899 A1 | 5/2003 | Lieber et al. |
| 2003/0186522 A1 | 10/2003 | Duan et al. |
| 2003/0189202 A1 | 10/2003 | Li et al. |
| 2003/0211724 A1 | 11/2003 | Haase |
| 2004/0005258 A1 | 1/2004 | Fonash et al. |
| 2004/0031975 A1 | 2/2004 | Kern et al. |
| 2004/0036126 A1 | 2/2004 | Chau et al. |
| 2004/0036128 A1 | 2/2004 | Zhang et al. |
| 2004/0041617 A1 | 3/2004 | Snider et al. |
| 2004/0061422 A1 | 4/2004 | Avouris et al. |
| 2004/0149978 A1 | 8/2004 | Snider |
| 2004/0151012 A1 | 8/2004 | Snider et al. |
| 2004/0238887 A1 | 12/2004 | Nihey |
| 2005/0064618 A1 | 3/2005 | Brown et al. |
| 2005/0110641 A1 * | 5/2005 | Mendolia et al. ......... 340/572.7 |
| 2005/0161662 A1 | 7/2005 | Majumdar et al. |
| 2005/0212660 A1 * | 9/2005 | Hansen et al. ............. 340/10.3 |

OTHER PUBLICATIONS

Duan, X. et al., "High-performance thin-film transistors using semiconductor nanowires and nanoribbons" Nature (2003) 425:275-278.

Tans, S.J. et al., "Room-temperature transistor based on a single carbon nanotube" Nature (1998) 393:49-52.

Yamada, T., "Analysis of submicron carbon nanotube field-effect transistors" Appl. Phys. Lett (2000) 76:628-630.

* cited by examiner

| I-I GROUP | III-V GROUP BINARY | III-V GROUP TERNAR | II-VI GROUP BINARY | IV-V GROUP BINARY |
|---|---|---|---|---|
| Si | GaN | $Ga(A_{(-x)}P_x)$ | ZnS | PbSe |
| G | Ga | $In(A_{(-x)}P_x)$ | ZnSe | PbTe |
| $Si_{(-x)}G_x$ | GaAs | $(G_{(-x)}In_x)$ | CdS | |
| | InP | $(G_{(-x)}In_x)A$ | CdSe | |
| | InAs | $(Ga_{(-x)}In_x)$ $(A_{(-x)}P_x)$ | $Cd(S_{(-x)}Se_x)$ | |
| | InSb | | | |

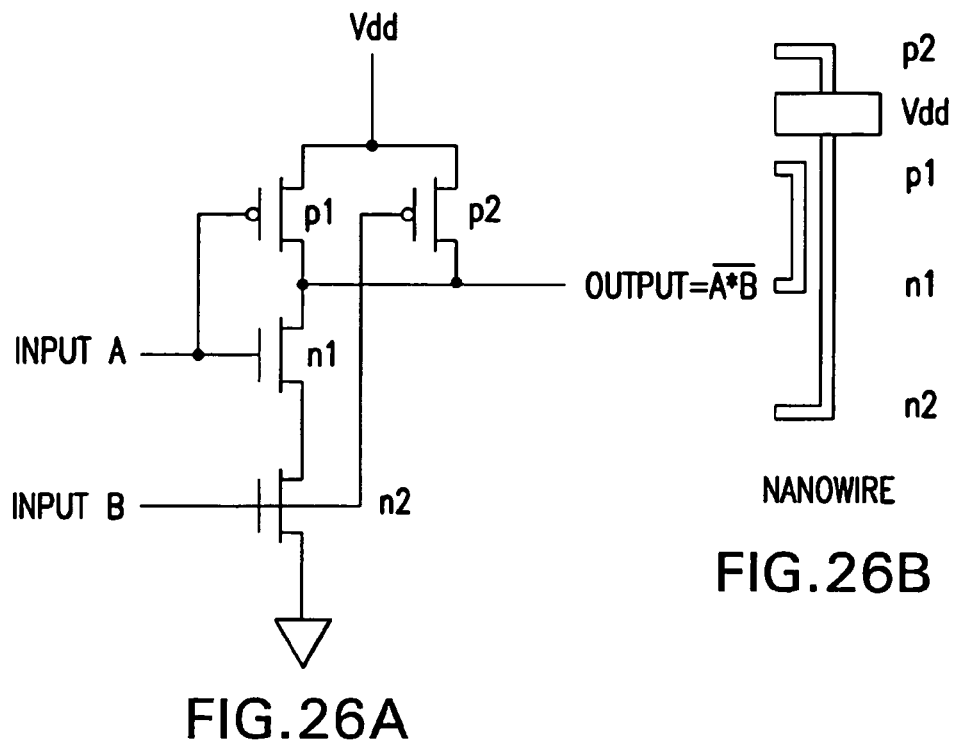
FIG.26A
FIG.26B
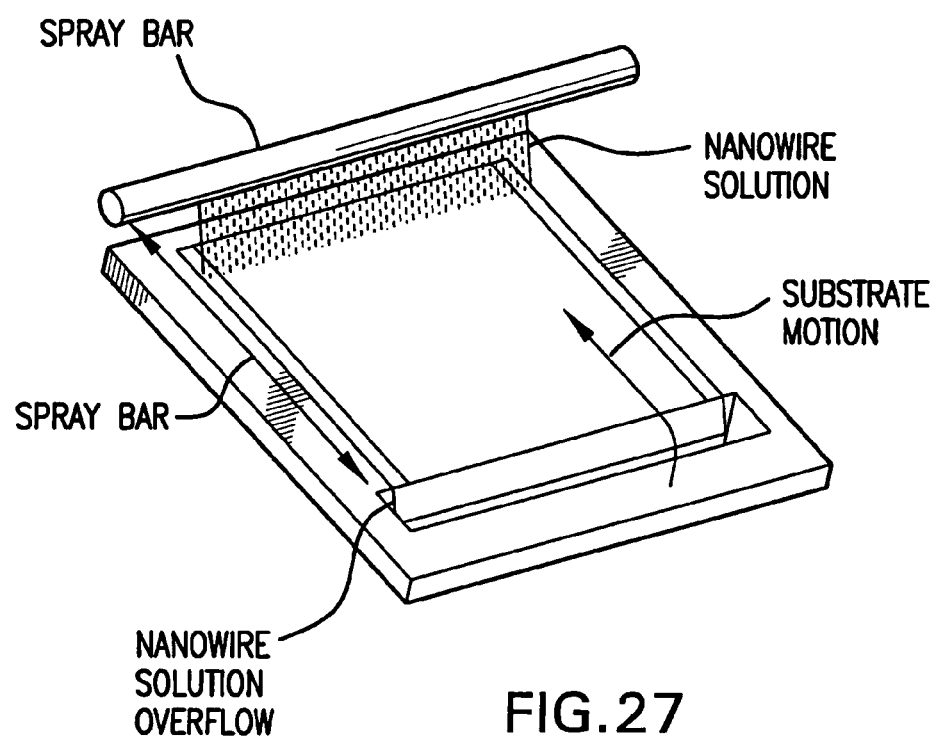
FIG.27

APPLICATIONS OF NANO-ENABLED LARGE AREA MACROELECTRONIC SUBSTRATES INCORPORATING NANOWIRES AND NANOWIRE COMPOSITES

CROSS-REFERENCE TO RELATED APPLICATIONS

This application is a divisional of U.S. patent application Ser. No. 10/674,071, filed Sep. 30, 2003, which claims the benefit of U.S. Provisional Application Nos. 60/414,323, filed Sep. 30, 2002; 60/445,421 filed Feb. 5, 2003; 60/468,276, filed May 7, 2003; 60/474,065, filed May 29, 2003; and 60/493,005, filed Aug. 7, 2003, each of which is incorporated herein in its entirety by reference.

BACKGROUND OF THE PRESENT INVENTION

1. Field of the Present Invention

The present invention relates to semiconductor devices, and more particularly, to the use of thin films of nanowires in semiconductor devices for various applications.

2. Background Art

An interest exists in industry in developing low cost electronics, and in particular, in developing low cost, large area macroelectronic devices. Large-area macroelectronics is defined as the implementation of active and sensory electronic components over a large surface area. Here, a large area is not used to fit all of the electronic components, but rather because such systems must be physically large to realize improved performance and the active components of such systems must be distributed over the large area to realize a useful functionality. The incorporation of active devices over a large common substrate is driven by system performance, reliability, and cost factors, not necessarily by individual component performance. Such large area macroelectronic devices could revolutionize a variety of technology areas, ranging from civilian to military applications. Example applications for such devices include driving circuitry for active matrix liquid crystal displays (LCDs) and other types of matrix displays, smart libraries, credit cards, radio-frequency identification (RFID) tags for smart price and inventory tags, security screening/surveillance or highway traffic monitoring systems, large area sensor arrays, and the like.

Current approaches involve using amorphous silicon or polysilicon as the base materials for thin-film transistors (TFTs). Organic semiconductors are emerging as an alternative. However, amorphous silicon and organic semiconductors have performance limitations. For example, they exhibit low carrier mobility, typically about 1 $cm^2/V \cdot s$ (centimeter squared per volt second) or less. Polysilicon has showed improved performance, but requires relatively expensive processes, such as laser induced annealing, and is incompatible with low temperature substrates, such as cheap glass and plastics.

Unfortunately, traditional electronic materials are characterized by a roughly inverse relationship between electronic performance (determined primarily by carrier mobility, $\mu$) and available substrate size. FIG. 1 is a plot that schematically illustrates materials performance (mobility) vs. available substrate size for different semiconductor materials. Traditional materials either have high performance but small substrate sizes (e.g., GaAs), or larger sizes with low performance (e.g., amorphous silicon or organics). Current electronic materials can only access the most primitive large-area macroelectronics applications. This leaves a tremendous void in materials characteristics, which has prevented the development of the highest-value macroelectronic applications, such as wearable communications and electronics, distributed sensor networks, and radio frequency (RF) beam-steering systems, to name a few.

For instance, to realize a beam-steering reflector for use within a space-fed antenna system, the steering-element circuits would have to be distributed across the entire reflector, each with extreme performance requirements typically associated with high-mobility InAs substrates. InAs wafers, however, are currently limited to a maximum of 3–4 inches (8–10 cm) in diameter and are extremely brittle, making them inappropriate for use in such large-area distributed electronic circuits. As such, the only methods currently available for fabricating such large-area circuits are to wire-bond or solder discrete transistors and components on the large-area active reflector, a costly and failure-prone alternative with inherent performance and efficiency limitations. Today, even military applications of such arrays are limited to such examples as solid communications arrays on Navy destroyers; they cannot be implemented into mobile, let alone man-portable, communications systems.

Accordingly, what is needed are higher performance conductive or semiconductive materials and devices, electronic substrate materials, and methods and systems for producing lower-cost, high performance electronic devices and components. Preferably, such materials would be readily available, cost effectively manufactured, and enjoy other advantages with regards to weight, flexibility, and the like.

Many applications can benefit from such higher performance conductive semiconductive materials, including acoustic cancellation and RF identification (RFID) tag/reader applications. In RFID tag applications, a device known as a "tag" may be affixed to items or objects that are to be monitored. The presence of the tag, and therefore the presence of the item to which the tag is affixed, may be checked and monitored by devices known as "readers." A reader may monitor the existence and location of the items having tags affixed thereto through wireless interrogations. Typically, each tag has a unique identification number that the reader uses to identify the particular tag and item.

A limiting factor in the area of RFID tag tracking systems is the cost of the tags. Further limiting factors include the distance between the reader and tags, and the orientation of tag antennas relative to the reader antenna. If a tag antenna is not oriented properly relative to the reader antenna, the tag must be close to the reader to be detected.

These limiting factors are critical when attempting to read multiple tags affixed to items within a container that is in transit from one location to another. For example, a shipping truck may pass through a checkpoint at 60 mph. If the truck is transporting a large number of tagged items, such as tens or hundreds of thousands of items, the truck must be within a reader's range long enough to detect all of the tags. If each item within the container on the truck is randomly oriented, causing a maximum read distance for the container to be low, the reader may only have a few seconds to read all of the tags. Current tag and reader technology is not capable of reading such a large number of items in a few seconds.

Thus, what is also needed are methods and systems for increasing a read rate for tags, for increasing a distance over which the tags may be read, and for lower cost tags.

In acoustic cancellation applications, an attempt is made to cancel or reduce specific frequencies of sound, such as the cancellation or reduction of noise. For example, in some instances it may be desirable to partially or completely cancel the sound emanating from objects such as a car, a bus, or even an airplane. In military applications, it may be desirable to partially or completely cancel sounds from objects such as a tank or submarine. Some conventional headphones incorporate technology that monitors noise around the headphones, and transmits a pattern of acoustic waves in an attempt to substantially cancel the outside noise. The transmitted pattern of acoustic waves is transmitted with an opposite phase to that of the noise. This transmitted pattern attempts to silence the noise, making it easier to hear what is being played through the headphones. However, such technology is limited to relatively small size devices, such as headphones, and cannot be applied to the large objects mentioned above.

Thus, what is further needed are methods and systems for performing acoustic cancellation that effectively operate to cancel sounds and/or noise over any size area, including large areas.

BRIEF SUMMARY OF THE PRESENT INVENTION

The present invention is directed to a paradigm shift in materials technology; namely, applying nanomaterials to the field of macroelectronics. The result is a revolutionary new high-performance large-area macroelectronics technology on a variety of substrates, for example plastics, that: (1) outperforms single-crystal silicon wafers ($\mu$>5,000 cm$^2$/V·s and on/off current ratio $I_{on}/I_{off}$>10$^7$ with a threshold potential $V_{on}$<1 V); (2) can be applied to extremely large surface areas (A>10 m$^2$); (3) has the flexibility of polymer electronics (radius of curvature r<1 mm); and/or (4) can be processed and patterned using traditional large-area semiconductor processing techniques like those used to process amorphous silicon, as well as advanced lithographic techniques such as roll-to-roll screen-printing.

This technology combines the extraordinary conductive properties of a new type of nanomaterial (inorganic semiconductor nanowires) with large-area macroelectronics by producing dense films of preferentially oriented nanowires that span the gap between each source and drain electrode within a device. The result is an electronic material for use in large-area macroelectronics with mobility ($\mu$) and current capacity (J) equal to or greater than that of single-crystal silicon. By incorporating alternative nanowire materials such as InAs or GaAs, even higher-performance substrates can be realized. This new-material technology (referred to herein as dense, inorganic and oriented nanowire (DION) thin-film technology and mixed-composition DION thin-film technology) can fill the void in large-area electronic materials (as shown at FIG. 1) to enable the full vision of macroelectronics in commercial, military, and security application. For example, FIG. 2 shows several potential applications of true high-performance macroelectronics.

The present invention is also directed to methods, systems, and apparatuses for an electronic substrate having one or more semiconductor devices formed thereon is described. A thin film of semiconductor nanowires is formed on a substrate. The thin film of nanowires is formed to have a sufficient density of nanowires to achieve an operational current level. A plurality of semiconductor regions are defined in the thin film of nanowires. Contacts are formed at the semiconductor device regions to thereby provide electrical connectivity to the plurality of semiconductor devices.

In aspects of the present invention, semiconductor devices incorporating thin films of nanowires are used in many applications.

In an aspect of the present invention, a method and apparatus for an adjustable phase shifter is described. A conductor line on a substrate includes a first conductive segment and a second conductive segment. A thin film of nanowires is formed on the substrate in electrical contact with the first conductive segment and the second conductive segment. A plurality of gate contacts are in electrical contact with the thin film of nanowires, and are positioned between the first conductive segment and the second conductive segment. A phase of an electrical signal transmitted through the conductor line is adjusted by changing a voltage applied to at least one gate contact of the plurality of gate contacts.

In another aspect of the present invention, a method and apparatus for a radio frequency identification (RFID) tag is described. The RFID tag includes an antenna and a beam-steering array. The beam-steering array includes a plurality of tunable elements. Each tunable element includes a plurality of phase-adjustment components and a switch corresponding to each phase-adjustment component. The switch includes a transistor formed by a film of nanowires. The switch enables the corresponding phase-adjustment component to change a phase of the tunable element.

An electromagnetic (EM) signal transmitted by the antenna is redirected by the beam-steering array. In one aspect, the beam-steering array focuses the EM signal. In another aspect, the beam-steering array spreads the EM signal. In still another aspect, the beam-steering array changes a direction of the EM signal.

In aspects of the present invention, each phase-adjustment element comprises an inductor, such as a micro-strip inductor, or a capacitor.

In an aspect of the present invention, the beam-steering array is a beam-steering reflector. The tunable elements are tunable cells that are co-planar. Each tunable cell includes a resonant structure. Each switch enables the electrical coupling of the corresponding phase adjustment component to the resonant structure to change a phase of the tunable cell.

In another aspect of the present invention, a method and apparatus for a RFID tag is described. The RFID tag includes a beam-steering array. The beam-steering array includes a plurality of tunable antenna elements. Each tunable antenna element includes a plurality of phase-adjustment components and a switch corresponding to each phase-adjustment component. The switch includes a transistor formed by a thin film of nanowires in electrical contact with source and drain contacts. The switch enables the corresponding phase-adjustment component to change a phase of the tunable antenna element. An EM signal transmitted by the beam-steering array is directed by controlling the phase of each of the plurality of tunable antenna elements.

In an aspect of the present invention, the tunable elements are tunable transmission line segments. The switch shorts the transmission line segment to change a length of the transmission line segment to change a phase of the respective tunable antenna element.

In further aspects of the present invention, a method and apparatus for a RFID reader is described. The RFID reader includes a beam-steering array, such as the beam-steering arrays mentioned above for RFID tags.

In another aspect of the present invention, a method and apparatus for providing acoustic cancellation is described. An acoustic cancellation device includes a substrate and a plurality of acoustic cancellation cells formed in an array on a surface of the substrate. Each acoustic cancellation cell of the plurality of acoustic cancellation cells includes an acoustic antenna, a processor, a transistor, and an actuator. The acoustic antenna receives a first acoustic signal. The processor processes the received first acoustic signal, and generates a corresponding cancellation control signal. The transistor includes a thin film of nanowires. The thin film of nanowires is in electrical contact with a drain contact and a source contact of the transistor. A gate contact of the transistor is coupled to the cancellation control signal. The actuator is coupled to the transistor. The transistor causes the actuator to output a second acoustic signal according to the cancellation control signal. The second acoustic signal substantially cancels the first acoustic signal.

In an aspect of the present invention, the second acoustic signal has a substantially opposite phase compared to the first acoustic signal.

In one aspect, the actuator includes an audio speaker.

In another aspect, the actuator includes a thin film of piezoelectric nanowires. The transistor allows a current to flow through the thin film of piezoelectric nanowires to generate the second acoustic signal.

In an alternative aspect, the actuator and transistor are combined. The transistor includes a thin film of piezoelectric nanowires. When current flows through the thin film of piezoelectric nanowires of the transistor, the second acoustic signal is generated.

These and other objects, advantages and features will become readily apparent in view of the following detailed description of the present invention.

BRIEF DESCRIPTION OF THE DRAWINGS/FIGURES

The accompanying drawings, which are incorporated herein and form a part of the specification, illustrate the present invention and, together with the description, further serve to explain the principles of the present invention and to enable a person skilled in the pertinent art to make and use the present invention.

Figure 5A:
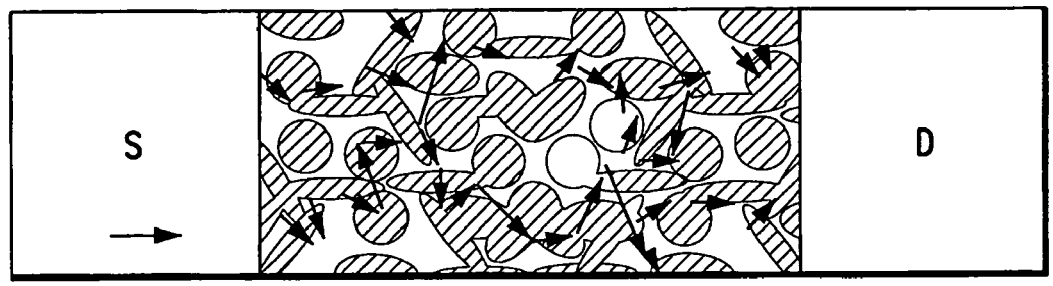
Figure 5B:
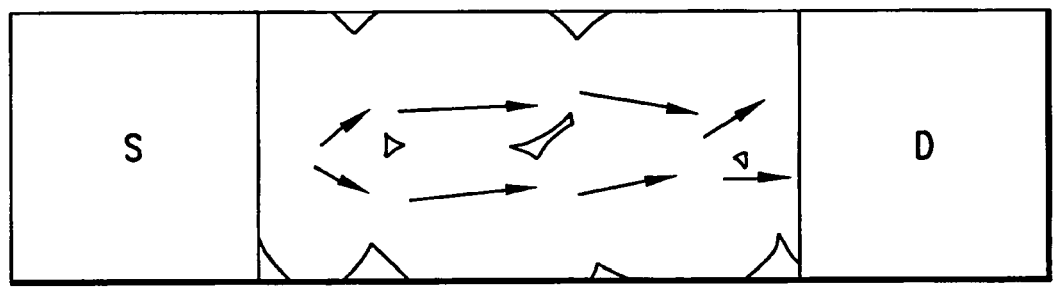
Figure 5C:
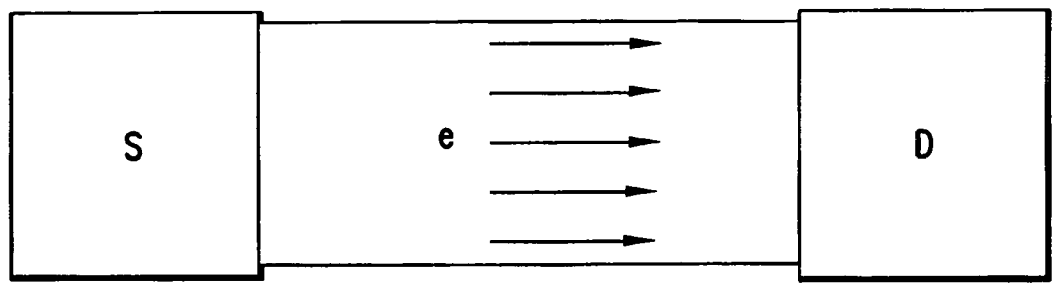

FIG. 5 schematically illustrates the length scale of order.

Figure 6:
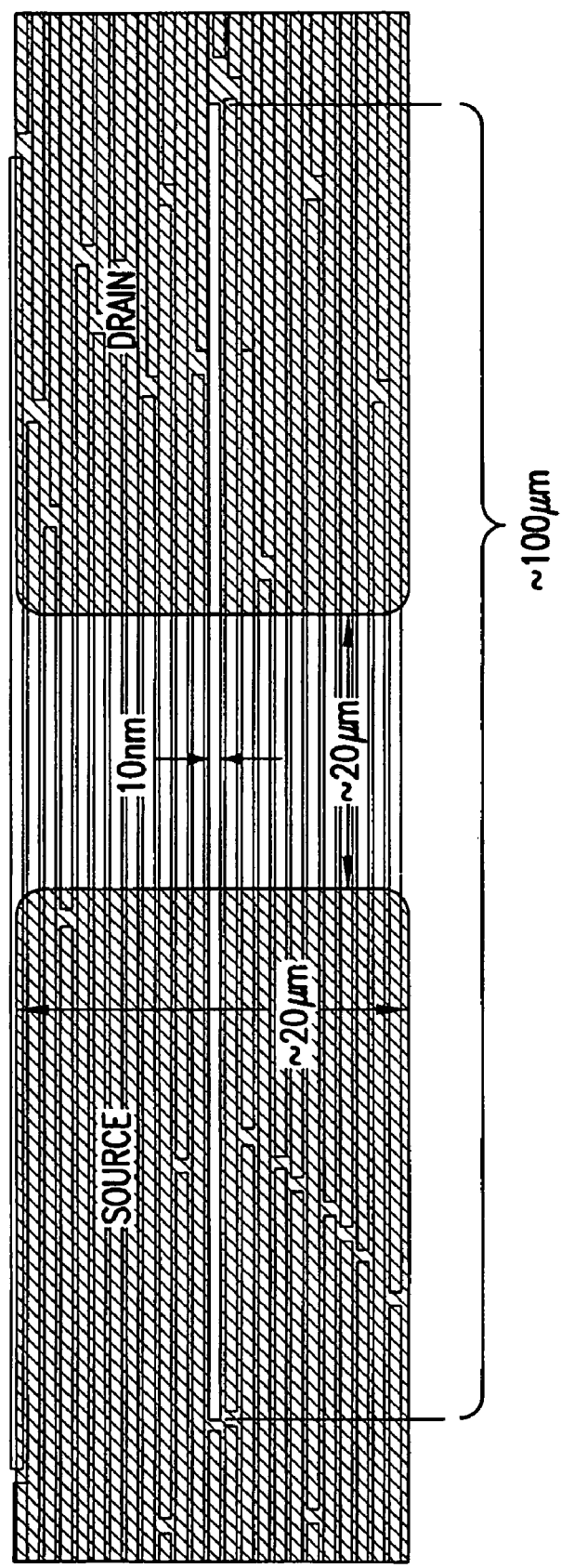

FIG. 6 schematically illustrates the length scales of nanowires.

Figure 7:
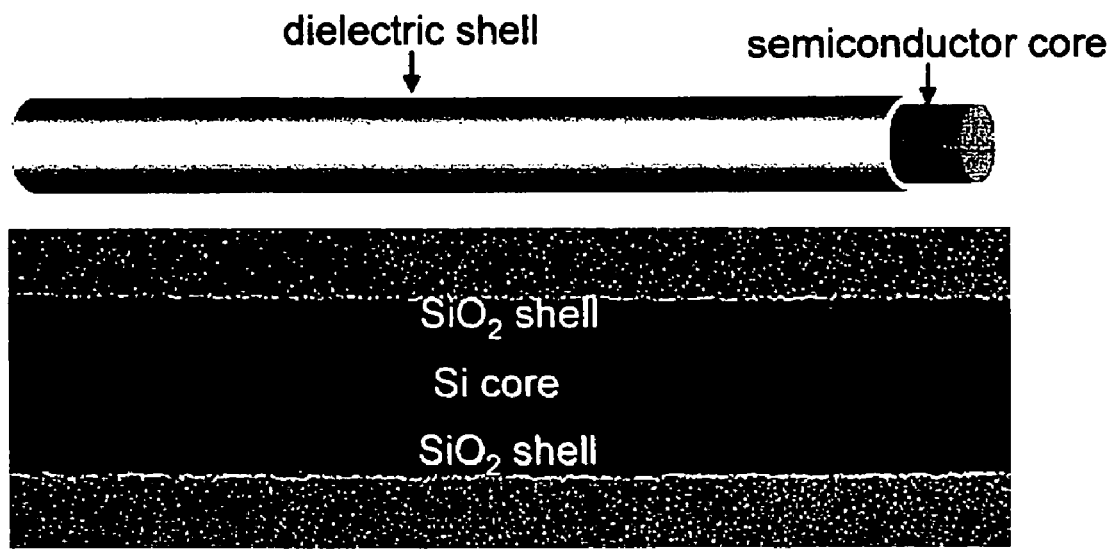

FIG. 7 illustrates a semiconductor/dielectric core-shell structure.

Figure 8:
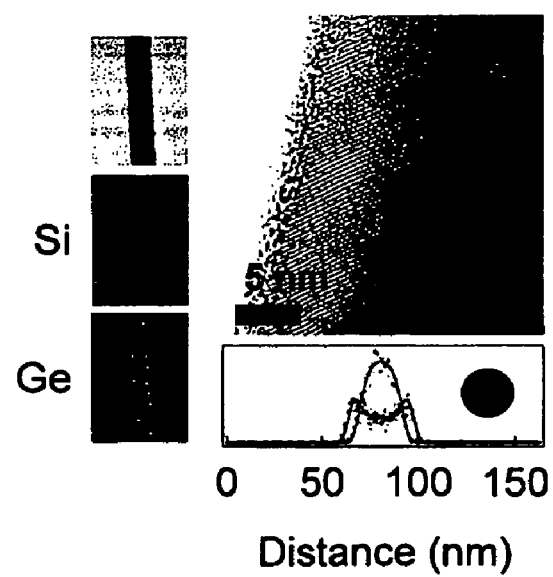

FIG. 8 illustrates a transmission electron microscope (TEM) and energy dispersive X-ray analysis (EDX) images of the cross section and composition of a multi-shell nanowire with a germanium core, a silicon inner shell and a silica outer shell.

Figure 9:
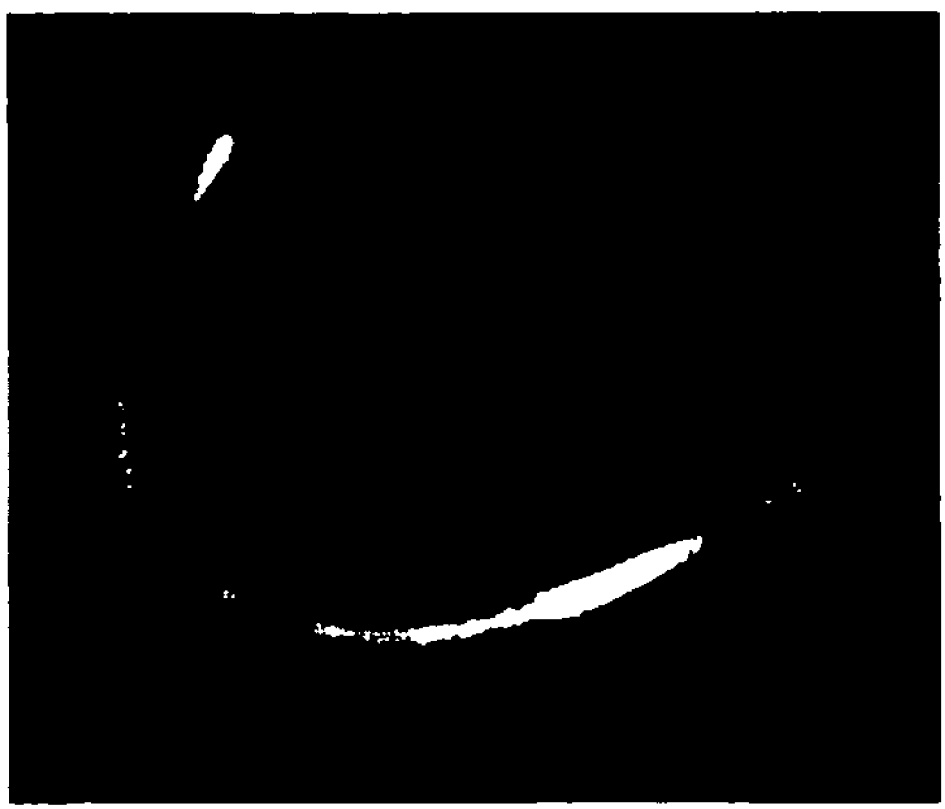

FIG. 9 shows a dark-field optical micrograph (OM) of a nanowire with bend r<10 μm.

Figure 10:
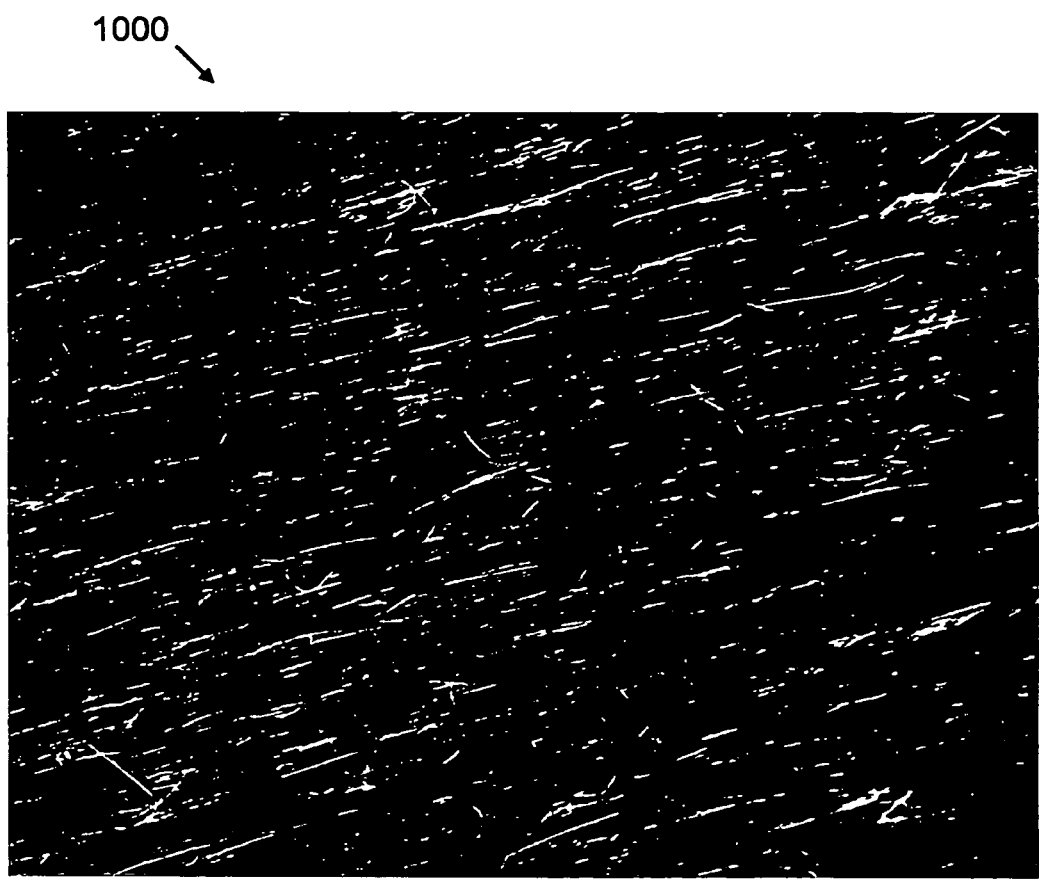

FIG. 10 shows a view of a portion of a thin film of nanowires, according to an example embodiment of the present invention.

Figure 11:
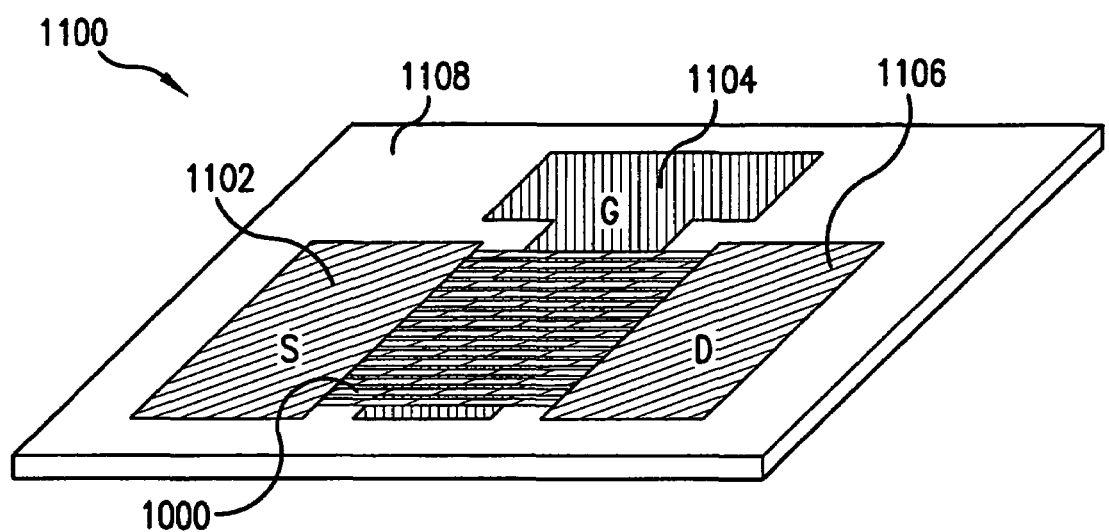

FIG. 11 shows a semiconductor device that includes a thin film of nanowires, according to an example embodiment of the present invention.

FIGS. 12A–12D shows nanowires doped according to various example embodiments of the present invention.

Figure 13A:
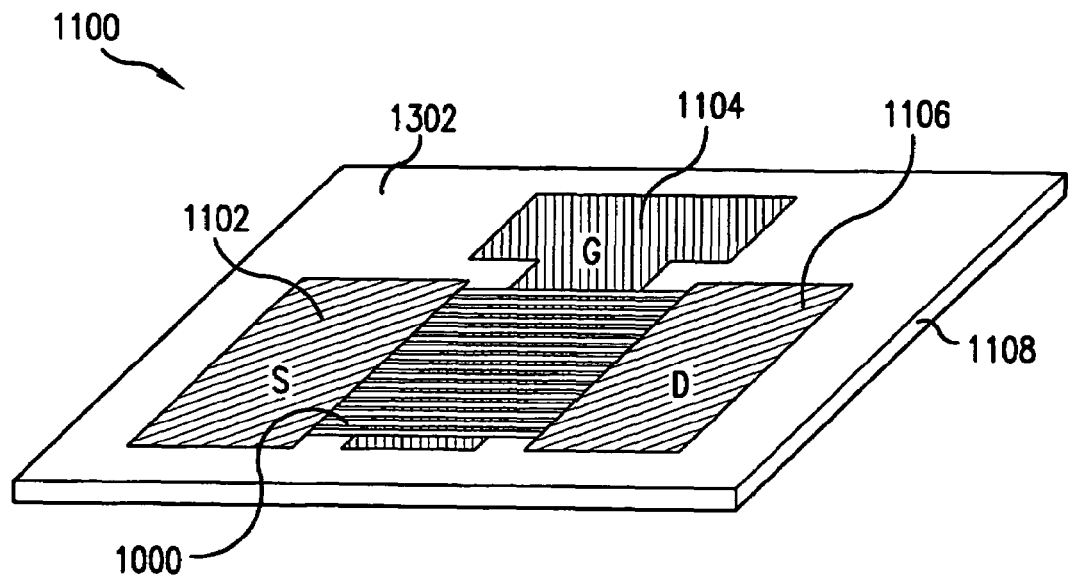
Figure 13B:
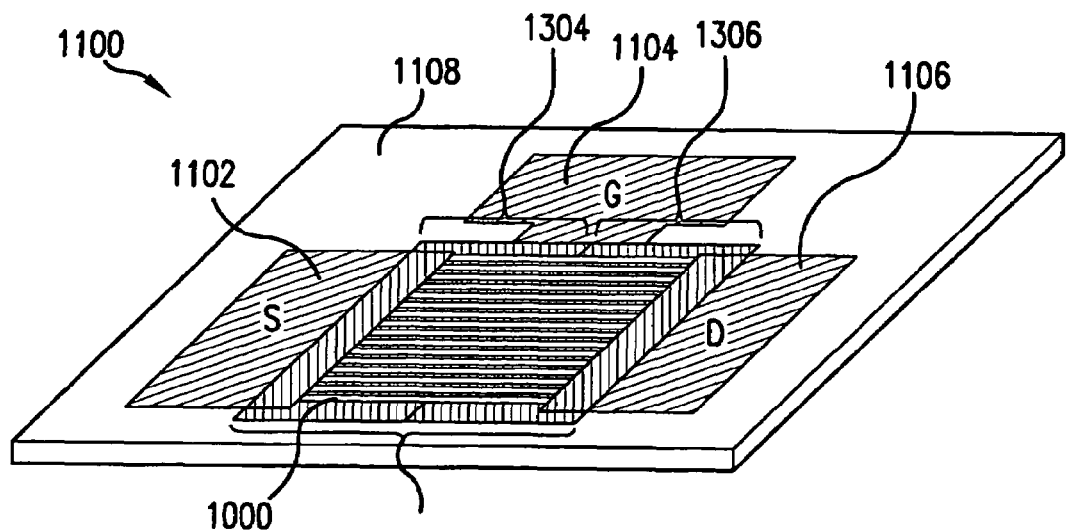

FIGS. 13A and 13B show examples of a semiconductor device, doped according to example doping embodiments of the present invention.

Figure 14:
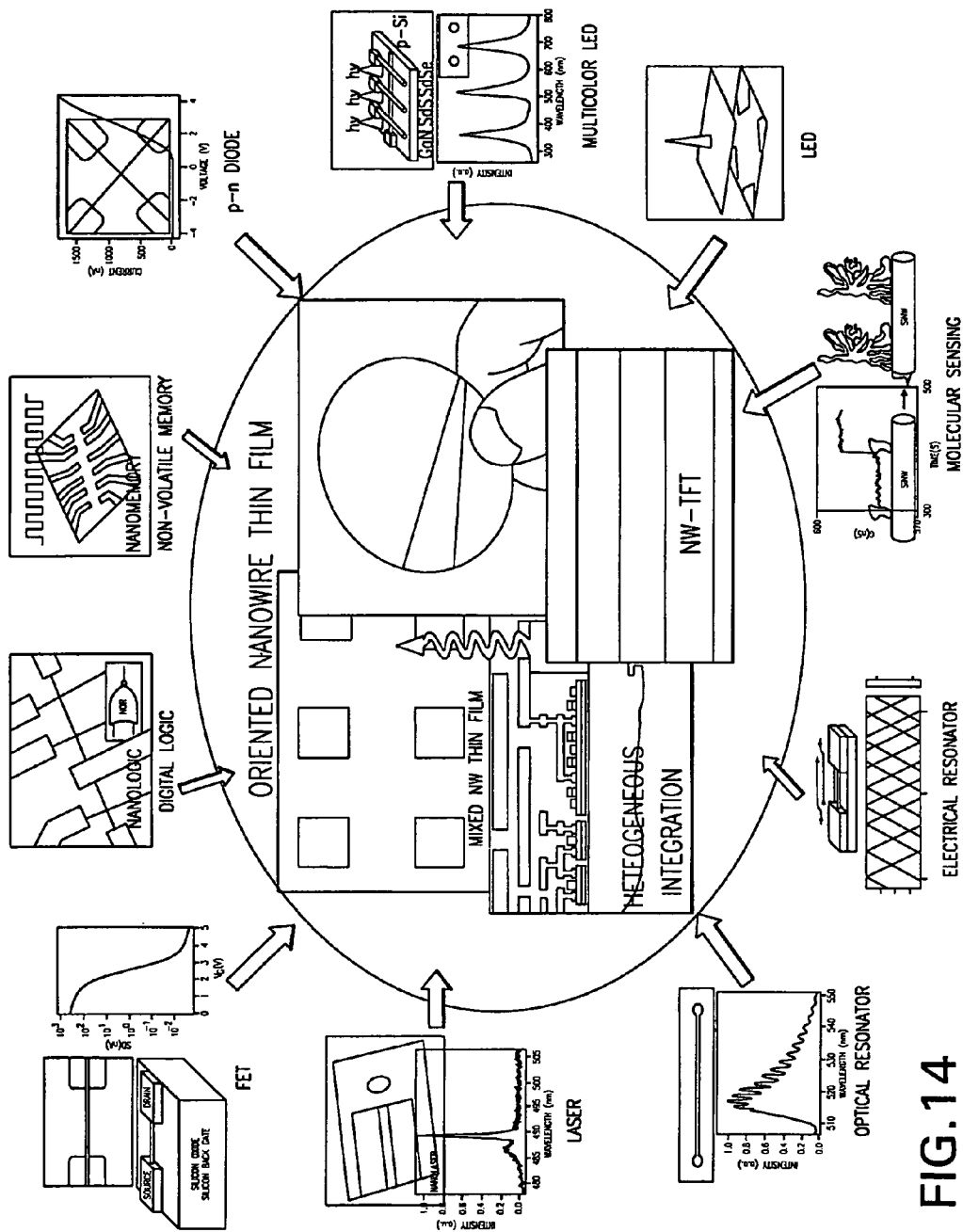

FIG. 14 shows an overview of a multifunctional mixed nanowire thin film.

Figure 15A:
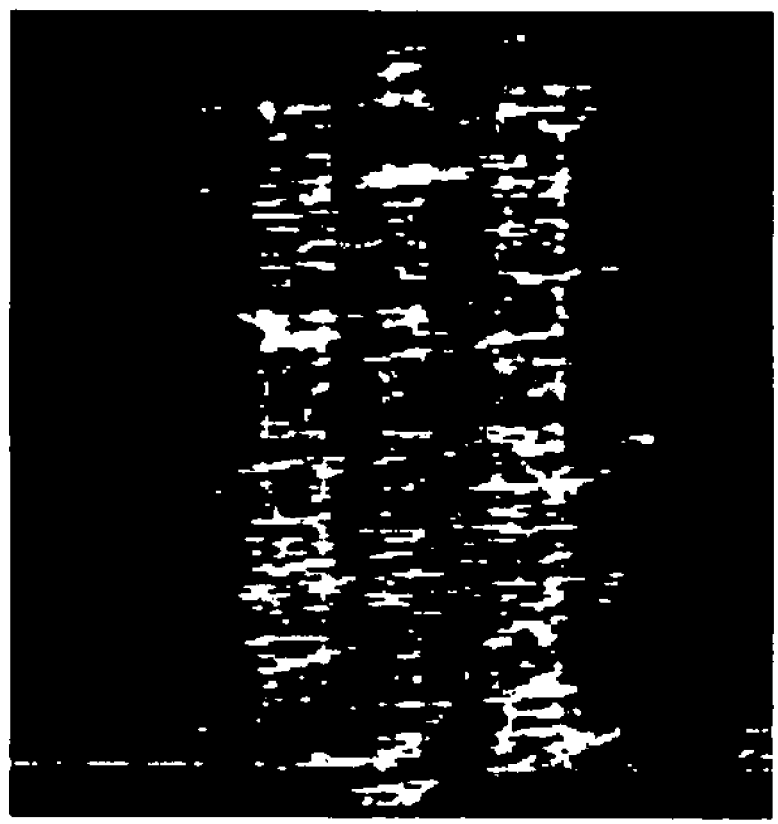
Figure 15B:
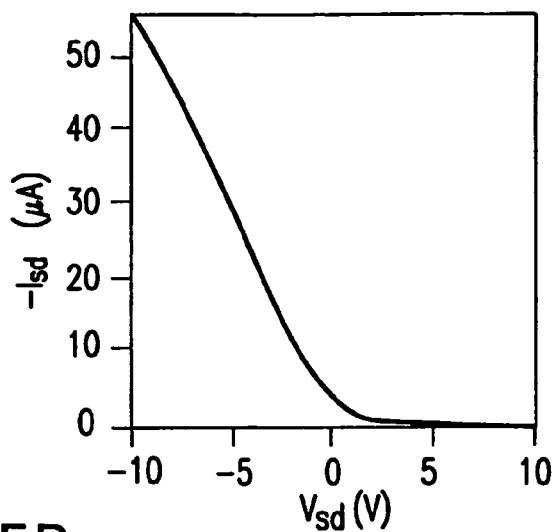
Figure 15C:
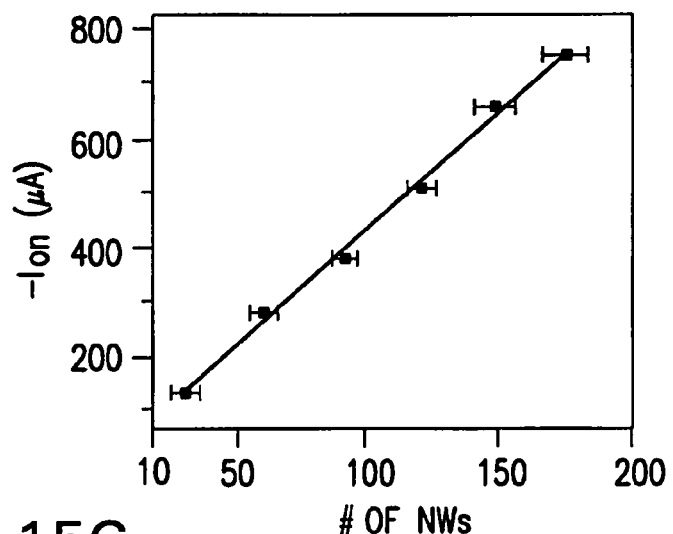

FIGS. 15A, 15B, and 15C show preliminary results for p-doped silicon nanowire thin-film transistors ($\mu \sim 100$ and on/off $\sim 10^4$).

Figure 16:
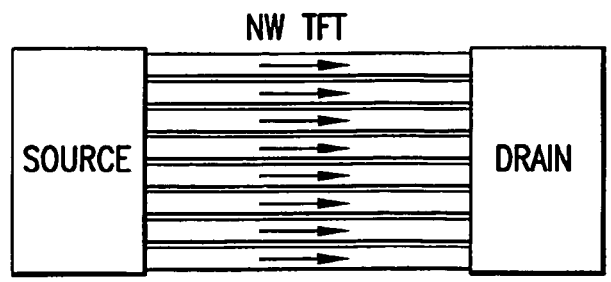

FIG. 16 shows a schematic of a DION TFT.

Figure 17:
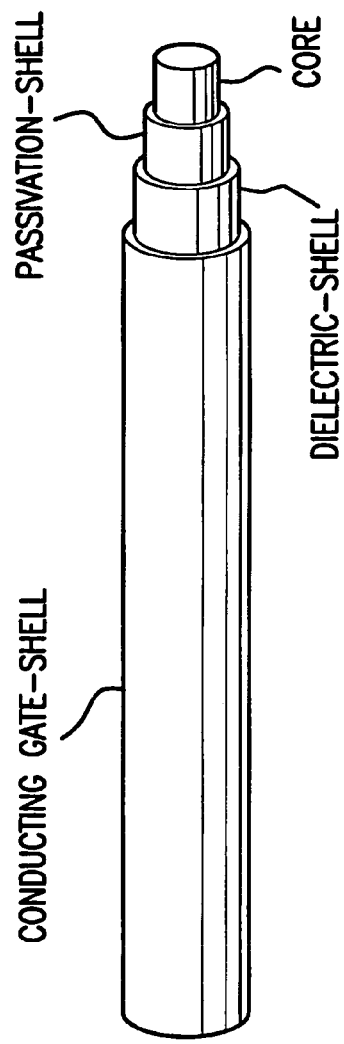

FIG. 17 shows schematics of a multi-core-shell nanowire comprising a semiconductor core, a passivation shell, an insulating gate dielectric shell, and a conducting gate shell.

Figure 18:
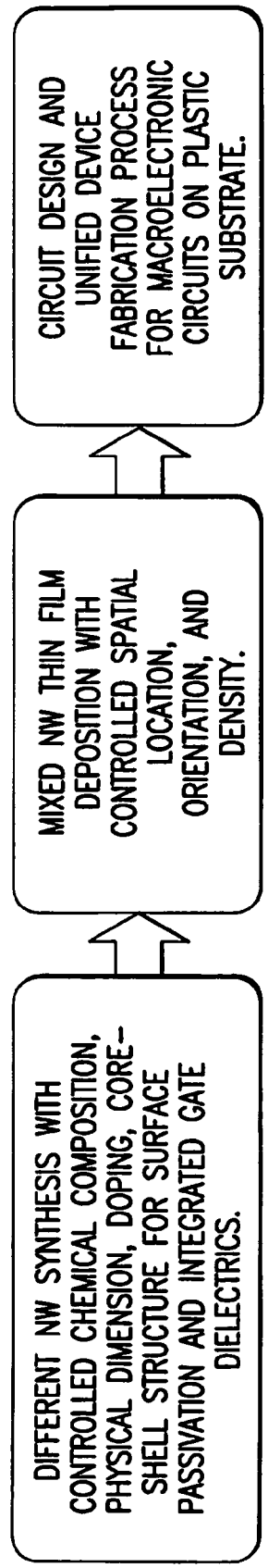

FIG. 18 shows a process flow of universal electronic substrate for macroelectronic circuit fabrication.

Figure 19:
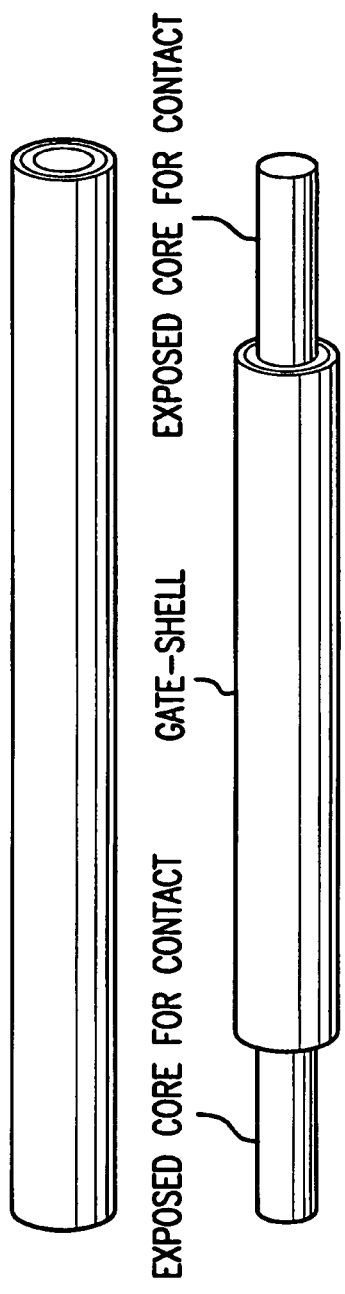

FIG. 19 schematically shows etching of shell materials in a multi-core-shell nanowire to expose the core material for source drain contact in a nanowire TFT.

Figure 20:
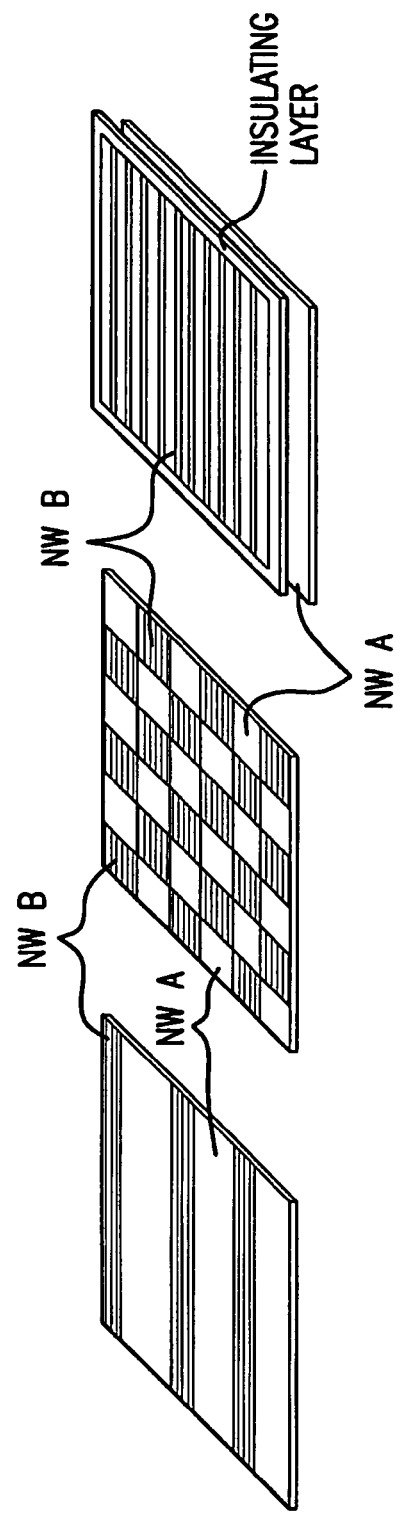

FIG. 20 shows several possible configurations of a mixed-composition DION film.

Figure 21:
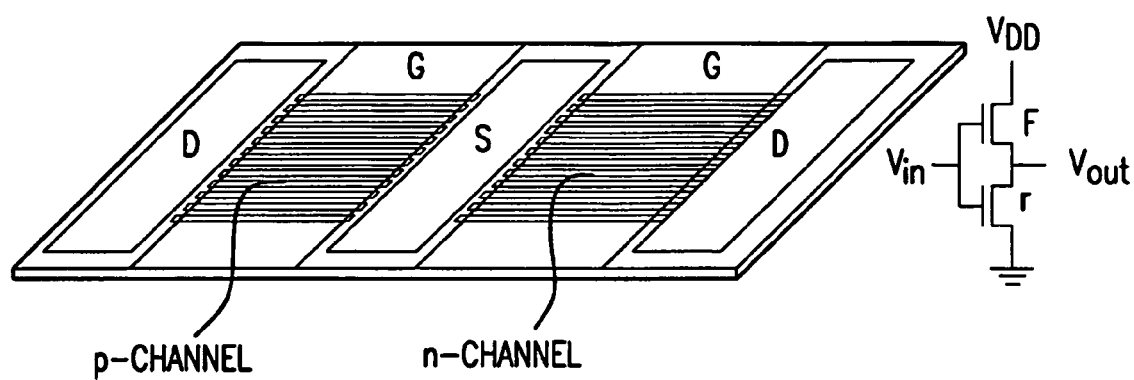

FIG. 21 schematically illustrates an example of using a mixed-composition DION thin-film to form a CMOS circuit.

Figure 22:
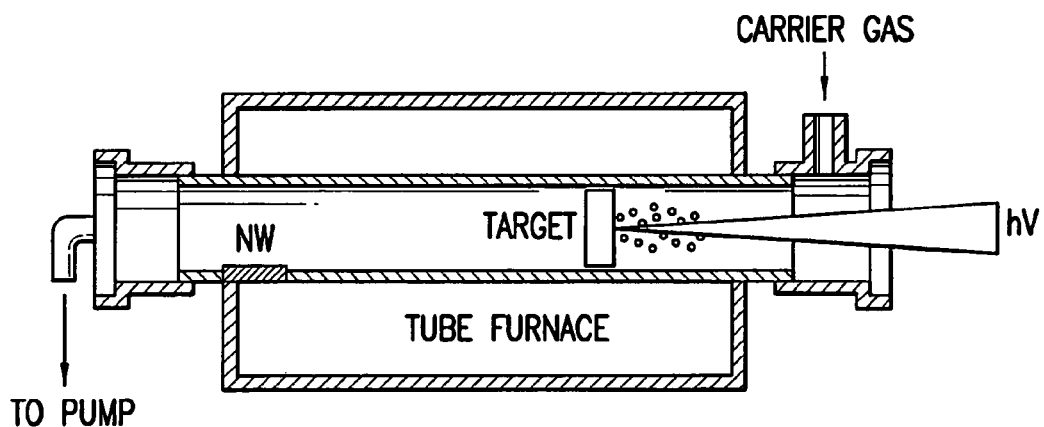

FIG. 22 shows a schematic of a generic reactor for fabrication of semiconductor nanowires.

Figure 23A:
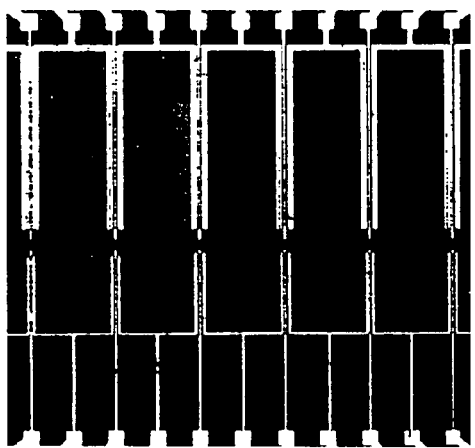
Figure 23B:
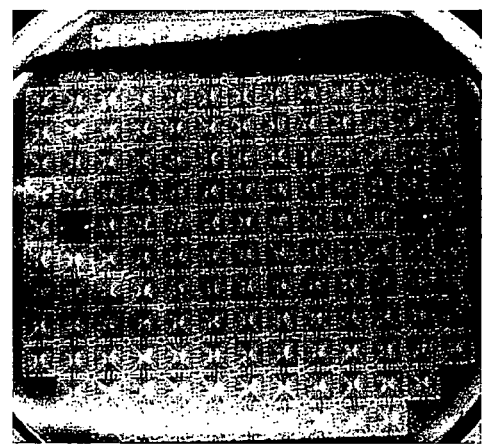

FIGS. 23A and 23B illustrate a standard nanowire FET testing platform.

Figure 24:
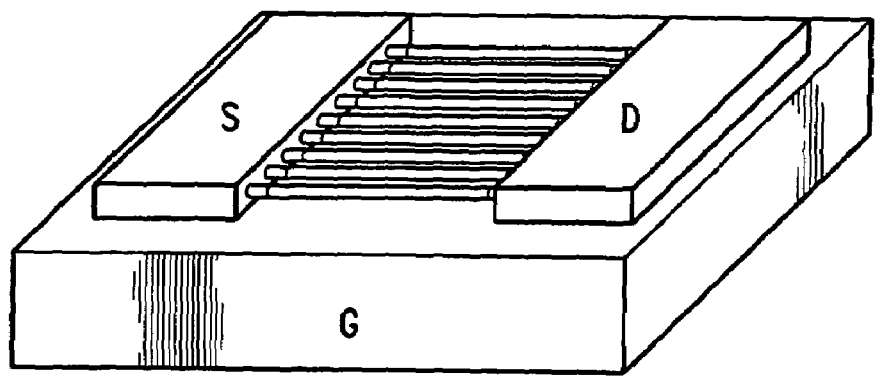

FIG. 24 schematically illustrates a DION thin-film transistor using a global back-gate.

Figure 25:
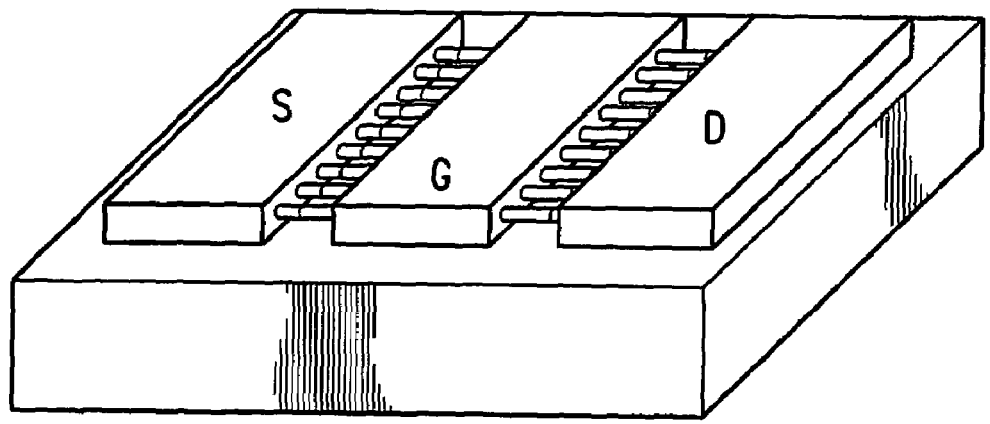

FIG. 25 shows a schematic view of locally gated nanowire thin film transistors.

FIGS. 26A and 26B are, respectively, a schematic and a layout illustration of a static CMOS two-input NAND gate.

FIG. 27 schematically illustrates a system for roll-to-roll compatible flow-based DION film deposition.

Figure 28:
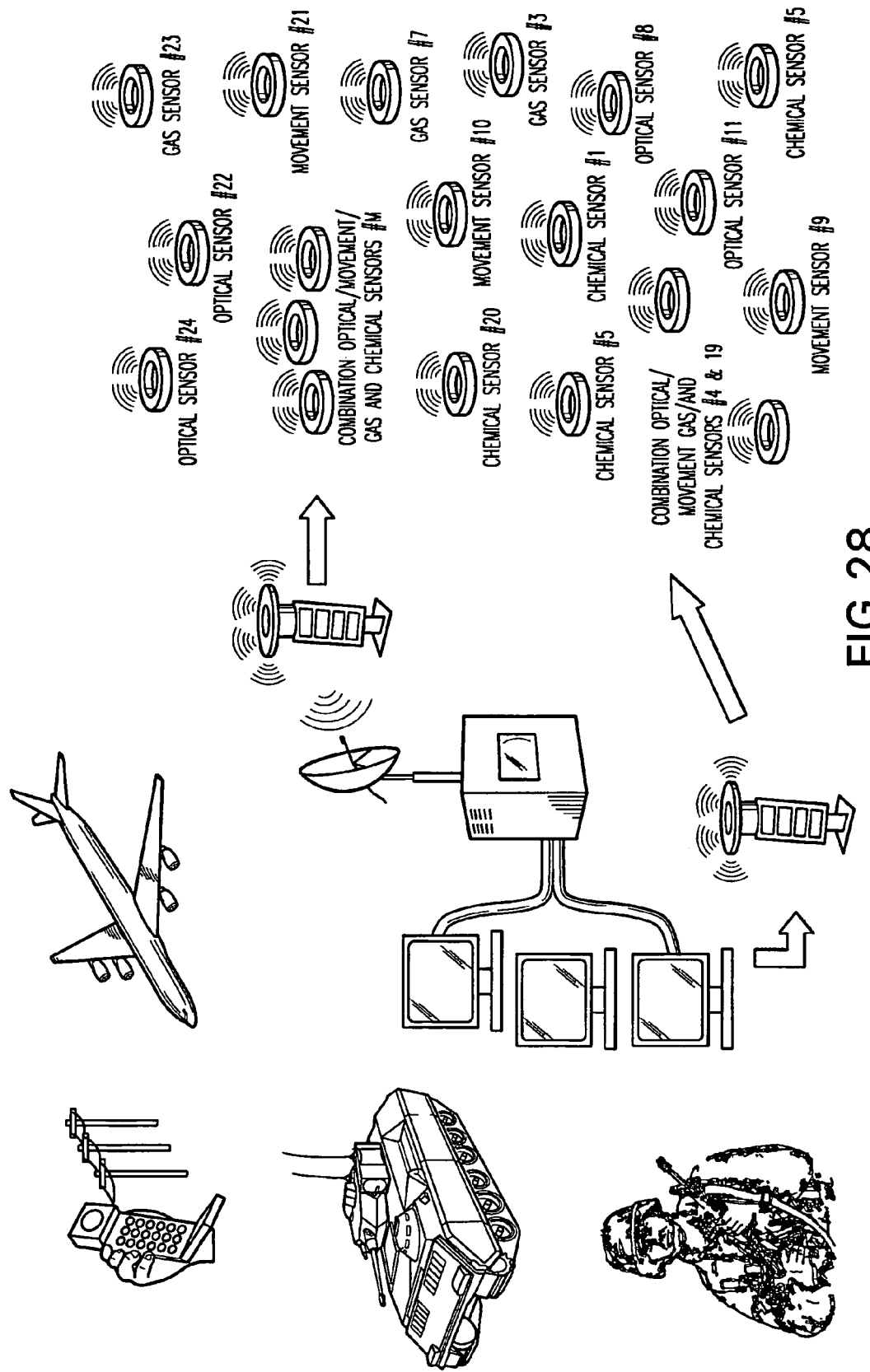

FIG. 28 schematically illustrates the concept of a distributed sensor network of the present invention.

Figure 29:
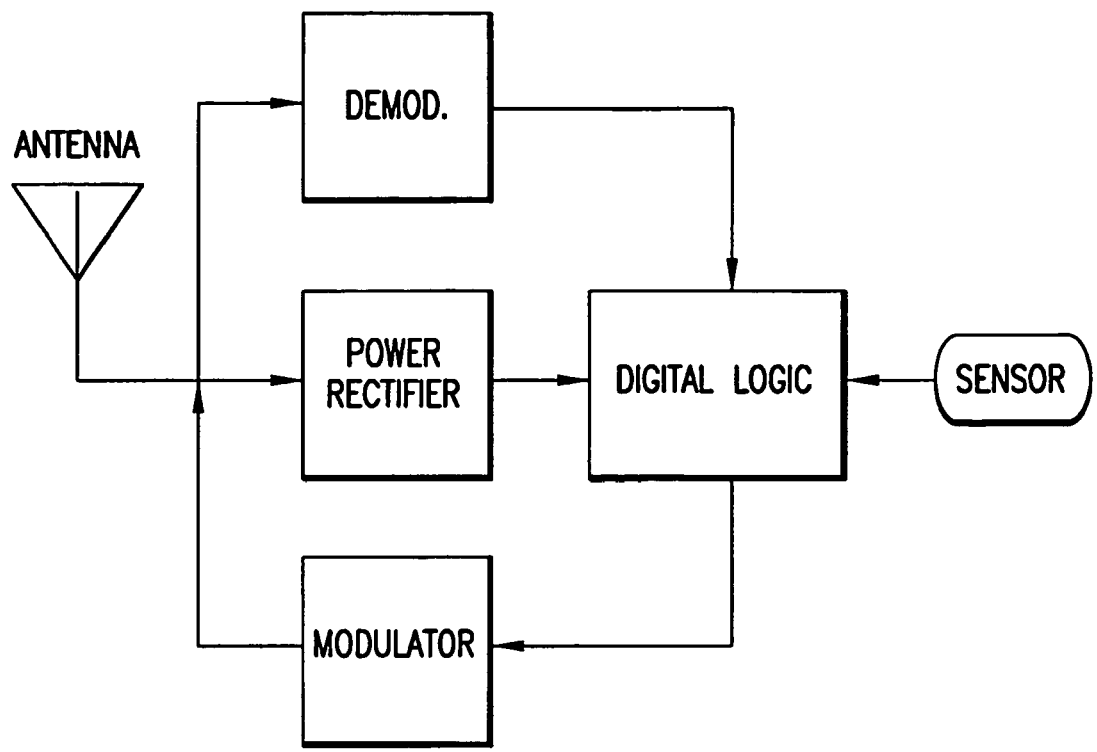

FIG. 29 shows a schematic illustration of an RFID/Sensor tag system.

Figure 30:
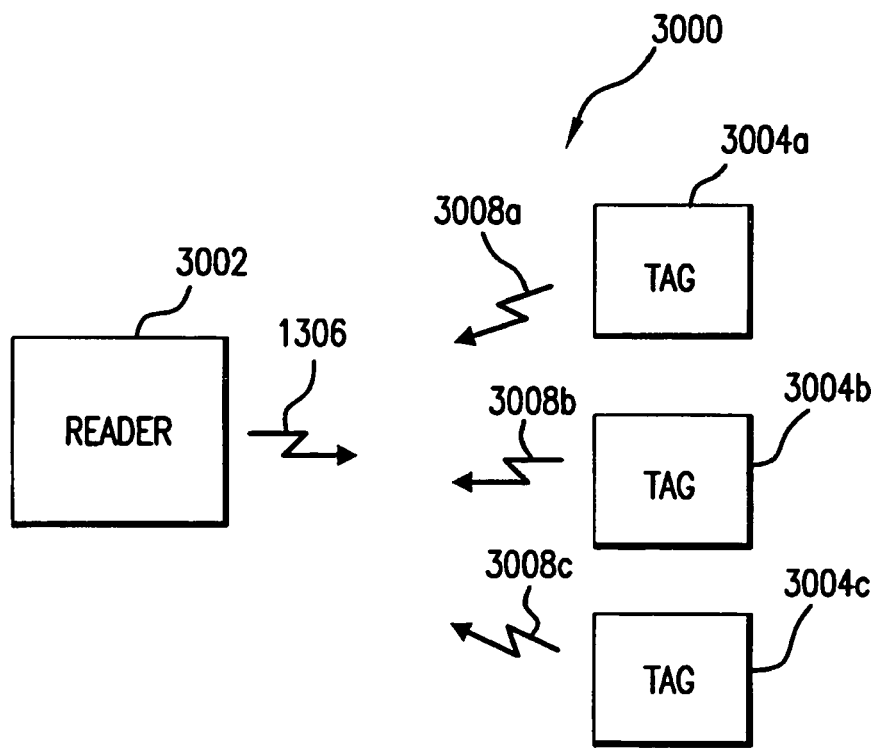

FIG. 30 illustrates a RFID tag and reader communications environment, according to an example embodiment of the present invention.

Figure 31A:
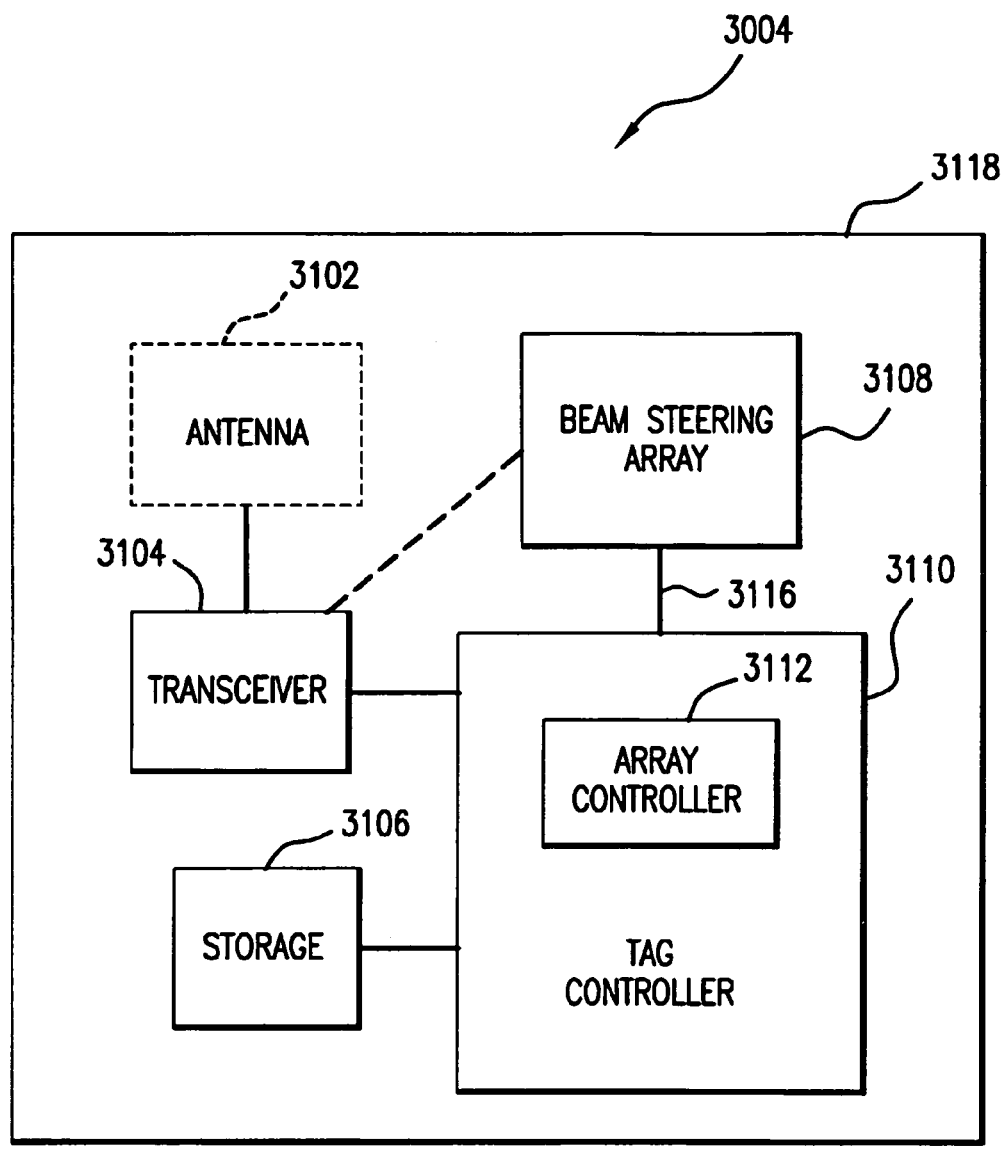

FIG. 31A shows an example RFID tag, according to an embodiment of the present invention.

Figure 31B:
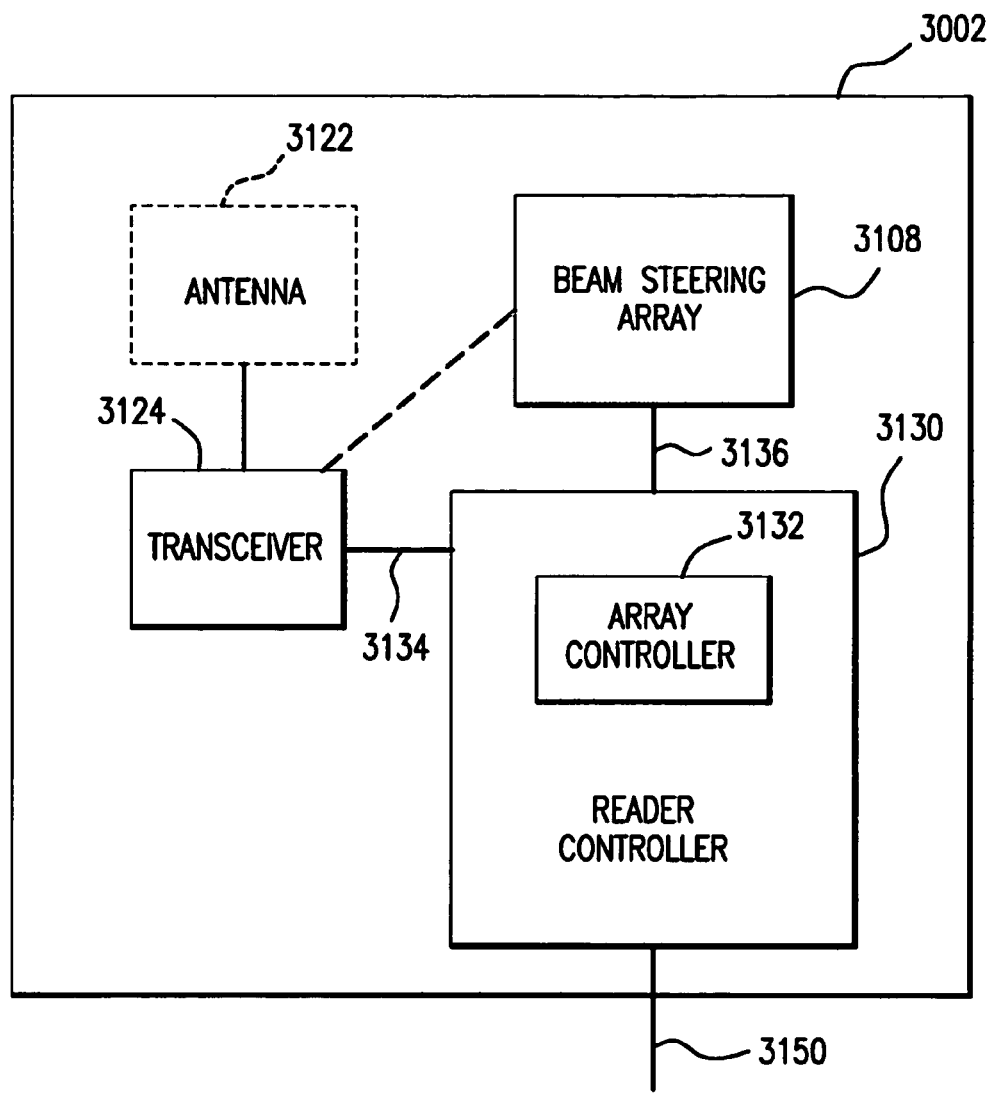

FIG. 31B shows an example RFID reader, according to an embodiment of the present invention.

Figure 32:
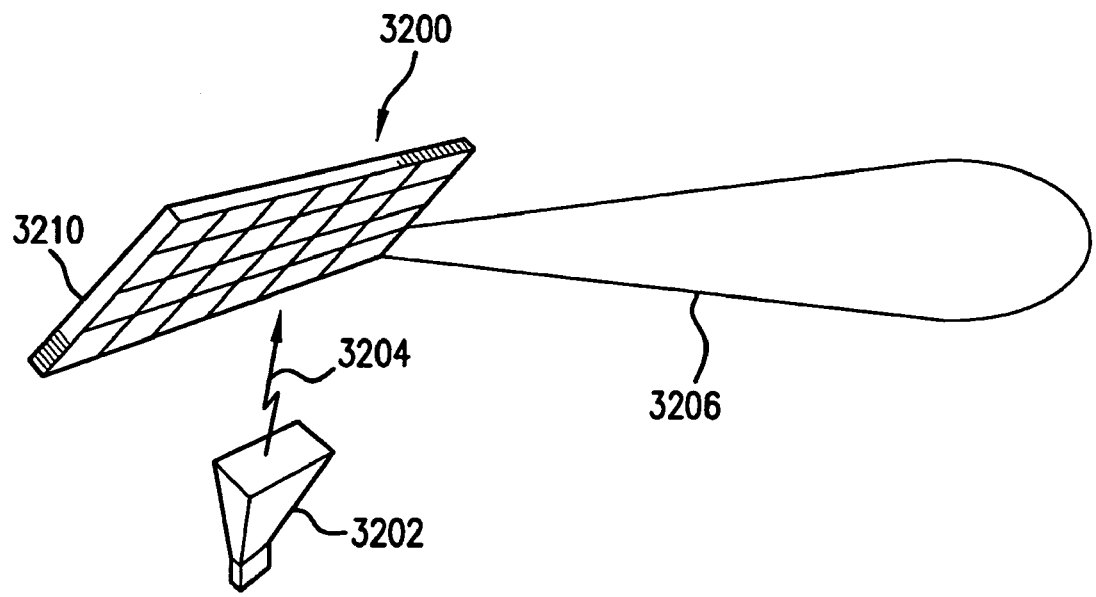

FIG. 32 shows an example beam-steering array operating in a transmitting mode.

Figure 33:
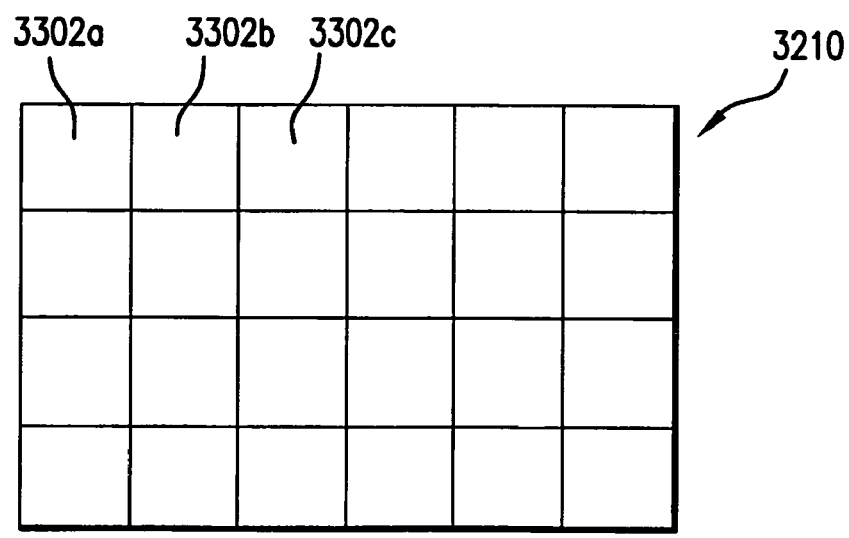

FIG. 33 shows a surface of an example beam-steering array, according to an embodiment of the present invention.

Figure 34:
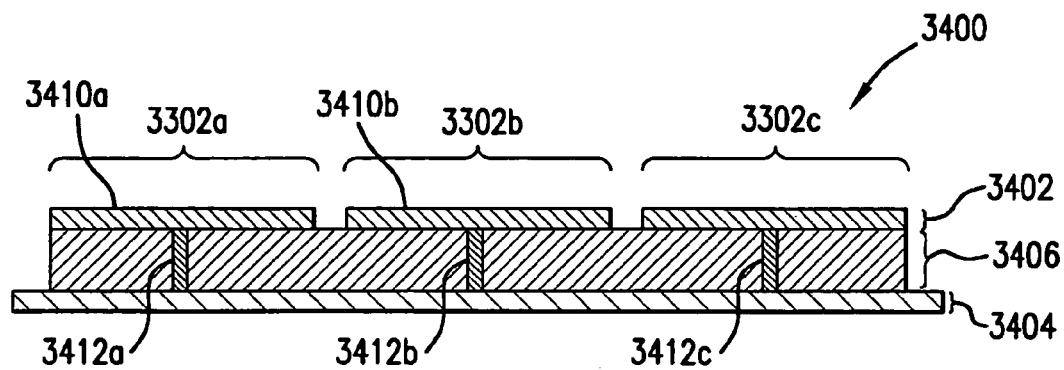

FIG. 34 shows a cross-sectional view of an example, fixed-frequency perfect magnetic conductor (PMC) structure, according to an embodiment of the present invention.

Figure 35:
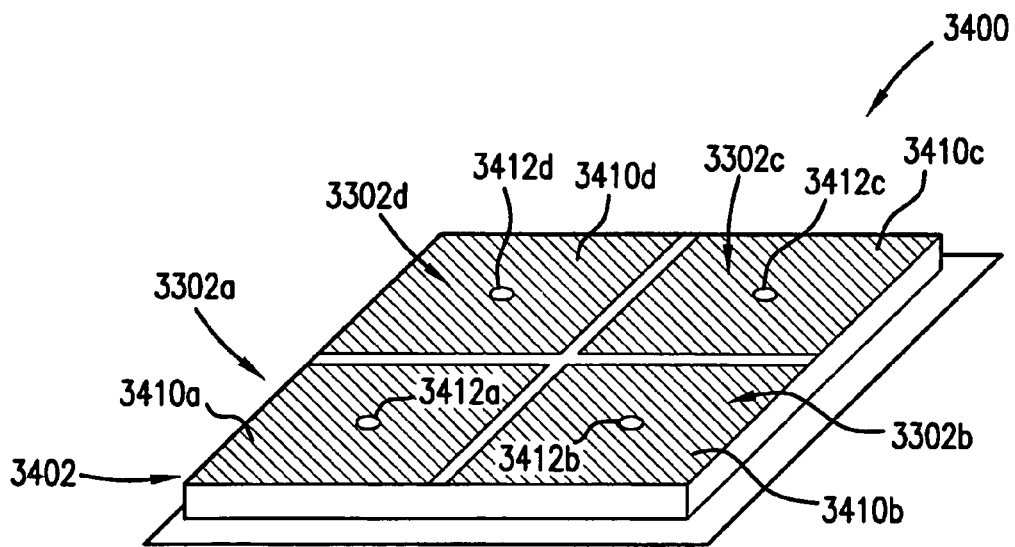

FIG. 35 shows a perspective view of a portion of the PMC structure of FIG. 34, including a 2×2 array of cells.

Figure 36:
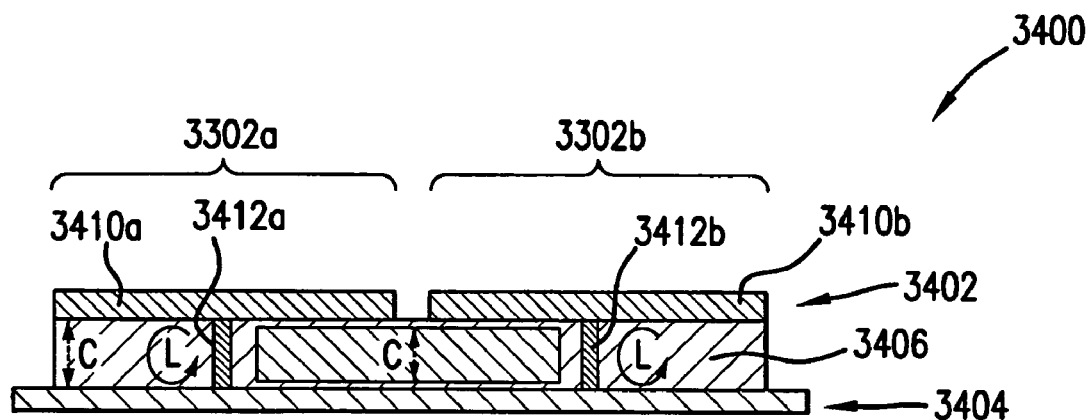

FIG. 36 illustrates inductance and capacitance involved in resonance of two cells of an example fixed-frequency PMC structure.

Figure 37:
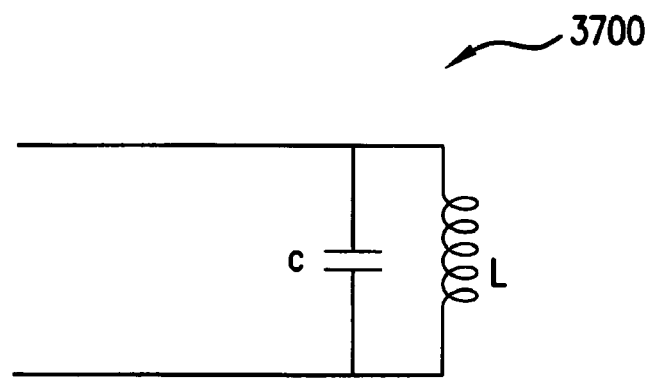

FIG. 37 shows a transmission-line equivalent schematic view of the pair of cells of the PMC structure of FIG. 36.

Figure 38:
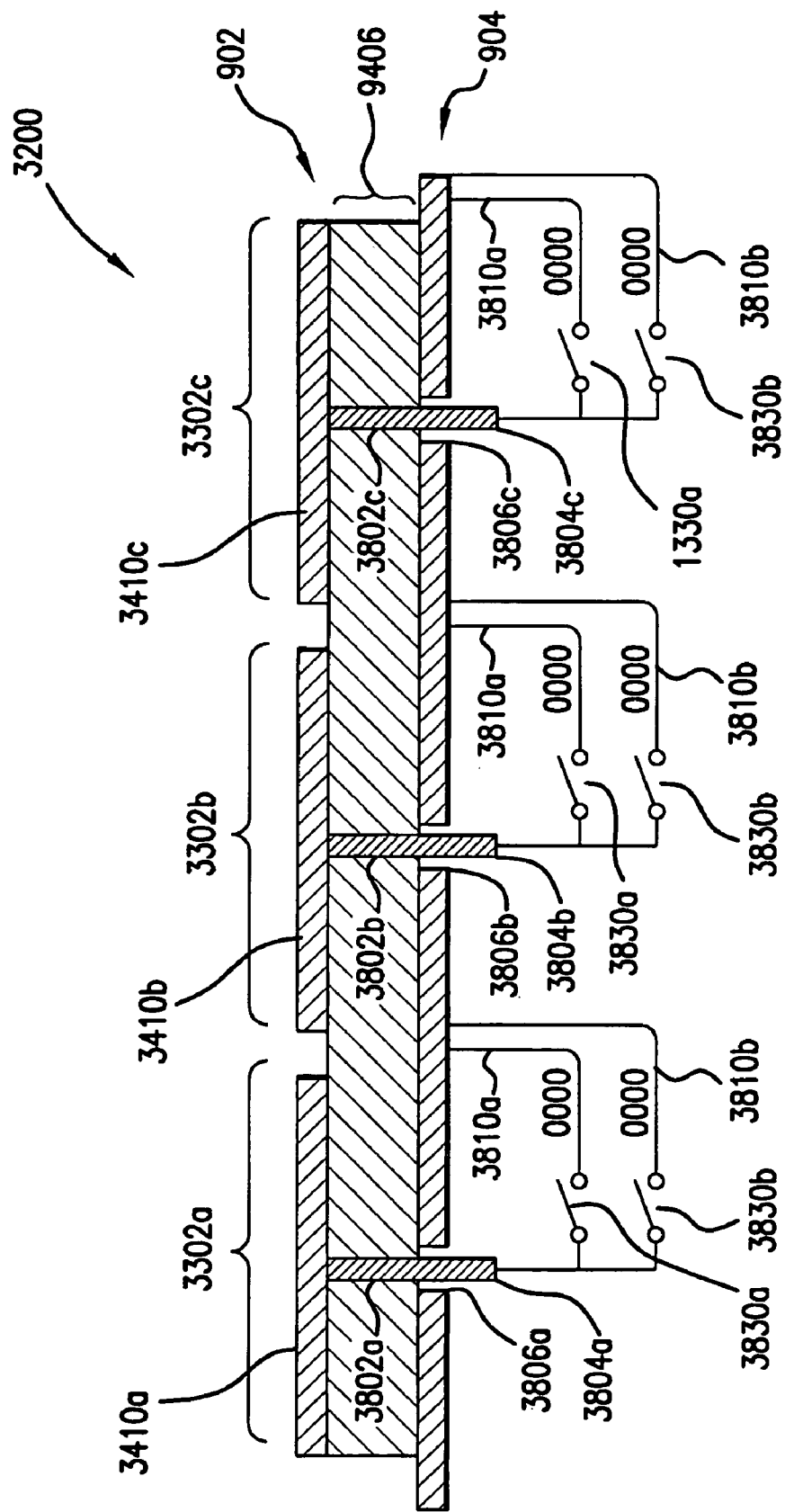

FIG. 38 shows a cross-sectional view of a portion of a beam-steering array, where active phase-adjustment elements are coupled to a PMC structure to provide discrete tunability, according to an example embodiment of the present invention.

Figure 39:
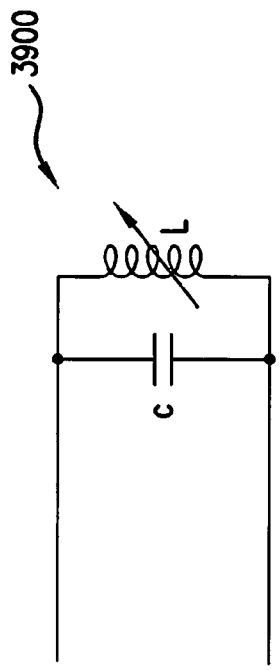

FIG. 39 shows a transmission-line equivalent schematic view of the pair of cells of the PMC structure of FIG. 38.

Figure 40:
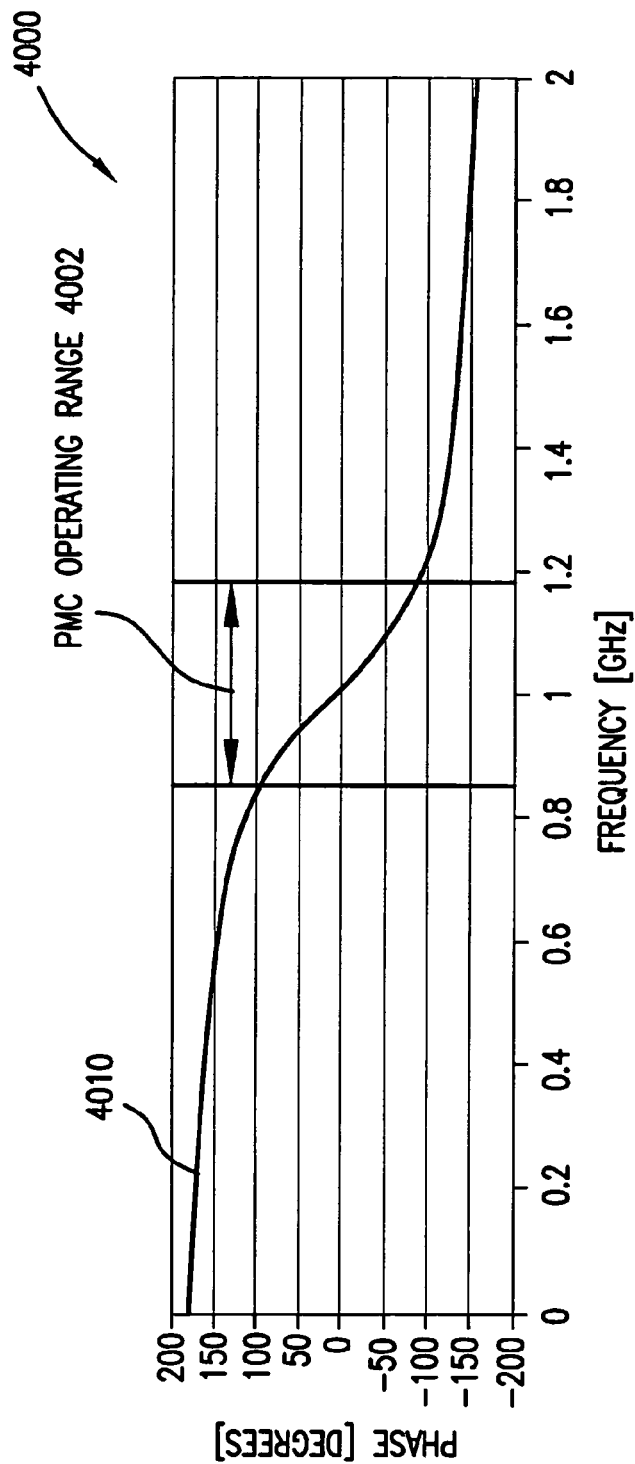

FIG. 40 shows a plot of a reflection coefficient phase versus a frequency for a PMC structure.

Figure 41:
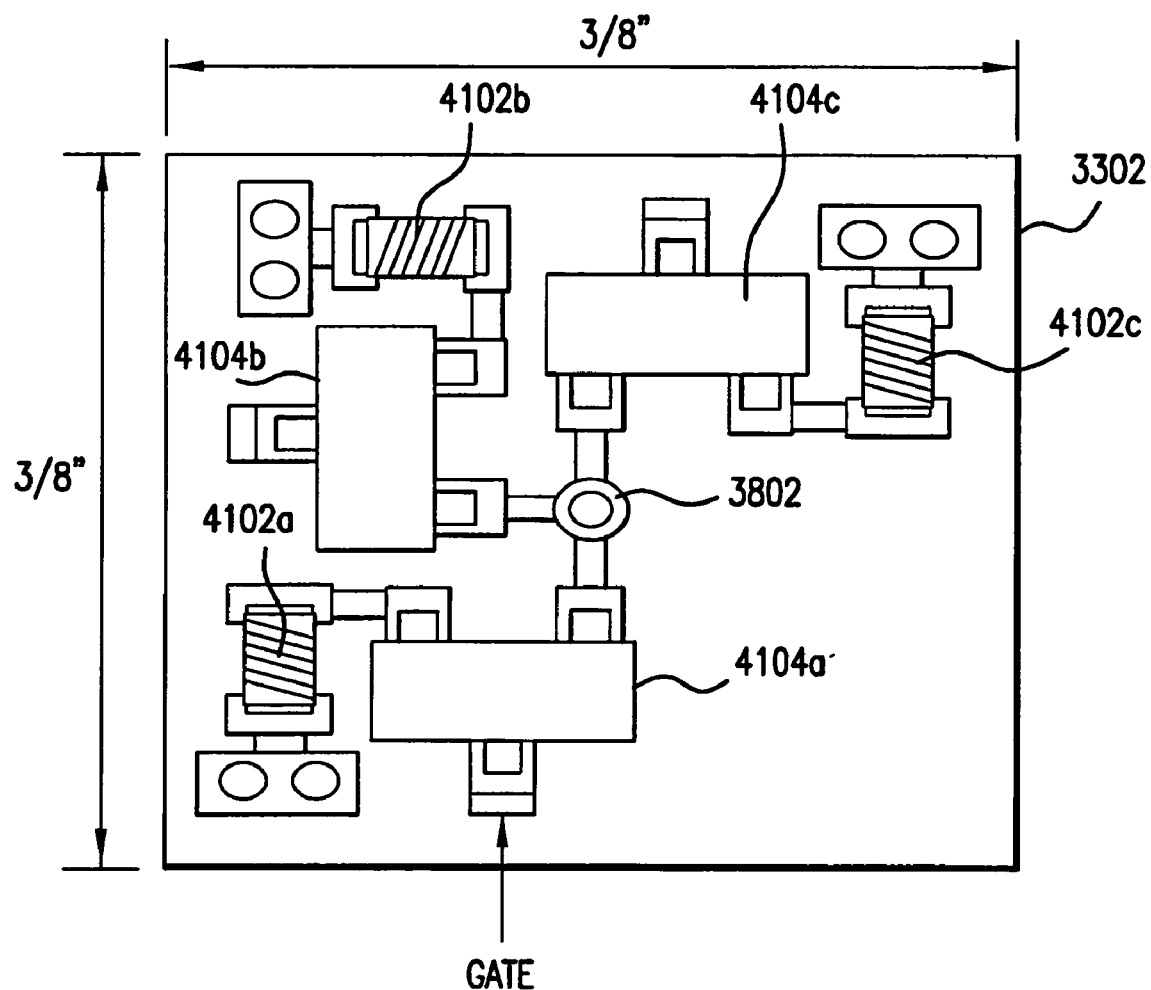

FIG. 41 shows a scale drawing where three conventional inductors and corresponding switches are mounted to a cell of a beam-steering array.

Figure 42:
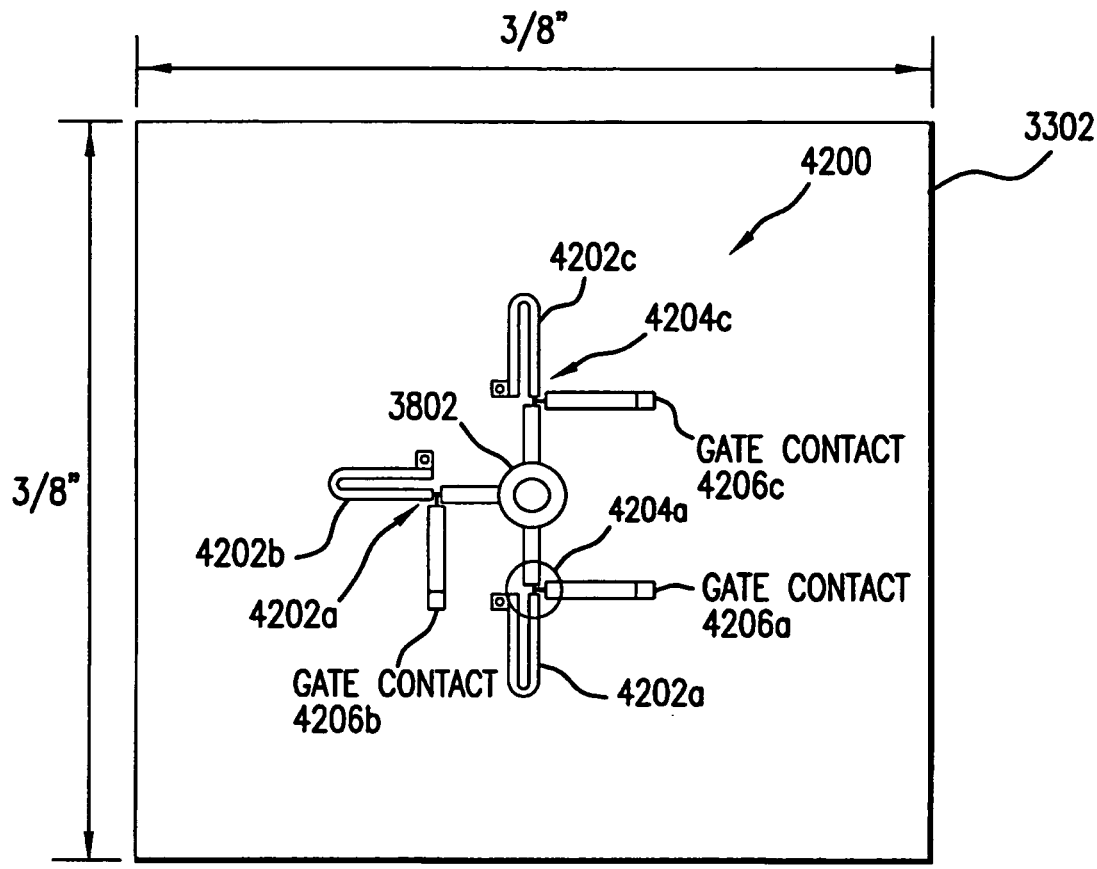

FIG. 42 shows a scale drawing of a cell of a beam-steering array that mounts a nanowire-based phase-adjustment circuit, according to an embodiment of the present invention.

Figure 43:
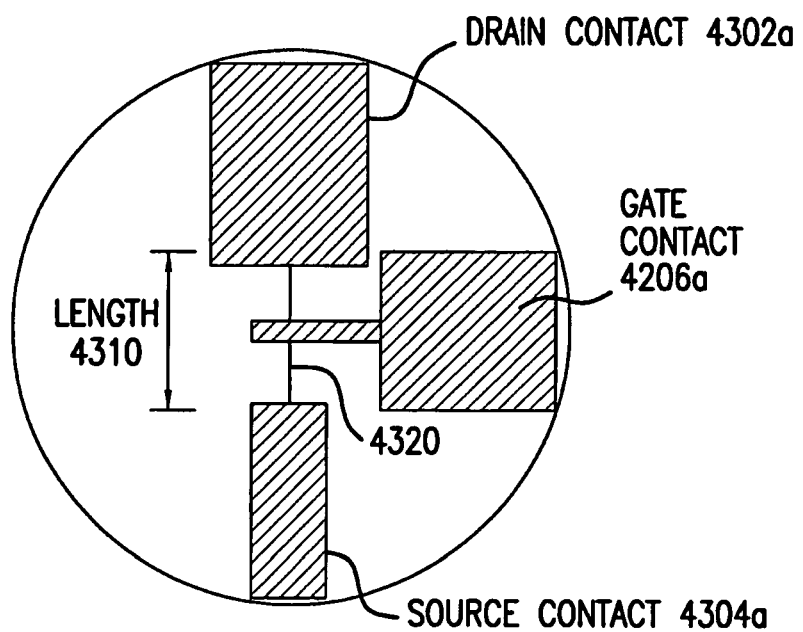

FIG. 43 shows a detailed view of an example nanowire-based transistor mounted on the cell of FIG. 42, according to an embodiment of the present invention.

Figure 44:
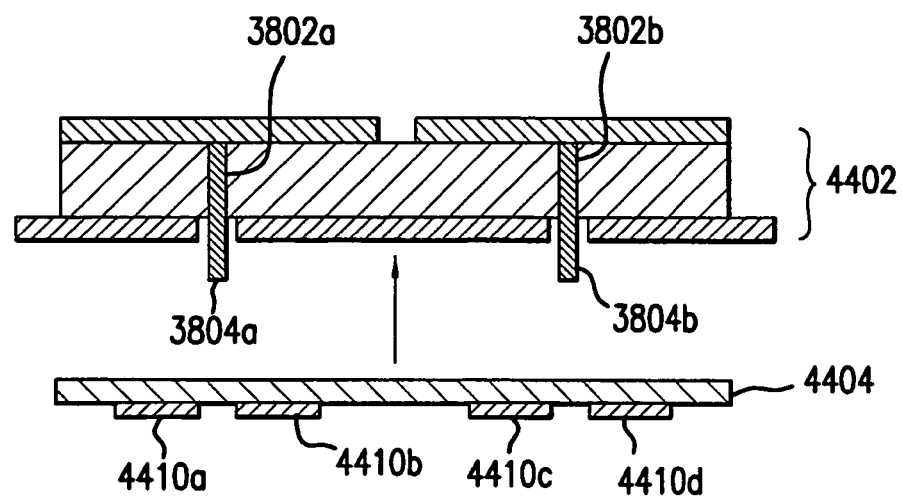

FIG. 44 illustrates that formation of a beam-steering array, according to an example embodiment of the present invention.

Figure 45:
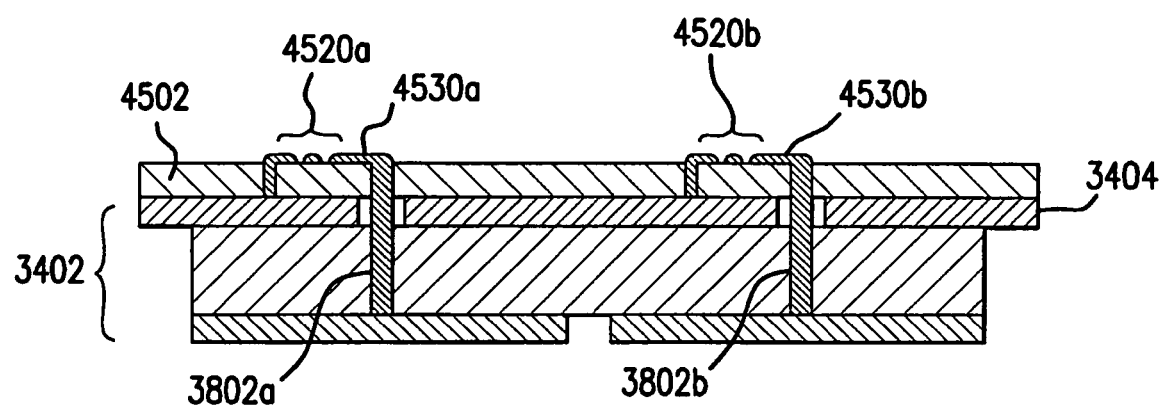
Figure 46:
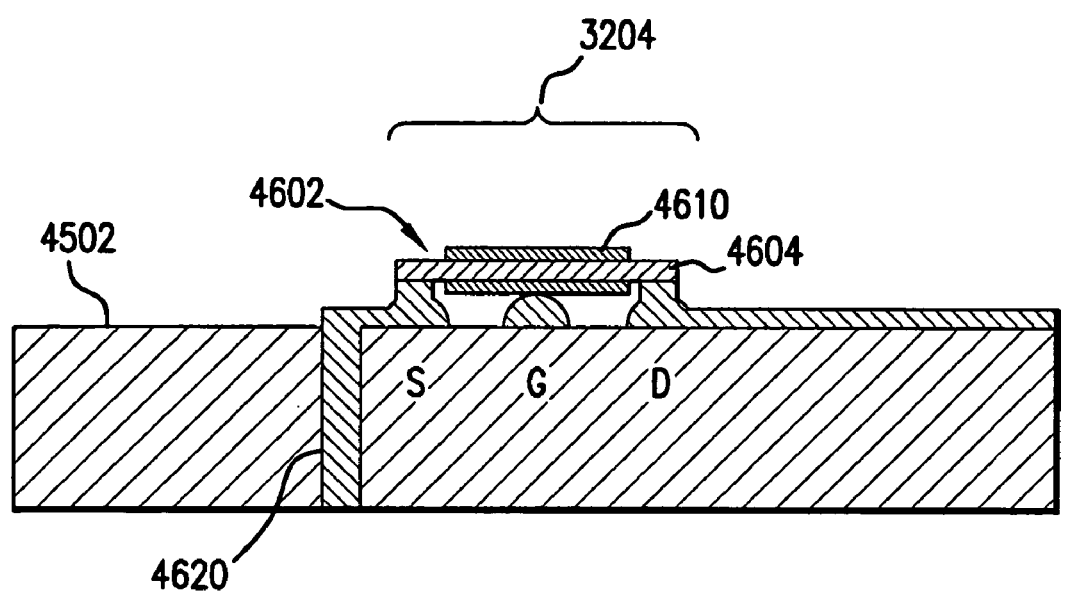

FIGS. 45 and 46 show nanowire-based phase adjustment circuits being formed on a PMC structure, according to an example embodiment of the present invention.

Figure 47:
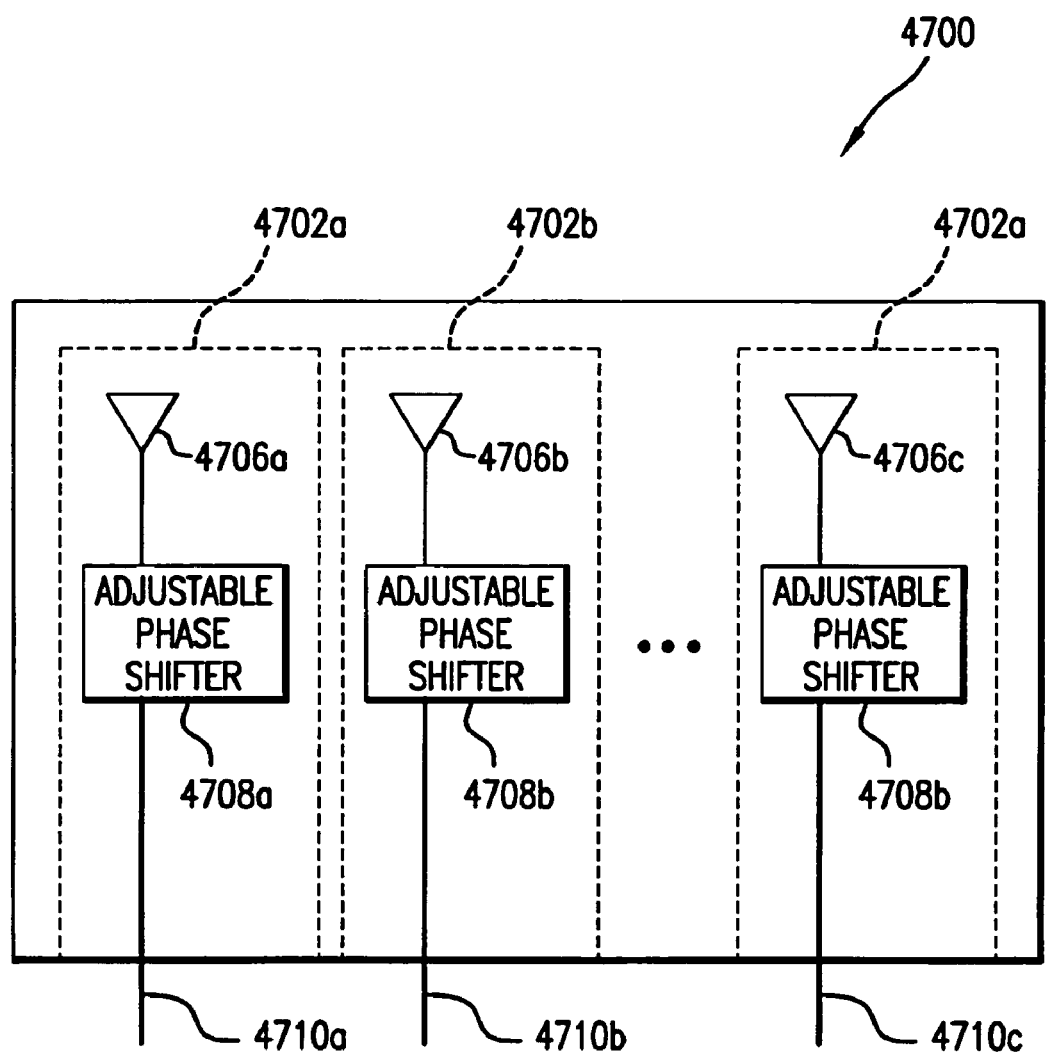

FIG. 47 shows an example multi-antenna element beam-steering array, according to an embodiment of the present invention.

Figure 48:
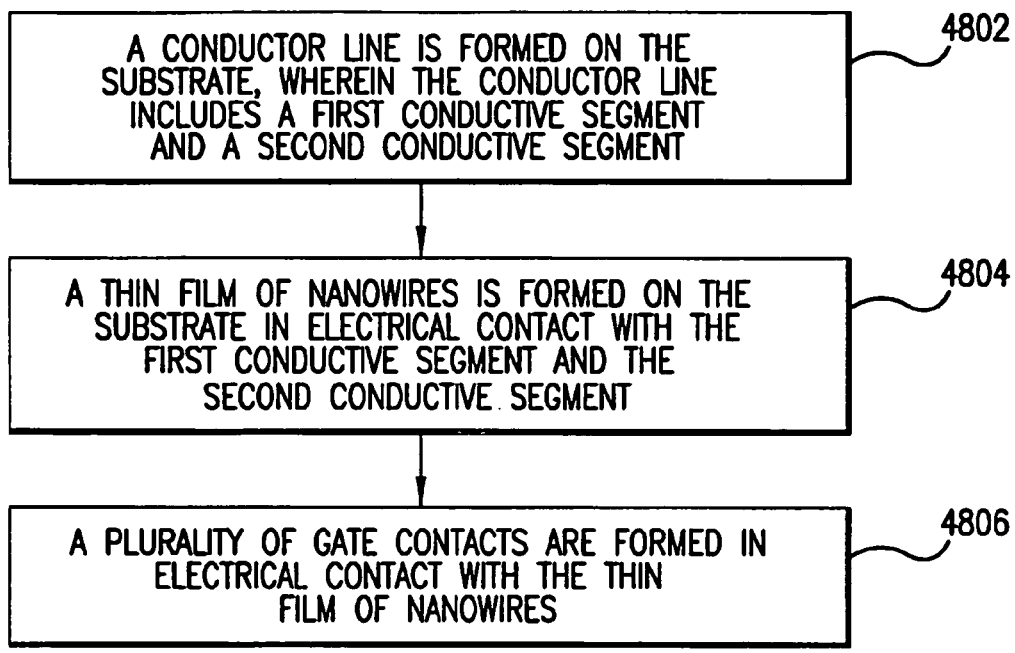

FIG. 48 shows a flowchart providing example steps for forming an adjustable phase shifter on a substrate, according to embodiments of the present invention.

Figure 49:
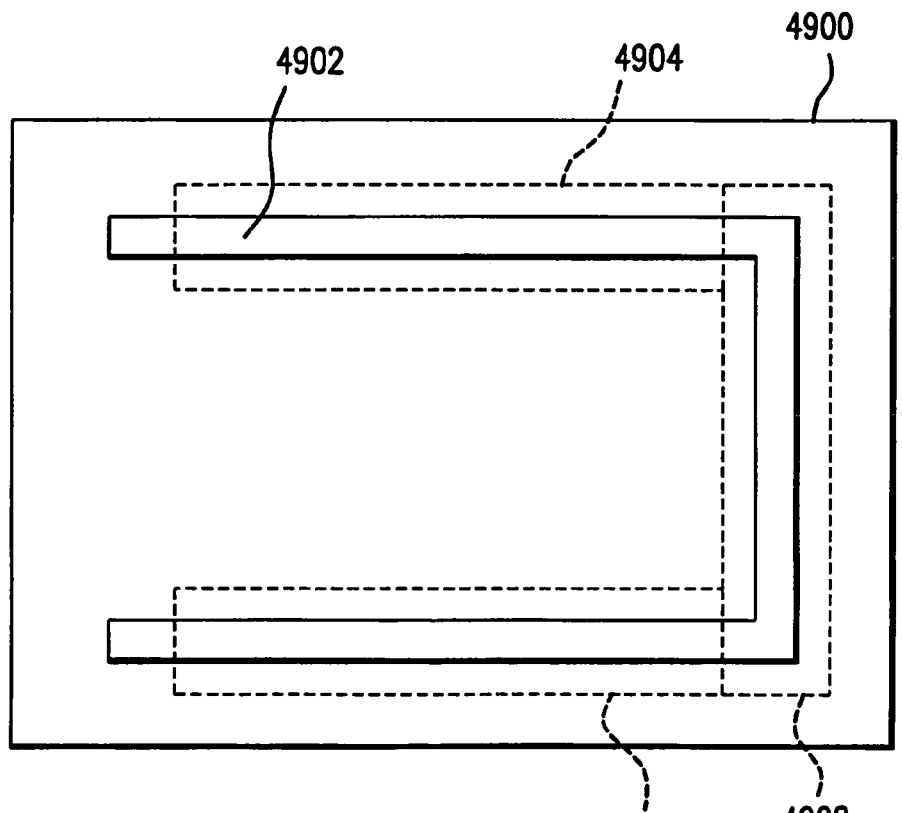

FIG. 49 shows a conductor line formed on a substrate.

Figure 50:
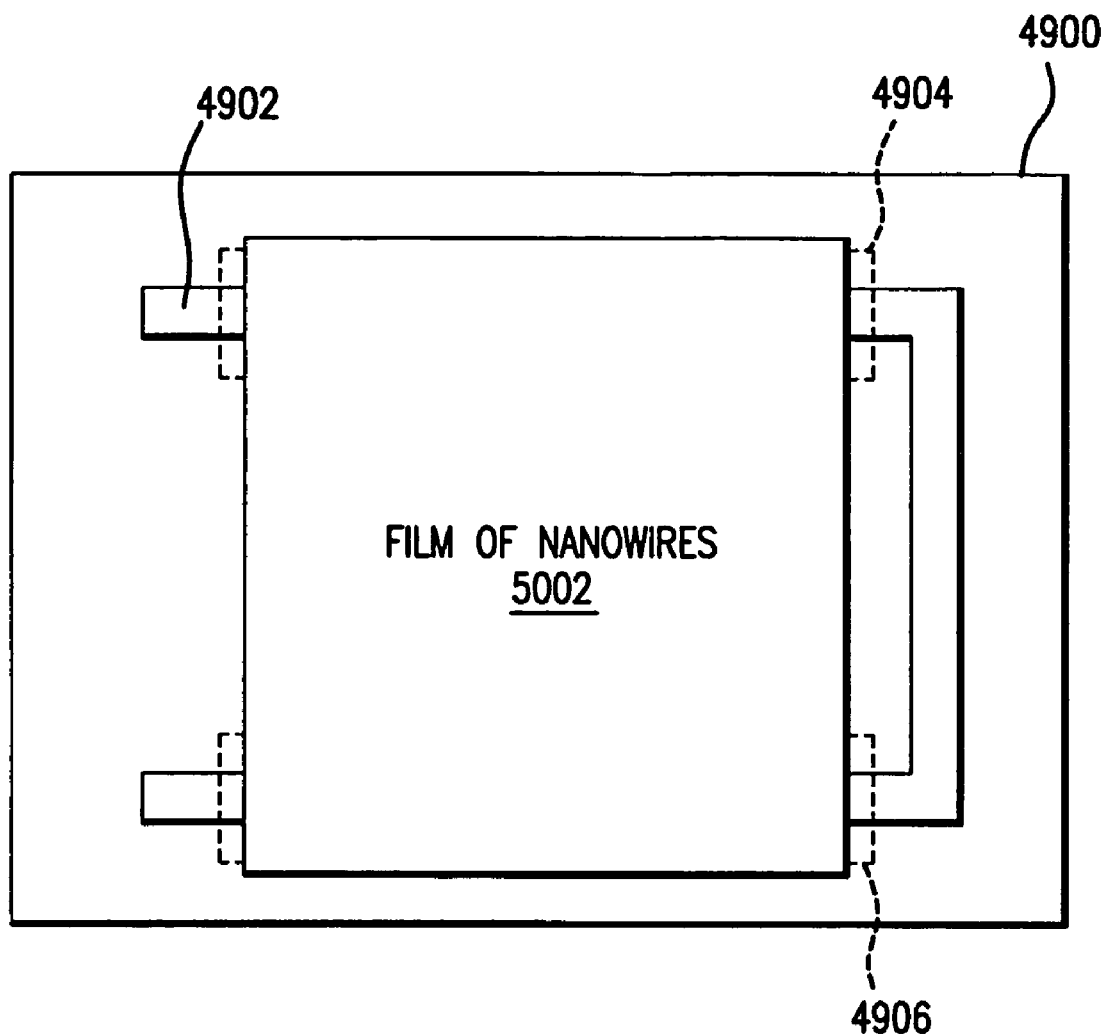

FIG. 50 shows a thin film of nanowires formed on the substrate of FIG. 49, according to an embodiment of the present invention.

Figure 51:
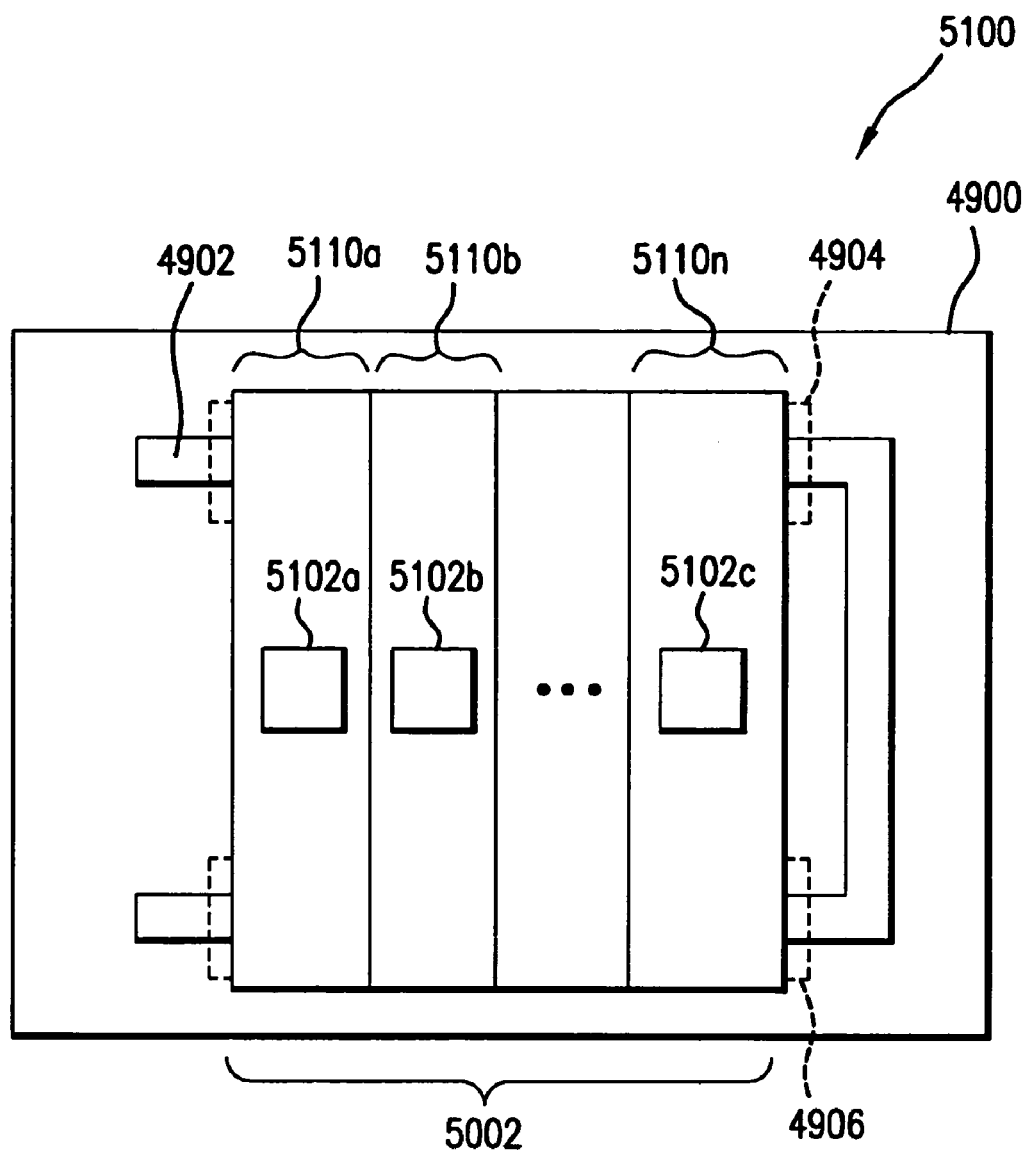

FIG. 51 shows a plurality of gate contacts formed in electrical contact with the thin film of nanowires of FIG. 50 to form an adjustable phase shifter, according to an embodiment of the present invention.

Figure 52A:
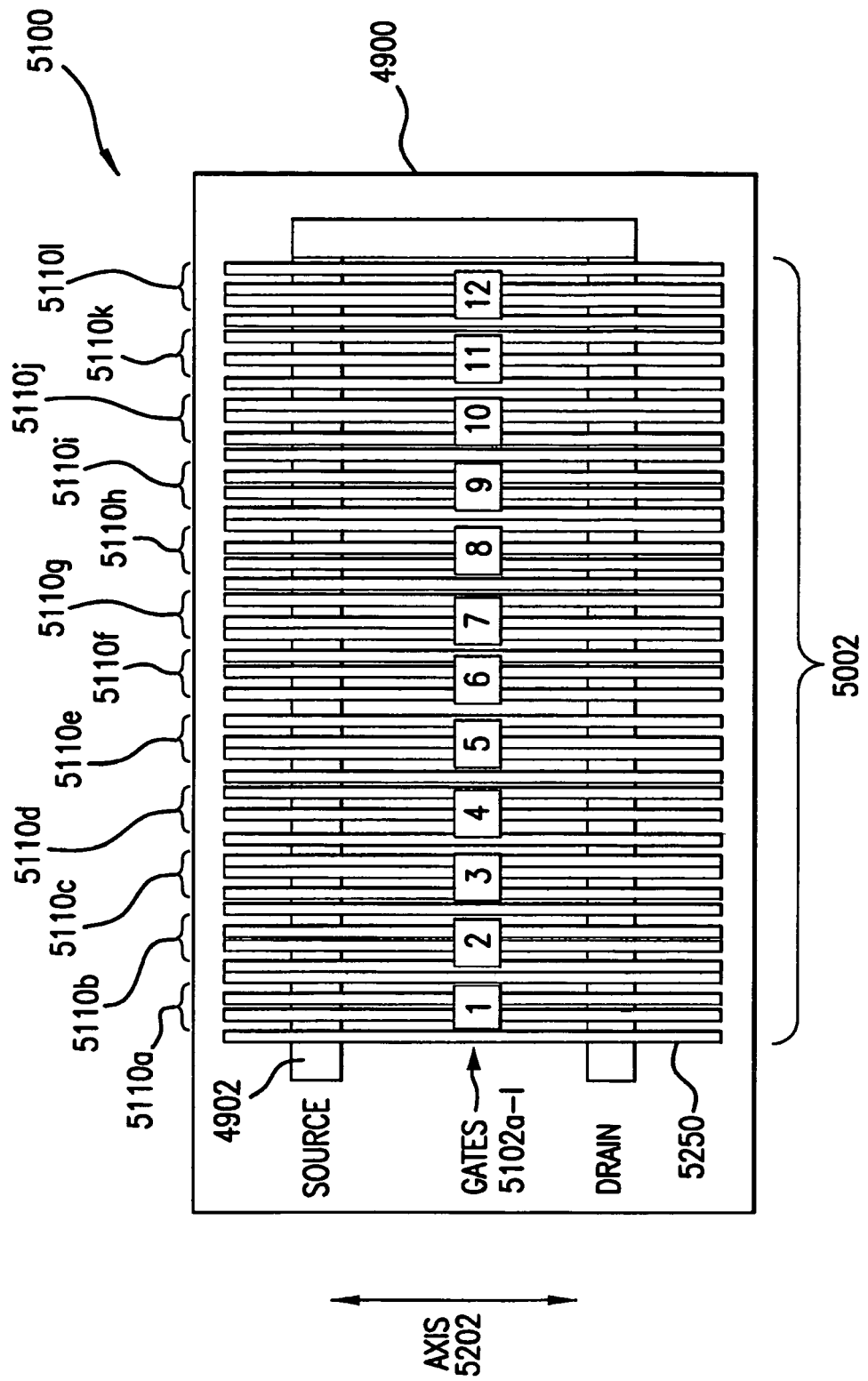
Figure 52B:
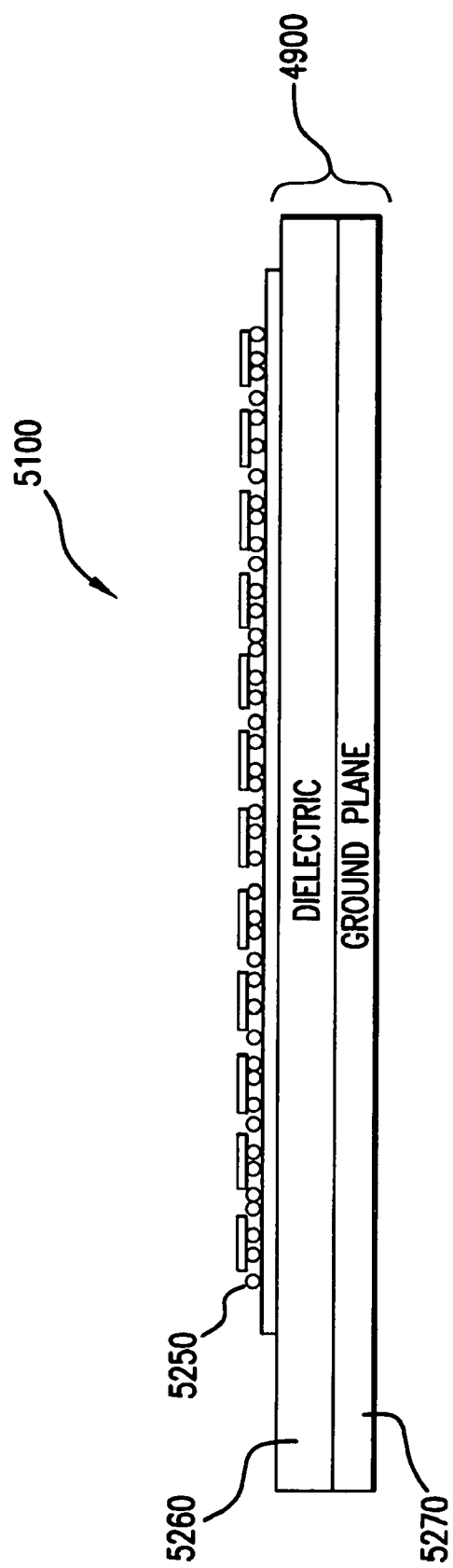

FIGS. 52A and 52B show views of an example adjustable phase shifter with aligned nanowires, according to an embodiment of the present invention.

Figure 53:
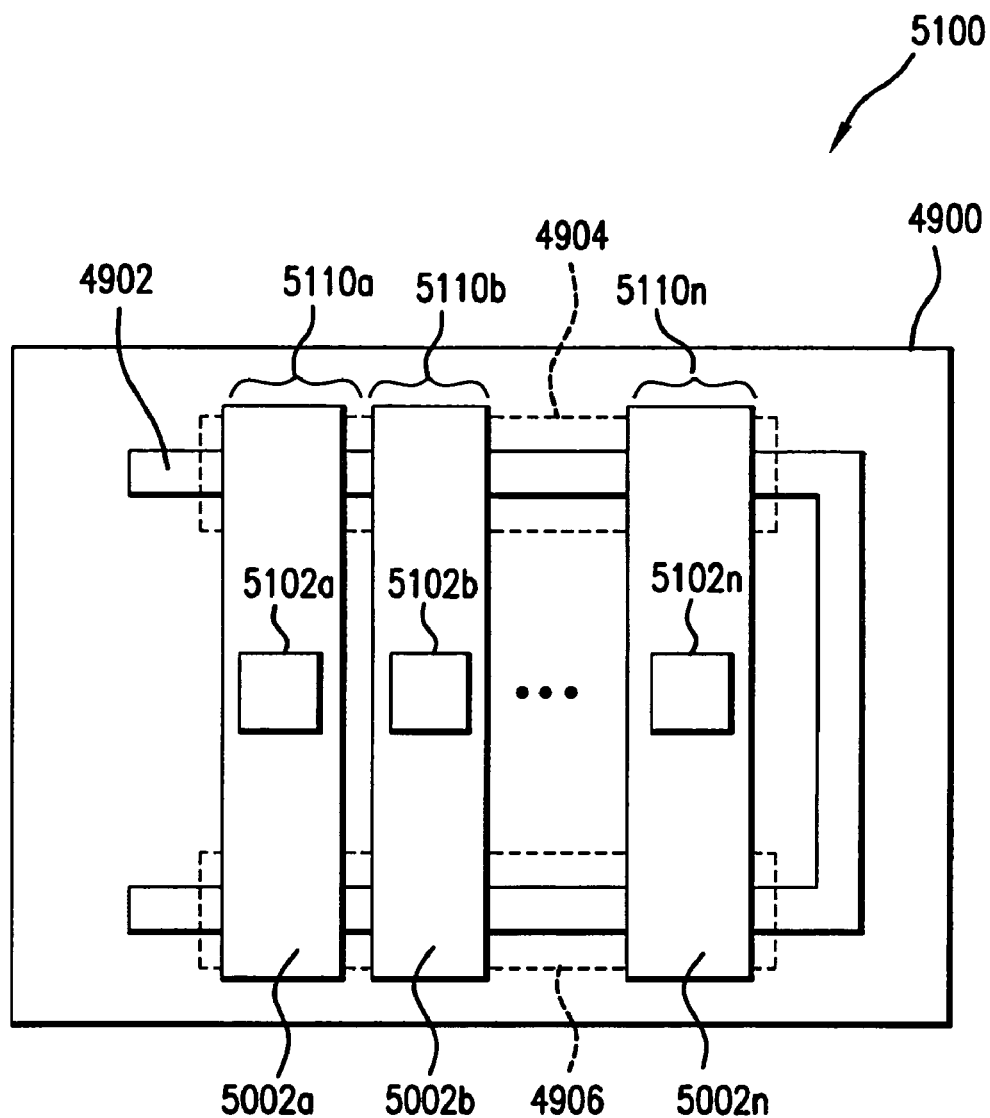

FIG. 53 shows a plurality of thin films of nanowires formed on a substrate to create an adjustable phase shifter, according to an embodiment of the present invention.

Figure 54:
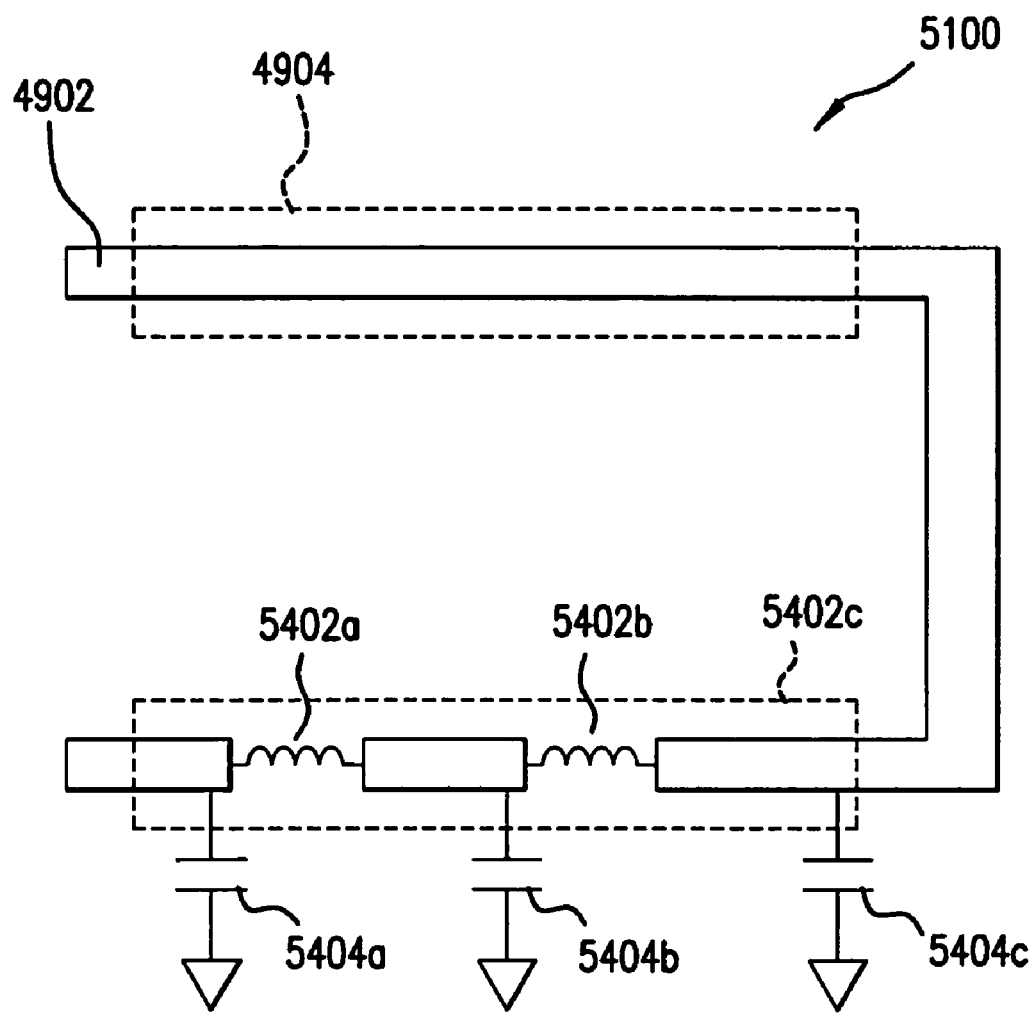

FIG. 54 shows a conductor line with incorporated loads to provide additional phase delay, according to an example embodiment of the present invention.

Figure 55:
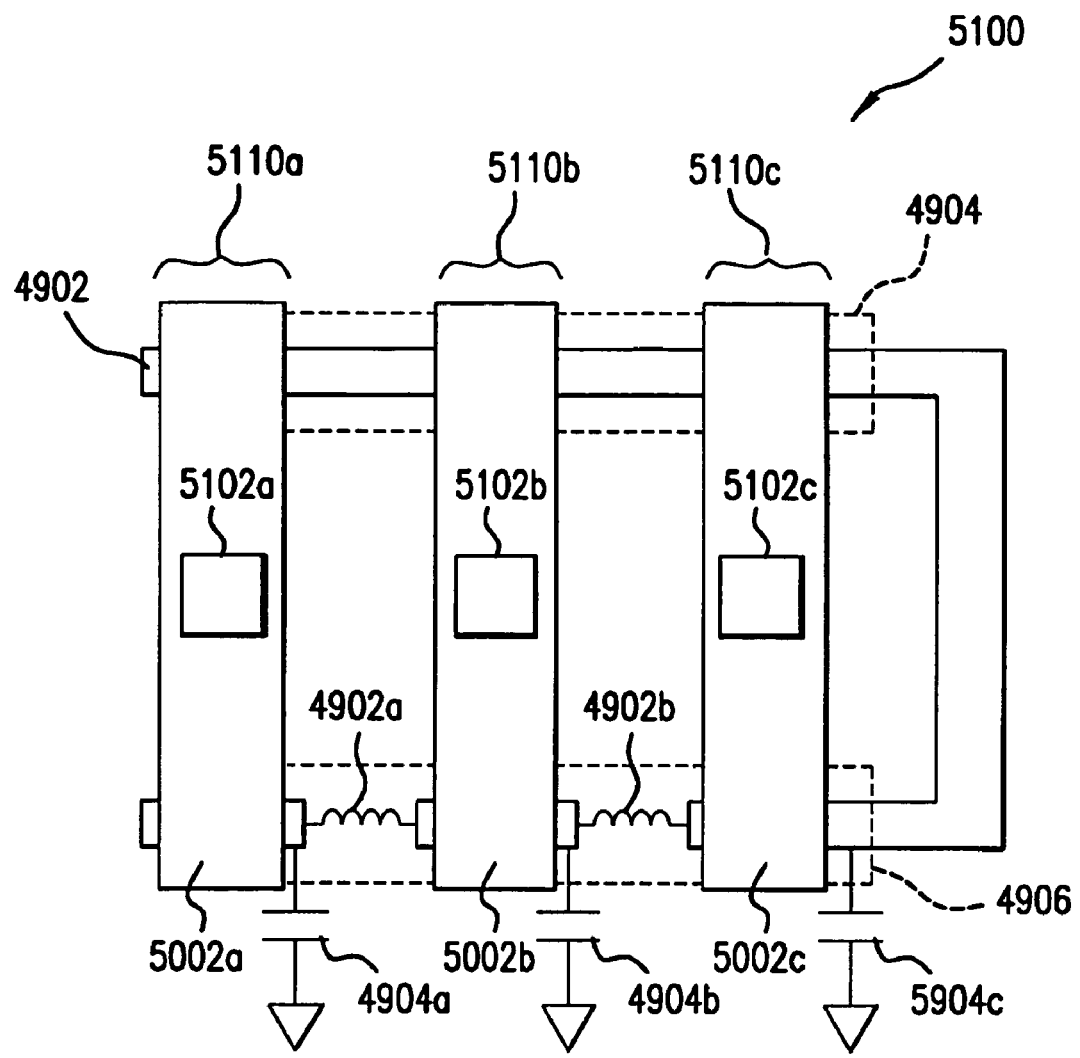

FIG. 55 shows the conductor line of FIG. 54, with thin films of nanowires formed thereon to form a plurality of nanowire-based transistors.

Figure 56:
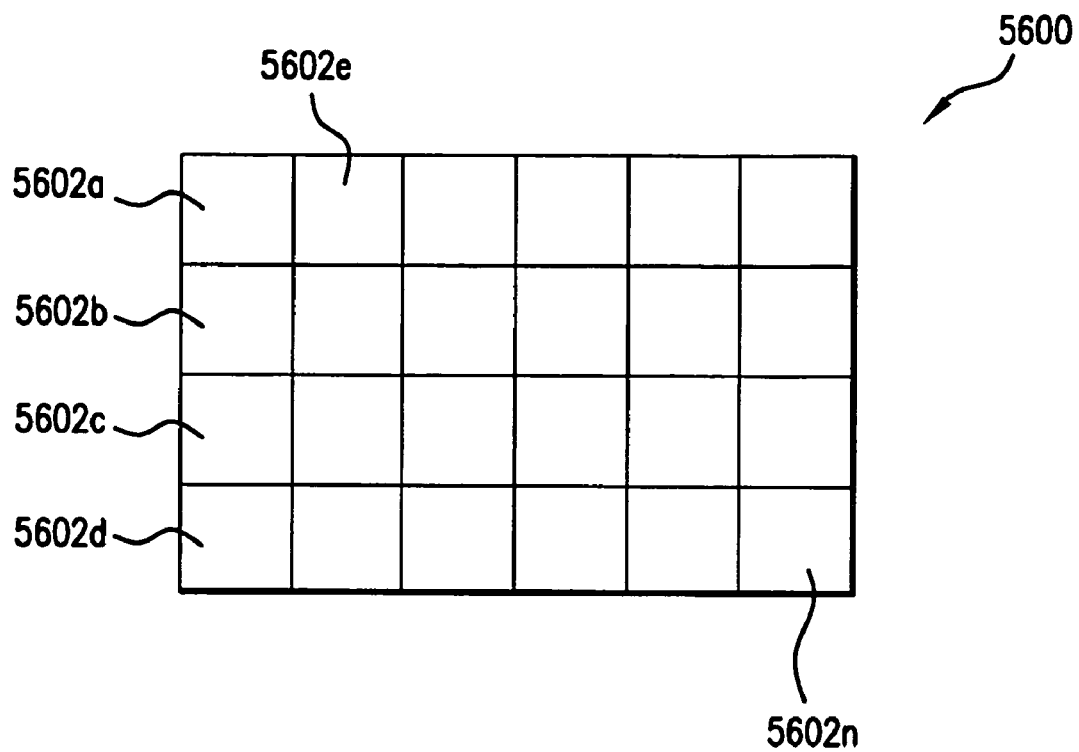

FIG. 56 shows a substrate that incorporates an array of actuators and related electronics for active acoustic cancellation, according to an embodiment of the present invention.

Figure 57:
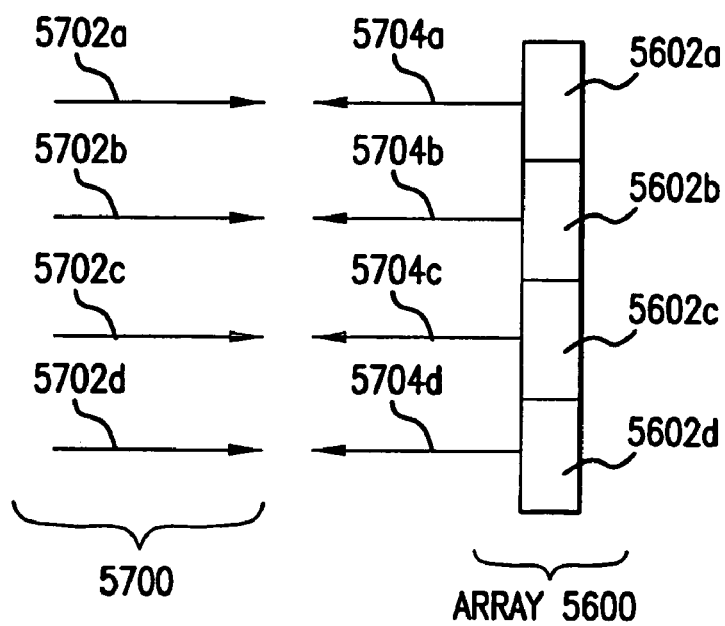

FIG. 57 shows an example application of the array of FIG. 56 to monitor and cancel noise, according to an embodiment of the present invention.

Figure 58:
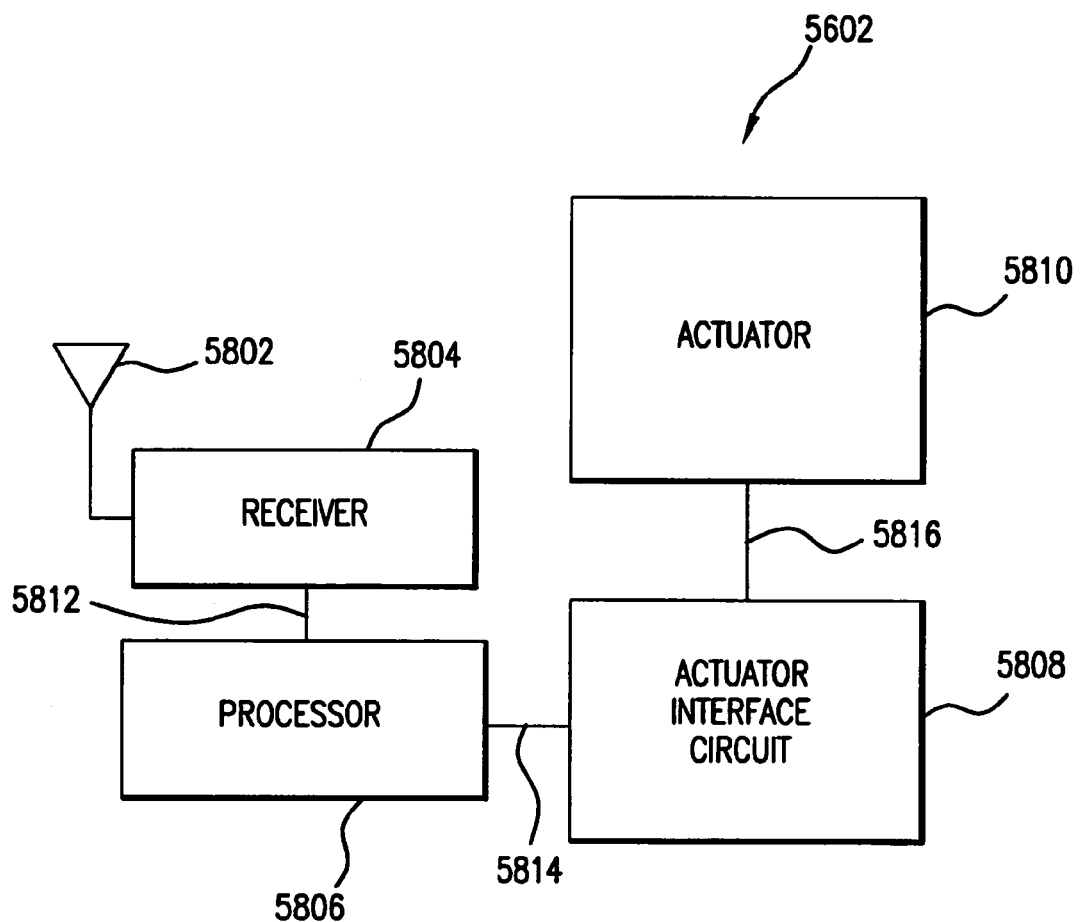

FIG. 58 shows an example detailed block diagram of a cell of the array of FIG. 56, according to an embodiment of the present invention.

Figure 59:
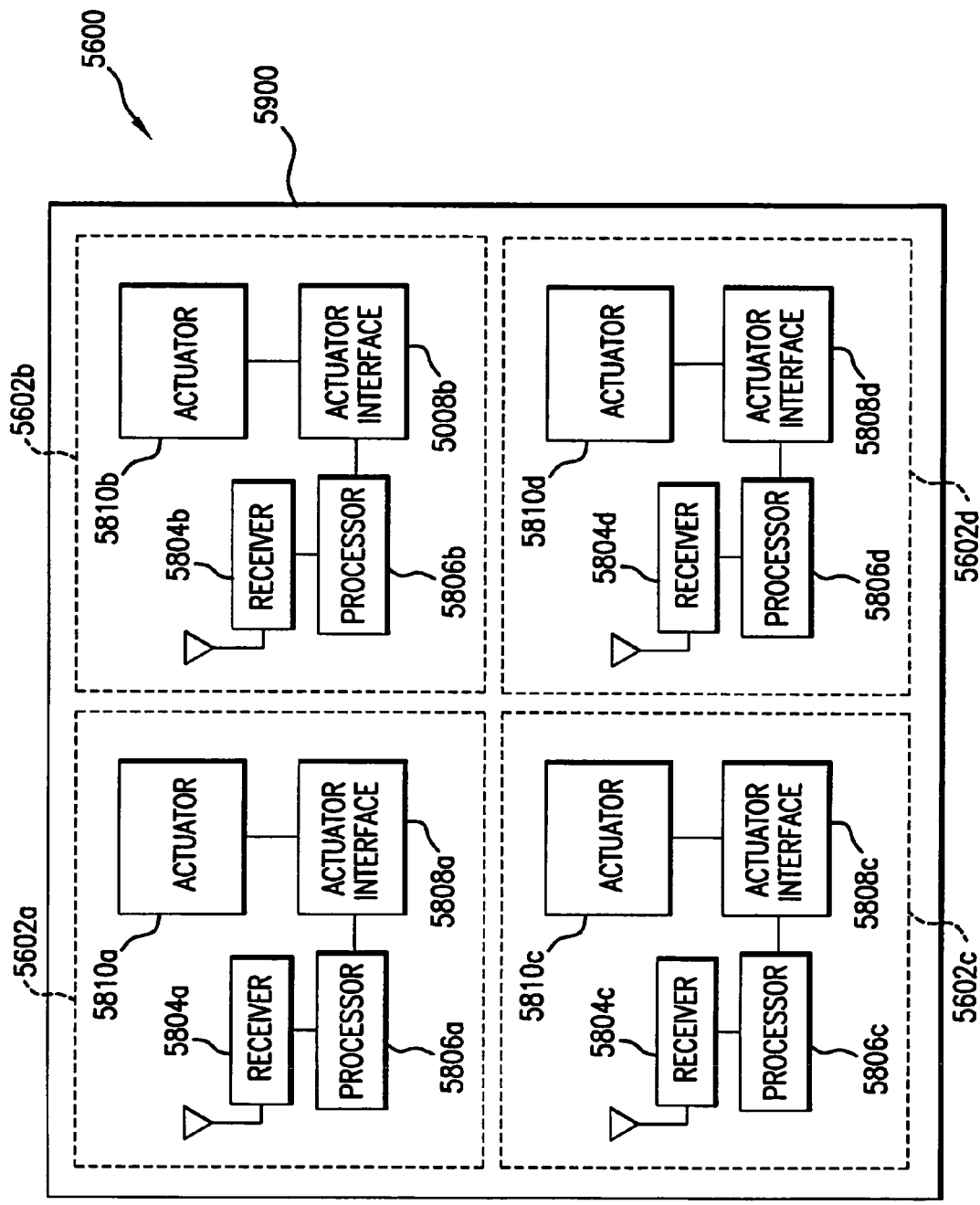

FIG. 59 shows a 2×2 acoustic cancellation array, with each cell of the array configured as shown in FIG. 58, according to an example embodiment of the present invention.

Figure 60:
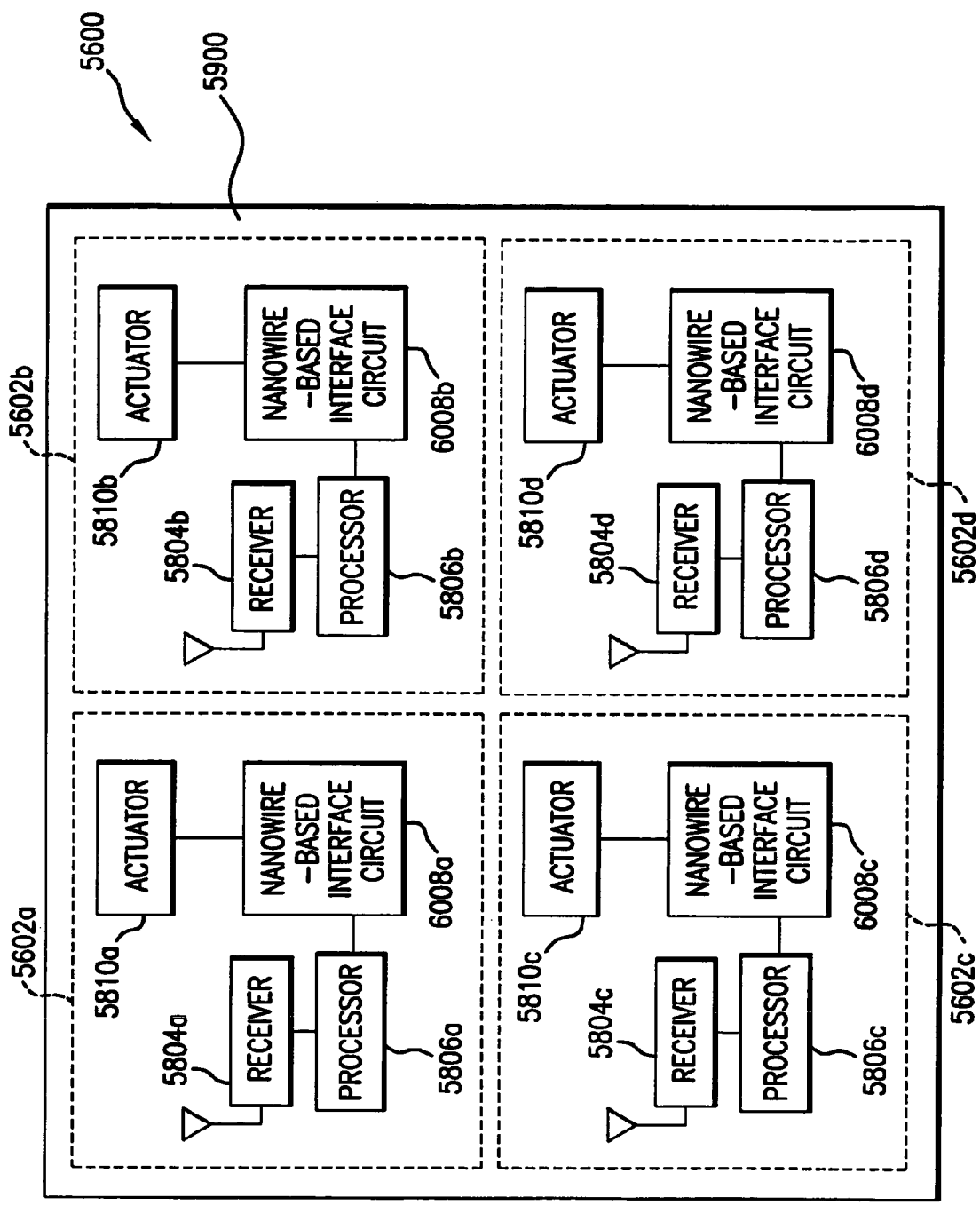

FIG. 60 shows an array similar to the array of FIG. 56, with each cell incorporating a nanowire-based interface circuit, according to an example embodiment of the present invention.

Figure 61:
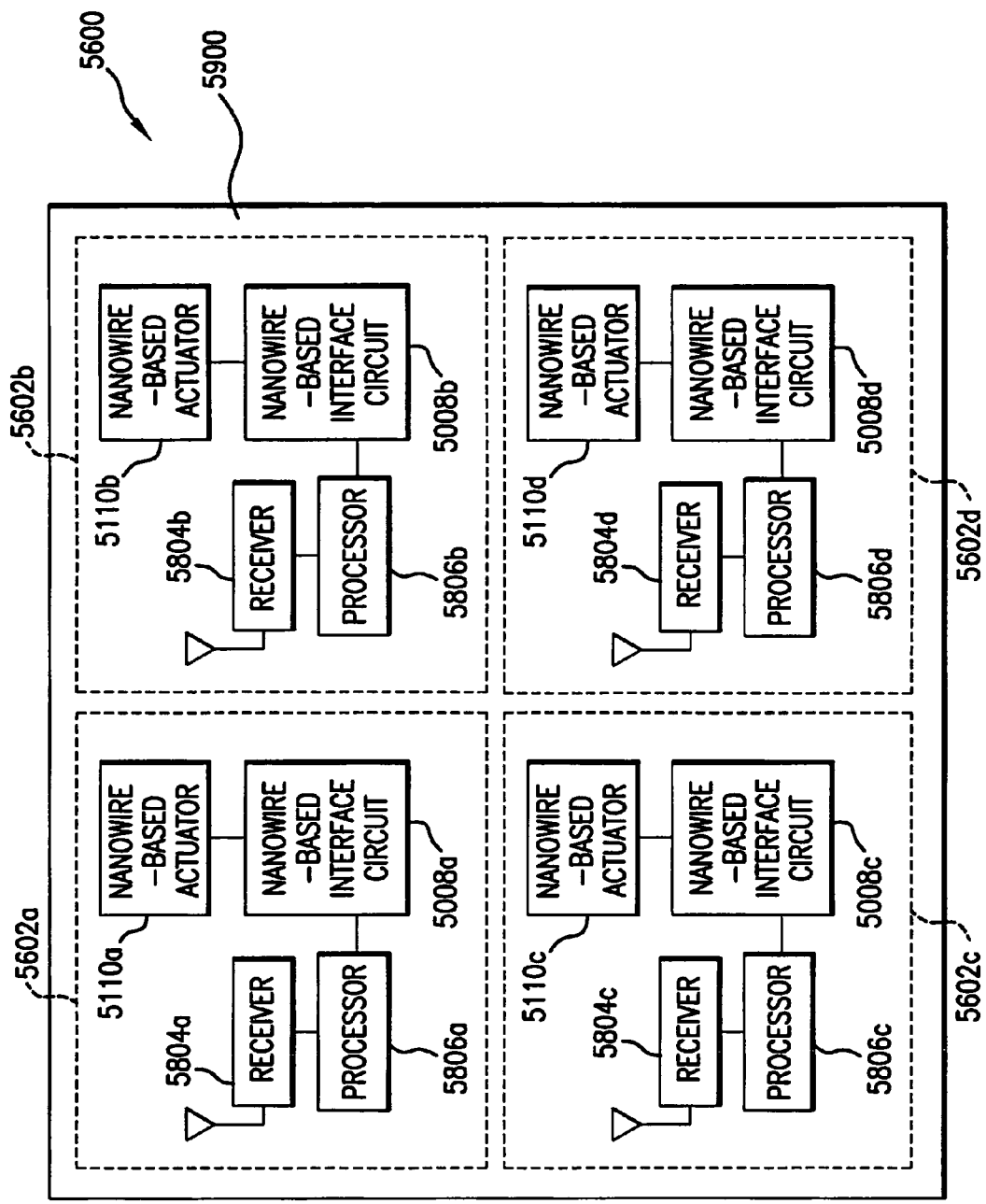

FIG. 61 shows an array similar to the array of FIG. 60, which each cell further incorporating a nanowire-based actuator, according to an example embodiment of the present invention.

Figure 62:
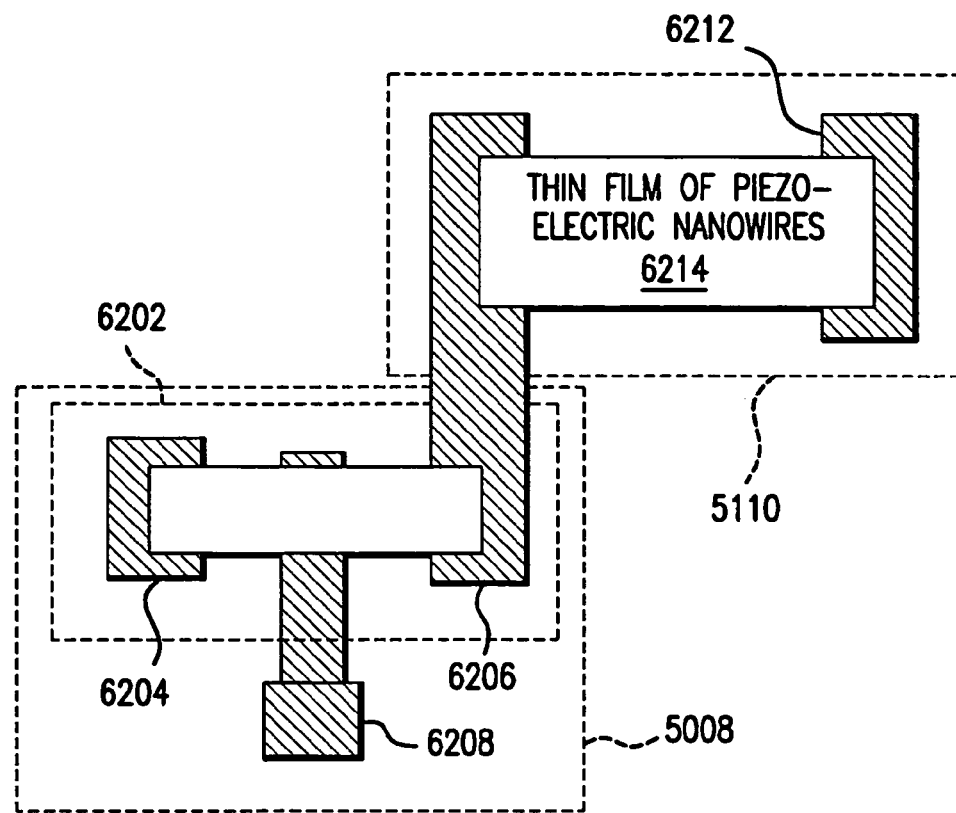
Figure 63:
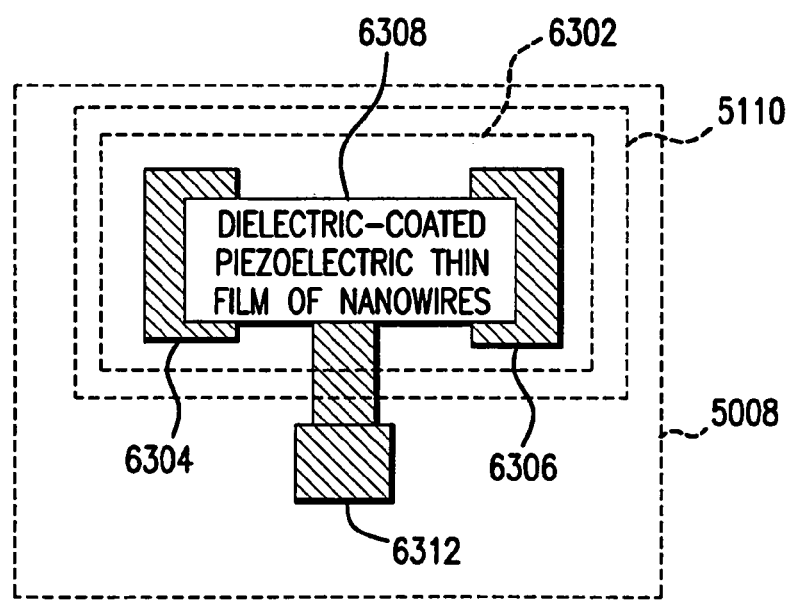

FIGS. 62 and 63 show nanowire-based interface circuits and actuators, according to example embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PRESENT INVENTION

Introduction

In many ways, the electronics industry today is in the same position it was fifty years ago. At that time, the introduction of discrete transistors provided the world with unprecedented functionality. By integrating multiple discrete transistors together, functionality was further increased, leading to the broad availability of portable electronics. Unfortunately, at that time, integration was done by hand, causing the electronics industry to rapidly reach a plateau, beyond which integrating more than a few thousand individual transistors became prohibitive in terms of cost and yield. This phenomenon was referred to as the "Tyranny of Numbers".

This practical limit, resulting from the need for heterogeneous integration of multiple discrete components, brought the integrated electronics industry to a standstill that was only resolved through the invention of a revolutionary new concept: the silicon microcircuit. The silicon microcircuit allowed seamless integration of a virtually limitless number of electronic components into a single device using a simple linear process: a true unifying platform for integrated electronics. It was this invention that allowed the integrated electronics industry to grow as it has, increasing circuit density (and therefore device functionality) in accordance with Moore's Law.

In many ways, the approaching end of Moore's Law resulting from transistors inevitably reaching their fundamental size limit (a few atoms wide) will create a situation analogous to the limit reached by transistors in the 1950s. As this fundamental circuit density (and the practical size-limit of semiconductor wafers) limit is approached, increased functionality will only continue to be achieved through the integration of multiple discrete components into higher-order devices. As such, the integrated circuits (ICs) of today are analogous to the transistors of the 1950s: an important discrete functional-unit requiring heterogeneous integration to expand its functionality.

In this sense, heterogeneous integration can involve combining multiple processors to perform a function, or combining processors with other discrete components such as memory, sensors, radio frequency (RF) electronics, antennas, active optical components, actuators, etc. The effects of the limit of heterogeneous integration have not yet been truly felt (development is still at a stage where only a small number of components must be integrated). However, eventually, as with the transistors of the 1950s, an analogous "Tyranny of Numbers" will inevitably be reached as the number of discrete functional units increases over time. Even today, heterogeneous integration of discrete ICs into higher-functional devices represents one of the largest cost components and the primary source of device failure in manufactured electronic devices. Without the introduction of a unifying platform upon which to integrate higher-functionality with today's ICs, within the next twenty years this will become the ultimate limitation on the growth of this world-reliant industry. No such platform currently exists.

The mixed-film macroelectronics technology of the present invention represents a fundamental underpinnings of a truly unifying platform for universal functional device integration. The description of the present invention herein focuses on tailoring functionality to produce high-performance transistors over large areas using nanowires with compositions selected for high conduction-mobility and integrated dielectric layers. However, by incorporating alternative nanowire materials, the same platform can be expanded to include high-performance optical, magnetic, ferroelectric, and piezoelectric properties as well. Building off of this fundamental platform, the present invention incorporates multiple different functionalities (e.g., high-performance electronic plus active optical) onto the same substrate to impart multiple different functionalities into the same material. This technology represents a true separation of structure and function: a paradigm shift in materials technology.

At its core, the technology described here represents a fundamental unifying materials platform capable of eventually enabling global integration of all different functionalities into a single device that can be fabricated using a standard linear process. Similar to the silicon IC, as the platform expands, all levels of functional-integration can be incorporated, indefinitely extending the spirit of (if not the specific definition of) Moore's Law.

The present invention is directed to a revolutionary new thin-film-on-plastic (or other useful substrate materials) technology based on dense films of oriented inorganic semiconductor nanowire (nanowires) aligned in parallel (or substantially aligned in parallel). As used herein, the term "nanowire" generally refers to any elongated conductive or semiconductive material that includes at least one cross sectional dimension that is less than 500 nm, and preferably, less than 100 nm, and has an aspect ratio (length:width) of greater than 10, preferably, greater than 50, and more preferably, greater than 100, and even greater than 500. For example, in an embodiment, a nanowire can have a diameter in the 1–100 nm range, and a length in the 1–100 micrometer range. In other embodiments, nanowires can have diameters and lengths in other ranges.

Examples of such nanowires include semiconductor nanowires as described in Published International Patent Application Nos. WO 02/17362, WO 02/48701, and 01/03208, carbon nanotubes, and other elongated conductive or semiconductive structures of like dimensions. Particularly preferred nanowires include semiconductive nanowires, that are comprised of semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, $CaCN_2$, $ZnGeP_2$, $CdSnAs_2$, $ZnSnSb_2$, $CuGeP_3$, $CuSi_2P_3$, (Cu, Ag)(Al, Ga, In, Tl, Fe)(S, Se, $Te)_2$, $Si_3N_4$, $Ge_3N_4$, $Al_2O_3$, (Al, Ga, $In)_2$ (S, Se, $Te)_3$, $Al_2CO$, and an appropriate combination of two or more such semiconductors. In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type is selected from a group consisting of: Si, Ge, Sn, S, Se and Te.

In certain instances the term "nanowire" as used herein also encompasses "nanotubes". These instances will be identified. Nanotubes can be formed in combinations/thin films of nanotubes as is described herein for nanowires, alone or in combination with nanowires, to provide the properties and advantages described herein.

Furthermore, it is noted that thin film of nanowires of the present invention can be a "heterogeneous" film, which incorporates semiconductor nanowires (and/or nanotubes, as identified), and/or nanowires (and/or nanotubes, as identified) of different composition and/or structural characteristics. For example, a "heterogeneous film" can includes nanowires/(and/or nanotubes, as identified) with varying diameters and lengths, and nanowires (and/or nanotubes, as identified) that are "heterostructures" having varying characteristics.

In the context of the present invention, the substrate to which nanowires are attached may comprise: a uniform substrate, e.g., a wafer of solid material, such as silicon, glass, quartz, polymerics, etc.; a large rigid sheet of solid materials, e.g., glass, quartz, plastics such as polycarbonate, polystyrene, etc., or can comprise additional elements, e.g., structural, compositional, etc. A flexible substrate, such as a roll of plastic such as polyolefins, polyamide, and others, a transparent substrate, or combinations of these features can be employed. For example, the substrate may include other circuit or structural elements that are part of the ultimately desired device. Particular examples of such elements include electrical circuit elements such as electrical contacts, other wires or conductive paths, including nanowires or other nanoscale conducting elements, optical and/or optoelectrical elements (e.g., lasers, light emitting diodes (LEDs), etc.), and structural elements (e.g., microcantilevers, pits, wells, posts, etc.).

By substantially "aligned" or "oriented" is meant that the longitudinal axes of a majority of nanowires in a collection or population of nanowires is oriented within 30 degrees of a single direction. Although the majority can be considered to be a number of nanowires greater than 50%, in various embodiments, 60%, 75%, 80%, 90%, or other percentage of nanowires can be considered to be a majority that are so oriented. In certain preferred aspects, the majority of nanowires are oriented within 10 degrees of the desired direction. In additional embodiments, the majority of nanowires may be oriented within other numbers or ranges of degrees of the desired direction.

It should be understood that the spatial descriptions (e.g., "above", "below", "up", "down", "top", "bottom", etc.) made herein are for purposes of illustration only, and that devices of the present invention can be spatially arranged in any orientation or manner.

Semiconductor nanowires can be synthesized off-line, and then deposited on plastic or any other substrate at low temperature. After deposition, the dense thin-film of nanowire can be further processed at low temperature using traditional thin-film transistor (TFT) manufacturing infrastructure to produce high-performance macroelectronic devices on plastic with electronic performance comparable to or exceeding that of bulk semiconductor devices of similar dimensions. In addition, this technology allows the fabrication of films containing nanowires of two or more different semiconductor compositions. This allows multi-functional macroelectronic systems incorporating logic, RF, light emission, light detection and more, all on a single substrate to be realized using a single linear manufacturing process (i.e., homogeneous integration of different electronic functionalities on a single monolithic substrate). This breakthrough technology opens up a broad range of new applications that had previously been too expensive to develop. These include, for example, distributed sensor networks fabricated on plastic or other useful substrates, which carry out sensing, computation, and remote communication throughout the network.

One of the important advantages of the present invention is the ability to fabricate high-performance large-area distributed macroelectronics at low-resolution and moderate complexity (e.g., 1000 s of transistors per circuit) on lightweight flexible substrates at a commercially reasonable cost, e.g., less than $100/ft$^2$. Such abilities enable the development of next-generation sensor and security applications with increased functionality, decreased size, decreased weight, and decreased power requirements compared to what is possible using traditional technologies. Yet these abilities can be realized at a cost that makes these new applications viable for real-world deployment.

Traditional TFT manufacturing processes for amorphous silicon are more than adequate to achieve the device complexity at costs of $100/ft$^2$ for current macroelectonic applications (e.g., TFT backplanes for liquid crystal displays (LCDs) are manufactured for less than $30/ft$^2$). However, the thin-film material of the present invention is not only compatible with these manufacturing processes (or with new, lower cost processes), but also realizes performance of more than two orders of magnitude greater than amorphous silicon.

In addition, in the development of high-value applications in macroelectronics, e.g., military, space, and defense applications, which are space, weight, and power constrained, it is highly desirable to be able to develop technologies that are compatible with complementary metal oxide semiconductor (CMOS) technology (e.g., for low power), and integrate other functionalities (e.g., light emission) into a single film to reduce the number of discrete components that need to be assembled to fabricate each device (decreasing cost, weight, and complexity, while increasing yield and functionality).

The revolutionary new thin-film technology of the present invention is based on dense, inorganic and oriented nanowire thin-films (DION thin-films). DION thin-films can enable high-performance large-area macroelectronics with multiple different electronic, electro-optic and electromechanical functionalities all on a single lightweight flexible substrate that can be fabricated over large areas (>10 m$^2$) at a cost of less than $100/ft$^2$. An important aspect of DION thin-film technology is that carrier conduction occurs within aligned single crystal nanowires. Hence single crystal mobility can be achieved in these macroelectronic devices. Furthermore, by exploiting quantum effects in nanowires, devices realized with the present invention can enjoy performances exceeding that of conventional bulk single crystals. Another important aspect of DION thin-film technology is that the high temperature steps required to synthesize single-crystal nanowires, which include an intrinsic high-quality gate-dielectric shell and a conformal gate-electrode around each individual nanowire, can be carried out off-line in reactors before the nanowires come into contact with the substrate. As a result, all processing steps that occur in the presence of the substrate material can be done at low temperature (<100° C.), allowing the use of many different substrate materials (e.g., flexible, low-$T_g$ (temperature of glass transition) plastics). DION thin-film technology can allow the fabrication of large-area flexible macroelectronics with performance exceeding that of single-crystal silicon. Additionally, DION thin-film technology can allow the fabrication of mixed-functionality monolithic electronics that cannot be fabricated using any current technology (e.g., combining the mobility of InAs, the CMOS performance of Si, and the light emission of GaN all on a single substrate). The result is a large-area macroelectronics technology that can outperform existing technologies, while producing lightweight, flexible electronics over large areas at low cost.

While this technology enables numerous possible combinations of functionality into a single film (e.g., electronic, optical, magnetic, ferroelectric, piezoelectric, etc), the following discussion focuses on high-performance electronics. In particular, the discussion focuses on the integration of high-performance n- and p-channel silicon nanowires for CMOS functionality (for low-power devices), and extreme-mobility III–V materials such as InAs and InP for RF processing, all on a single monolithic plastic substrate. Of course, it will be recognized by one of ordinary skill that a large number of different uses, applications, and systems can be enabled by the technology described herein.

The mixed-composition DION thin-film technology can enable the development of a variety of unique applications ranging from RF communications, to sensor arrays, to X-ray imagers, to flexible displays and electronics, and more. In addition, it can establish a foundation for a variety of high-value commercial technologies, including lightweight disposable or flexible displays with driver-electronics printed onto a single substrate, "penny"-RFID tags for universal RF-barcoding, integrated sensor networks for industrial monitoring and security applications, and phased-array antennas for wireless communications. The DION technology can revolutionize both the military and commercial world of large-area electronics.

Figure 1:
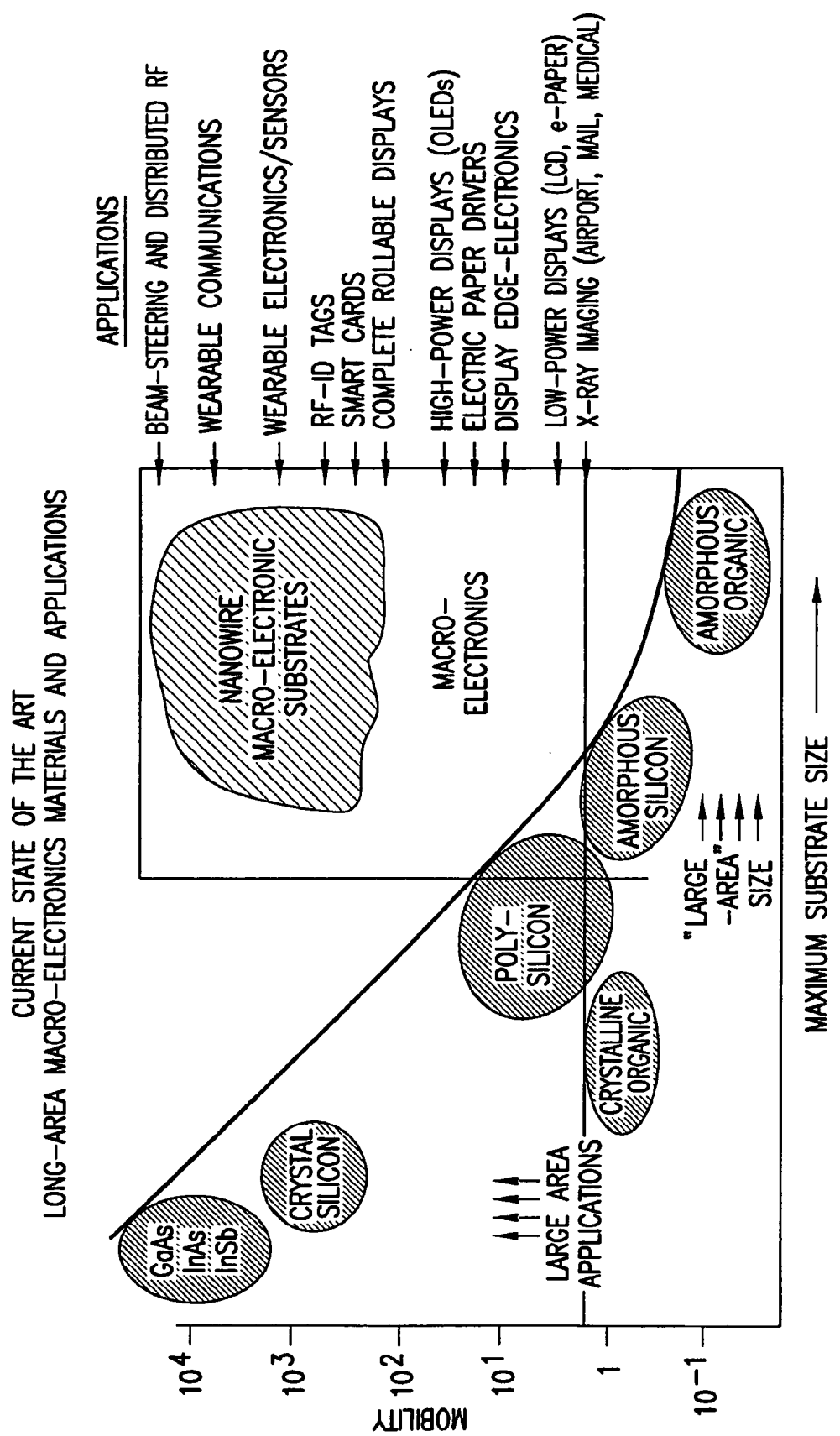
FIG. 1 is a plot that schematically illustrates materials performance (mobility) vs. available substrate size for different semiconductor materials (as indicated in the blue areas).
Figure 2:
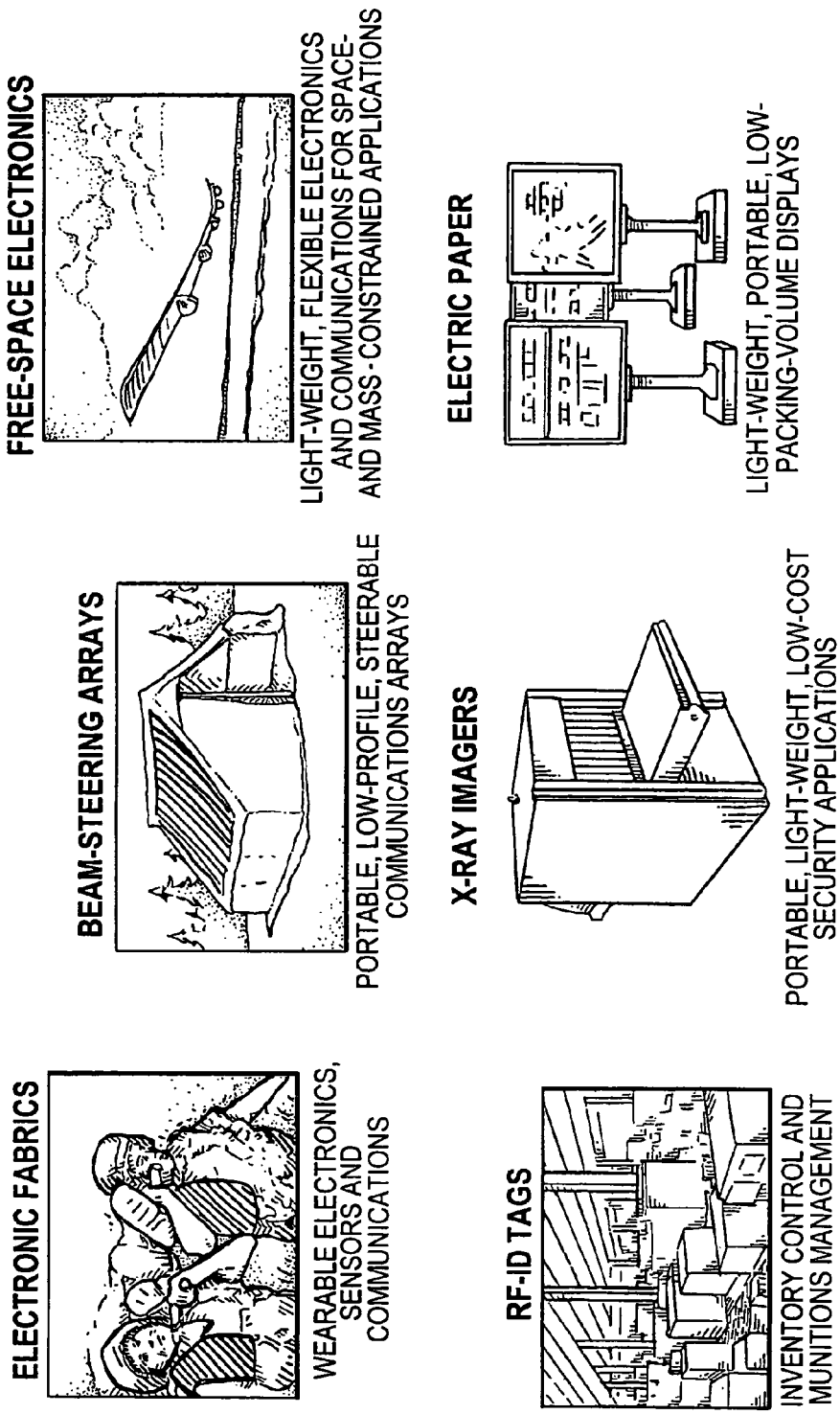
FIG. 2 shows several potential applications of true high-performance macroelectronics.
Figure 3:
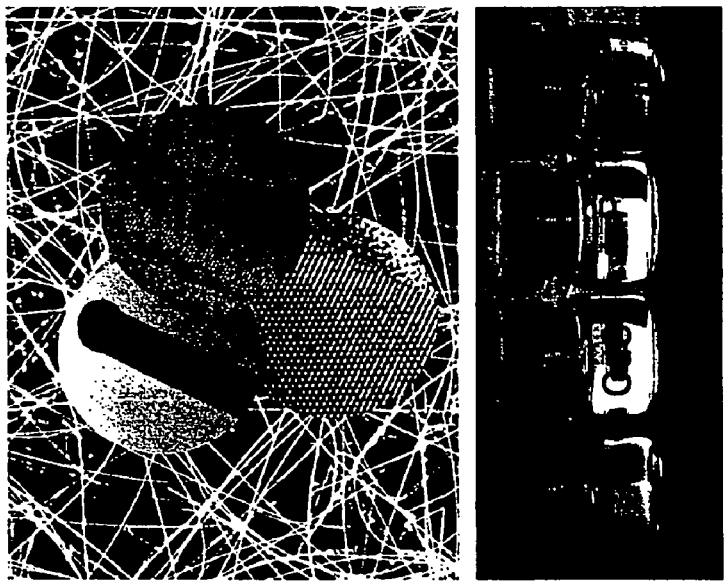
FIG. 3 illustrates semiconductor nanowire materials and quality.

FIG. 3 illustrates semiconductor nanowire materials and quality. The upper-right image shows nanowires at different magnifications as seen through an electron microscope showing the quality and uniformity of these materials. The lower-right image shows vials of different NW materials suspended in solution.

One of the truly unique properties of these materials is that their electronic and conductive properties can be exactly defined, including crystal structure, doping density, mobility, bandgap, etc. In addition, when synthesized, every nanowire is the same as every other nanowire within a batch (and between batches). This feature stands in striking contrast to other common nanomaterials, such as carbon nanotubes, where every nanotube within a batch is different from every other one, with electronic properties ranging from metallic to semiconducting to semimetallic. The ability to produce large volumes of nanowires with every nanowire having the same electronic properties facilitates the use of DION thin-film technology.

Figure 4A:
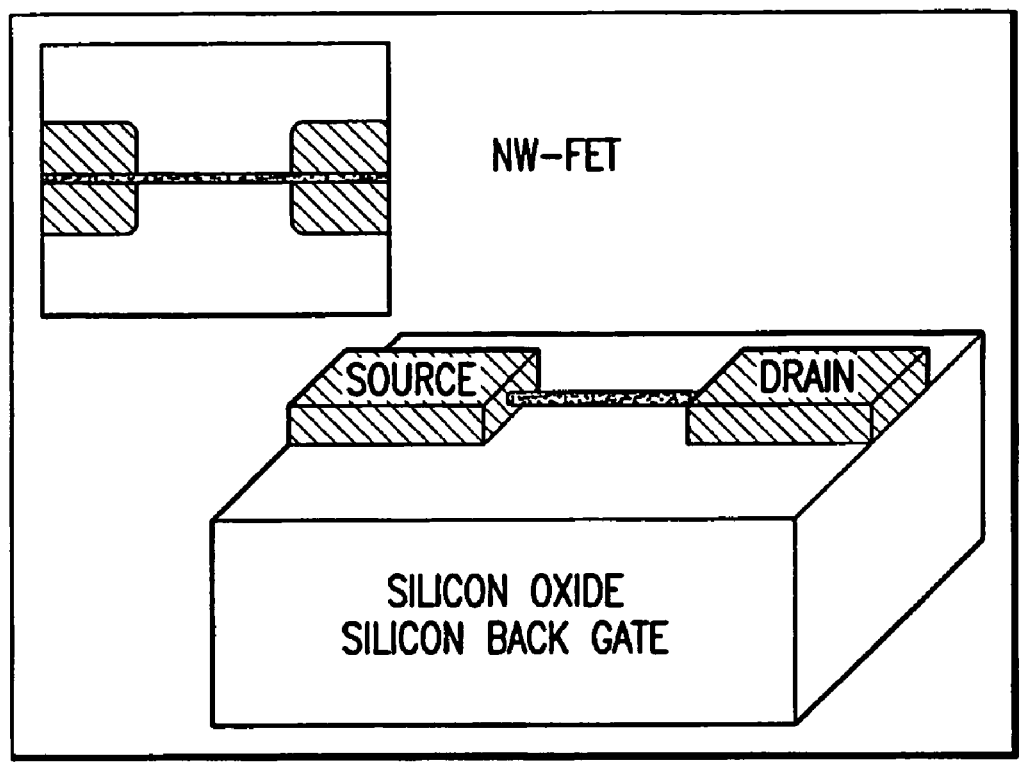
FIG. 4 illustrates a single nanowire FET.
Figure 4B:
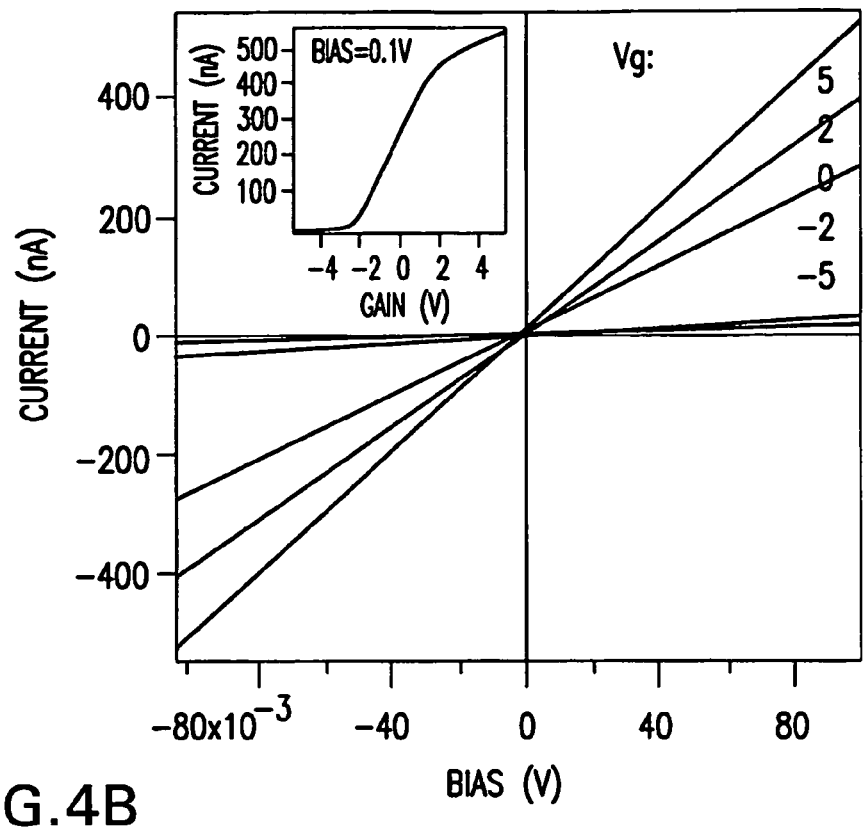
Figure 4C:
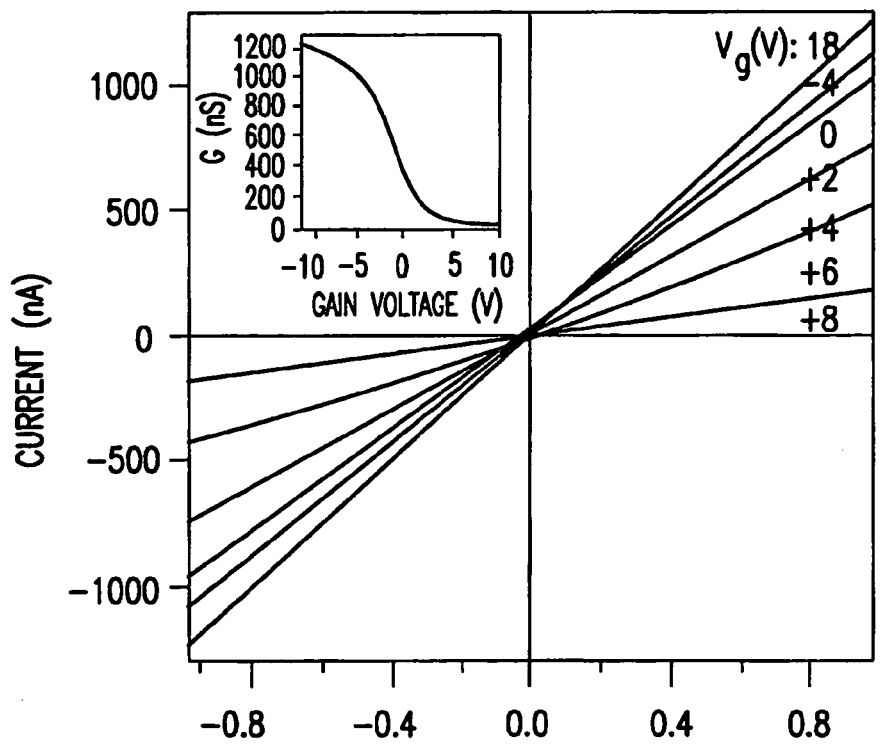

Single-nanowire electronic circuits have been fabricated including p-n diodes and field-effect transistors (FETs) (see, e.g., Y. Huang, X. Duan, Y. Cui, and C. M. Lieber "Gallium Nitride Nanowire Nanodevices," Nano Letters, 2, 101–104 (2002); Y. Cui, Z. Zhong, D. Wang, W. Wang, C. M. Lieber, Nano Lett. 3, 149 (2003); and X. Duan, Y. Huang, Y. Cui, J. Wang and C. M. Lieber, Nature 409, 66 (2001)). FIG. 4 illustrates a single nanowire FET. The left portion shows a scanning electron micrograph (SEM) image and a schematic drawing of a single nanowire FET. The middle and right portion shows the field-effect performance of n- and p-doped InP and Si single-nanowire FETs, respectively. Due to the high quality of these materials (true single crystals) combined with suppressed scattering probabilities arising from quantum-confined states, these inorganic semiconductor nanomaterials have been shown to have mobilities that exceed their bulk materials over distances greater than 100 µm. For example, field-effect mobilities of $\mu=1,500$ cm$^2$/V·s have been demonstrated for Si nanowires and $\mu>4,000$ cm$^2$/V·s for InP nanowires. These values are comparable or superior to their single-crystal counterparts with similar doping concentrations. These mobilities are believed to represent only a lower limit for these materials. In fact, theoretical calculations have predicted $\mu=3\times10^8$ cm$^2$/V·s for selectively doped GaAs nanowires.

The performance characteristics of these single-nanowire devices are extremely encouraging with respect to nanoelectronic applications. Many academic groups are currently pursuing the development of nanoelectronic circuits to make electronics faster and smaller. However, the total amount of current that can be carried by a single nanowire is very small, which limits the ability of single-wire devices to nanoelectronics applications such as nano-logic and nano-memory. Fortunately, the present invention provides a complete paradigm shift: using the same nanomaterials to make electronics faster and larger, but using the advances made in the work to date performed on such single wire devices.

Performance in electronic materials is characterized by the length scale (l) over which the material displays "order" compared to the length scale of the device in which it is used. FIG. 5 schematically illustrates the length scale of order. Mobility in a transistor is related to the number of traps and grain boundaries that a charge must pass as it travels between the source and the drain electrodes. On the length scale of macroelectronics (10–40 µm), amorphous and polycrystalline silicon have many such defects, resulting in poor mobilities. In contrast, single-crystal silicon can easily span the entire distance between electrodes without crossing a grain boundary, providing a device with performance that is limited only by the intrinsic mobilities of the material. For example, a single-crystal silicon wafer is "ordered" on l>1 cm and has $\mu>1,000$ cm$^2$/V·s for any device that is smaller than this length scale. In contrast, polycrystalline silicon is "ordered" on only $100\leq l\leq 500$ nm (approximately the grain size) and has $10\leq\mu\leq 50$ cm$^2$/V·s, while amorphous silicon, which is "ordered" on only l<10 nm, has $\mu\approx 1$ cm$^2$/V·s. Thus, the mobility of amorphous silicon is one thousand times lower than that of single-crystal silicon. Similarly, even the best organic semiconductors are ten to one hundred times still lower in performance.

Inorganic semiconductor nanowires are a unique material with respect to "length scale of order." In one dimension (across the diameter of the nanowire), they are "ordered" over only a few nanometers. Along the other dimension, however, they display order over 100 µm. This is why, on the length scale of macroelectronics, single-nanowire electronic devices display such high mobilities; on this length scale, they act like a single-crystal semiconductor. Unfortunately, while the mobility in a single-nanowire TFT may be high, the total current that can travel through a single nanowire is still extremely low.

The present invention leverages the extreme asymmetry in the "length scale of order" of inorganic semiconductor nanowires to produce a new macroelectronic substrate material that realizes a substantial improvement in performance. FIG. 6 schematically illustrates the length scales of nanowires. The schematic depiction of the length scales of nanowires and of macroelectronics shows how these materials can form uniform high-performance materials on the length scale of macroelectronics. On the length scale of macroelectronic electrodes ($l\approx 10$–20 µm), thousands of nanowires can be placed side-by-side (parallel to each other) in a pseudo-close-packed film across the span of a single electrode. Each of these nanowires is substantially longer than the distance between electrodes (100 µm vs. 20 µm). Therefore, virtually all of these nanowires will span the entire semiconducting channel to produce thousands of high-mobility conductive channels. By randomly staggering the starting point for each nanowire, the existence of "seams" in the material (the equivalent of a grain boundary) can be largely eliminated. In this manner, any individual nanowire that does not span the gap will be statistically averaged out over the substantially larger number of nanowires that do.

It is important to note that, since there is no commercially viable way to purify or filter carbon nanotube samples to separate metallic from semiconducting nanowires, carbon nanotubes cannot practically be used for form DION films for this type of application. The presence of even a single metallic nanowire within a device would substantially diminish transistor function. Similarly, since performance of each individual device depends on the average performance of the nanowires within that device, uniformity of materials characteristics is important. This has yet to be achieved in carbon nanotubes. Inorganic semiconductor nanowires enable this technology.

In addition to high mobilities, such dense nanowire films for macroelectronics have several other critical advantages. By way of example, such materials can have extremely thin, pinhole free gate-dielectric shells conformally surrounding each individual nanowire for low-voltage, low-power operation. Preliminary results from single-nanowire FET devices indicated that it is possible to produce an extremely thin, pinhole-free oxide shell around each nanowire during synthesis. FIG. 7 illustrates a semiconductor/dielectric core-shell structure. A schematic view of a nanowire core-shell structure with a crystalline core and integrated dielectric shell is shown. The integrated thin dielectric shell on the nanowire surface not only eliminates the high temperature process required to deposit the dielectric on substrate, but also affords a low threshold voltage.

Because the nanowires and shells are formed off of the substrate, they can be processed at high-temperature (>500° C.) to ensure the highest quality dielectric without affecting the choice of substrate material. The ability to form a high-quality dielectric is strongly dependent on the semiconductor used, with Si being the best example. This oxide layer, which can be as thin as 1–2 nm, can be used to replace the extrinsic gate-oxide in a FET, thus reducing the number of processing steps required and dramatically reducing the voltage required to turn the transistor on or off. Single-nanowire devices have been activated with less than 1 V of gate potential. Thus, very low power, high-mobility DION macroelectronics can also be produced. This is in sharp contrast to other thin-film low-temperature semiconductors, such as laser-annealed p-Si, which require thick dielectric layers formed at low temperatures in the presence of the substrate, resulting in limited substrate compatibility and high-power operation.

These materials also provide advantages in terms of uniformity of device performance across the thin-film, leading to low-cost device fabrication and extremely low power operation. One of the major limitations to other high-performance thin-film technologies, such as large-grain p-Si, is device-to-device uniformity due to the presence of grain-boundaries between source and drain electrodes. When grain boundaries are very small relative to the size of the transistor channel, the transistor suffers from poor mobility, but benefits from statistical averaging of the number of grains per device. That is to say, the number of grains per device is so large that each device has essentially the same number of grains and the same types of grains, so they all perform the same. The result is that each device performs the same as every other device; this is the case for amorphous silicon. Unfortunately, as the grain size increases, increasing overall mobility, the number of grains per device begins to decrease so that each device across a thin-film samples a statistically different numbers and type of grains. The result is that, as mobility increases with p-Si, uniformity in device characteristics decreases. This is particularly problematic in the variation of threshold voltage from device to device in high-mobility p-Si. To compensate for this intrinsic problem, it is necessary to either: (1) adjust for the non-uniformity by increasing the complexity of the circuit or (2) adjust for the non-uniformity by increasing the applied gate-voltage to all devices to ensure that all devices turn on under the same applied voltage. The fist option increases the number of mask steps for lithography (approximately twice as many mask steps) and as a result can dramatically increase the cost of devices. The second option can substantially increase the power consumption of the device. Since two of the primary requirements for certain high performance macroelectronics systems are cost and power consumption, neither of these solutions is acceptable in those applications.

The situation is quite different for DION thin-films. As a result of the extreme aspect ratio and alignment of the nanowires within a DION film, TFTs fabricated from these films are extremely uniform across the film. In one dimension, the nanowires can be more than ten times longer than the TFT channel-length so that virtually all nanowires span the entire channel (i.e., no grain boundaries in the direction of conduction). In the second dimension (the non-conducting direction), the nanowires are up to one thousand times smaller than the channel width, so that each transistor can easily contain hundreds to thousands of individual "grains". As a result, each transistor sees no grain-boundaries in the conducting direction and a true ensemble average in the non-conducting direction. This not only produces individual high-performance devices, but also eliminates differences from device to device through large-number statistical averaging. Thus, TFTs fabricated from DION films enjoy far greater uniformity than is currently available with p-Si or organic electronics.

Additionally, these materials provide advantages relative to their applicability to many different nanowire materials allowing DION thin-film devices to be fabricated containing many different functional devices, each with the performance of single-crystal semiconductors: DION thin-films are not limited to silicon nanowires. The same architecture can be used to form large-area macroelectronics substrates from even higher-performance materials, such as GaAs or InAs, or to fabricate nanowires with unique optical or mechanical properties, such as electroluminescent nanowires for light emission or piezoelectric nanowires for actuated surfaces or vibration or sound detection. Furthermore, nanowire structures with multiple shells can also be fabricated, such as, for example, an undoped conducting inner channel, a higher-energy doped inner shell, and an outer-shell dielectric. In this way, carriers are contributed from the inner shell into the conducting channel without providing dopants to the conducting channel that would reduce mobility through scattering. Such a structure can provide ballistic transport devices, providing extreme-performance macroelectronics. FIG. 8 illustrates a transmission electron microscope (TEM) and energy dispersive X-ray analysis (EDX) images of the cross section and composition of a multi-shell nanowire with a germanium core, a silicon inner shell and a silica outer shell (see, e.g., L. J. Lauhon, M. S. Gudiksen, D. Wang, and C. M. Lieber *Nature* 420, 57 (2002)).

The ability to incorporate a conducting gate-electrode shell, conformally grown on the outside of each individual nanowire, can dramatically increase TFT performance of DION films, reduce power consumption, and simplify the TFT fabrication process. Furthermore, integrating the gate electrode around the outside of each individual nanowire can provide a gate-electrode configuration for a cylindrical conducting channel (i.e., a conformal electrode that cylindrically surrounds each individual semiconductor channel). This means that DION thin-films can be fabricated with an intrinsic gate-dielectric and gate-electrode. Thus, the only post processing that is needed to fabricate electrical devices is to lithographically remove the gate-electrode shell from regions outside of the transistor channels and deposit metal to connect the gate electrodes to the rest of the circuit. This slight increase in the complexity of the individual nanomaterials within a DION thin film (performed during nanowire synthesis) can dramatically simplify the processing for fabrication of DION TFTs. It can also increase the performance of each DION TFT and decrease the power consumption of overall DION electronic devices due to the ideal gate contact configuration.

The materials described herein also have the inherent mechanical flexibility of the high-mobility semiconductor material, which allows fabrication of truly flexible high-performance electronics. Due to the extremely small diameter and large aspect ratio (>1,000), nanowires possess superior mechanical flexibility and strength. Individual nanowires can easily bend with radius of curvature r<10 µm before failure. For example, FIG. 9 shows a dark-field optical micrograph (OM) of a nanowire with bend r<10 µm. The bar is 10 µm. The width of the nanowire artificially appears larger than it is due to the diffraction limit of visible light. Because each individual nanowire on the high-density substrates described above is aligned in the same direction, but physically independent of the surrounding wires, flexibility of the DION thin-film is retained. Even without bending the individual nanowires within a device, the fact that each wire is only 100 µm long allows a macroscopic r<<1 mm.

The materials described above are capable of being processed in a solution and have large-area compatibility. Unlike bulk semiconductor wafers, nanowires can be suspended in solution and then deposited and secured onto virtually any substrate. This process is not limited to a particular size range and is therefore ideal for large-area electronics. Combined with a flexible substrate, this technology will enable compatibility with roll-to-roll production of high-performance electronics via nozzle or screen-printing technologies. One added advantage of this is the environment in which nanowires would be deposited. Typical micrometer- and submicrometer-regime semiconductor technologies require large clean rooms and specialized equipment within the clean rooms. Nanowires of the present invention can be suspended in a solution and then deposited onto large surfaces without the worry that "large" contaminants would disrupt the semiconductor wires. Defect control can occur during the phase of fabricating the semiconductor nanowires and preparing the solution, thus reducing the strictness of the printing process.

Other advantages include the ability to avoid the high-temperature processing required for semiconductor deposition, annealing, or gate-dielectric deposition. DION TFTs can be fabricated on virtually any substrate (e.g., lightweight plastic). The high-$T_p$ (temperature of peak crystallization) synthetic process used to make semiconductor nanowires, gate-dielectric shells, and gate-electrode shells is done off-line (i.e., not in the presence of the substrate material). Therefore, extremely high-quality nanowires can be produced and then deposited onto virtually any substrate material (even if the substrate is not compatible with high-$T_p$ processing). In addition, since the surface of nanowires can be treated chemically with any functionality, a wide variety of substrates can be used.

Overall, by incorporating the extraordinary electronic and conductive properties of inorganic nanowires into dense oriented arrays on a solid substrate, a large-area, flexible semiconductor substrate can be fabricated. Such a large-area, flexible semiconductor substrate can enjoy electrical performance comparable to or exceeding that of a single-crystal silicon wafer in terms of mobility, threshold voltage, and $I_{on}/I_{off}$. By incorporating other functional nanowire materials, other functional devices with single-crystal performance can also be fabricated.

Furthermore, such materials as mixed-composition DION thin-films (a Universal Electronic Substrate Technology) can also be used. Multiple different nanowire materials can be deposited onto a single substrate at the same time. Such mixed-composition DION thin-films can enable the fabrication of a single monolithic plastic substrate upon which it is fabricated an entire integrated electronic system ("System on a Sheet"). Unlike current devices fabricated on silicon wafers, such an embodiment of such a System on a Sheet could realize a variety of capabilities. These include, but are not limited to, high-performance CMOS electronics, emit light like GaN, process high-frequency RF signals like GaAs, vibrate to create or detect sound like a piezoelectric material, and include simple high-speed non-volatile memory through spin-polarization like a ferroelectric thin-film. With mixed-composition DION thin-films, all of these characteristics can be embodied into a single monolithic substrate that can then be patterned and processed using traditional lithographic technologies to fabricate an entire functional system on a rollable sheet of plastic. This technology represents an unprecedented advance in the development of electronic systems for military applications that are space, weight, and power constrained. (See, Table 1 for comparisons to other macroelectronics materials). The technology described herein can leverage all of the developments of uniquely functional single-nanowire electronic devices that have been developed so as to impart any combination of these unique single-nanowire characteristics (or all of them) onto a single monolithic macroelectronic system on plastic.

TABLE 1

Comparison of traditional materials

| Functional Property | Organic Semi-conductors | a-Si | p-Si | Single-crystal Si | Mixed-composition DION thin-films |
|---|---|---|---|---|---|
| Electron Mobility (cm2/Vs) | 0.001 | 1 | 100 | 1500 | 5000 |
| Hole Mobility (cm2/Vs) | 0.1 | 0.1 | 30 | 500 | 1500 |
| Threshold Voltage (typical) | 2–10V | 3V | <2V | <1V | <1V |
| Threshold Voltage | extremely | good | poor | Excellent | Excellent |

TABLE 1-continued

Comparison of traditional materials

| Functional Property | Organic Semi-conductors | a-Si | p-Si | Single-crystal Si | Mixed-composition DION thin-films |
|---|---|---|---|---|---|
| Uniformity | poor | | | | |
| On/Off ratio | 10*5 | 10*9 | 10*6 | >10*10 | >10*6 |
| CMOS compatible? | No | No | Yes | Yes | Yes |
| High-frequency RF compatible? | No | No | No | Yes | Yes |
| Light emitting properties? | No | No | No | No | Yes |
| Piezoelectric properties? | No | No | No | No | No |
| Ferroelectric properties? | No | No | No | No | Yes |

In the sections below, thin films of nanowires, and methods of making thin films of nanowires, are described. This is followed by a description of a DION TFT proof-of-concept demonstration and an exemplary CMOS TFT device fabrication process. Finally, various applications of thin films of nanowires are described. The applications described below include the use of thin films of nanowires in distributed sensor networks, RFID tags, adjustable phase delays, and acoustic cancellation devices. Further applications for thin films of nanowires are also described herein.

It should be appreciated that the particular implementations shown and described herein are examples of the present invention and are not intended to otherwise limit the scope of the present invention in any way. Indeed, for the sake of brevity, conventional electronics, manufacturing, semiconductor devices, and nanotube and nanowire technologies and other functional aspects of the systems (and components of the individual operating components of the systems) may not be described in detail herein, but will be apparent to persons skilled in the relevant art(s) in view of the description herein. Furthermore, for purposes of brevity, the present invention is frequently described herein as pertaining to a semiconductor transistor device. It should be appreciated that the manufacturing techniques described herein could be used to produce any semiconductor device type, and other electronic component types. Further, the techniques would be suitable for application in electrical systems, optical systems, consumer electronics, industrial electronics, wireless systems, space applications, or any other application.

Nanowire Film Embodiments

The present invention is directed to the use of nanowires and nanotubes in systems and devices to improve system and device performance. For example, the present invention is directed to the use of nanowires in semiconductor devices. According to the present invention, multiple nanowires are formed into a high mobility thin film. The thin film of nanowires is used in electronic devices to enhance the performance and manufacturability of the devices.

FIG. 10 shows a close-up view of a thin film of nanowires 1000, according to an example embodiment of the present invention. Thin film of semiconductor nanowires 1000 can be used instead of amorphous silicon or organic thin films in conventional electronic devices to achieve improved device behavior, while allowing for a straightforward and inexpensive manufacturing process. Through the use of thin films of nanowires, the present invention is particularly adapted to making high performance, low cost devices on large and flexible substrates.

Note that thin film of nanowires 1000 as described herein may be formed in a wide range of possible surface areas. For example, thin films of nanowires 1000 of the present invention can be formed to have functional areas greater than 1 mm$^2$, greater than 1 cm$^2$, greater than 10 cm$^2$, greater than 1 m$^2$, and even greater or smaller areas.

As shown in FIG. 10, thin film of nanowires 1000 includes a plurality of individual nanowires closely located together. Thin film of nanowires 1000 can have a variety of thickness amounts that are equal to or greater than the thickness of a single nanowire. In the example of FIG. 10, the nanowires of thin film of nanowires 1000 are aligned such that their long axes are substantially parallel to each other. Note that in alternative embodiments, the nanowires of thin film of nanowires 1000 are not aligned, and instead can be oriented in different directions with respect to each other, either randomly or otherwise. In an alternative embodiment, the nanowires of thin film of nanowires 1000 may be isotropically oriented, so that high mobility is provided in all directions. Note that the nanowires of thin film of nanowires 1000 may be aligned in any manner relative to the direction of electron flow in order to enhance performance as required by a particular application.

FIG. 11 shows a semiconductor device 1100 that includes thin film of nanowires 1000, according to an example embodiment of the present invention. In FIG. 11, semiconductor device 1100 is shown as a transistor, having a source electrode 1102, a gate electrode 1104, a drain electrode 1106, formed on a substrate 1108. Thin film of nanowires 1000 is coupled between source electrode 1102 and drain electrode 1106 over a portion of gate electrode 1104. Thin film of nanowires 1000 substantially operates as a channel region for the transistor of semiconductor device 1100, and allows semiconductor 1100 to operate with enhanced characteristics, as further described herein. Numerous substrate types applicable to substrate 1108 are described elsewhere herein.

Note that semiconductor device 1100 is shown as a transistor in FIG. 11 for illustrative purposes. It would be understood to persons skilled in the relevant art(s) from the teachings herein that thin film of nanowires 1000 can be included in semiconductor device types in addition to transistors, including diodes.

In embodiments, the nanowires of thin film of nanowires 1000 are single crystal semiconductor nanowires that span all the way between source electrode 1102 and drain electrode 1106. Hence, electric carriers can transport through the single crystal nanowires, resulting in high mobility, which has not been obtained with current amorphous and polysilicon technologies.

In addition, and without being bound to any particular theory of operation, due to a one-dimensional nature of the electron-wave traversing inside the nanowire channel, and a reduced scattering probability, nanowires can be fabricated to achieve even higher mobility than a bulk single crystal material. Nanowires can be designed to be a "ballistic" transport for electrical carries. "Ballistic" is used herein to mean transport through a nanowire with no scattering and where the nanowire has quantized resistance.

Note that a variety of contact area types can be formed for semiconductor devices incorporating nanowires. The contact areas can be ohmic and non-ohmic. For example, a non-ohmic Schottky diode barrier contact can be used as an electrode. A Schottky diode barrier contact is commonly used for a III–V semiconductor material when it is difficult to make a high quality gate dielectrics. Source electrodes 1102, gate electrodes 1104, and drain electrodes 1106 are formed of a conductive material, such as a metal, alloy, silicide, polysilicon, or the like, including combinations thereof, as would be apparent to a person having ordinary skill in the art.

As described above, the nanowires of thin film of nanowires 1000 can be aligned or oriented. For example, the nanowires of thin film of nanowires 1000 shown in FIG. 11 can be aligned parallel to the length of the channel between source electrode 1102 and drain electrode 1106, or can be aligned in alternative ways.

Thin film of nanowires 1000 can be formed with a sufficient number of nanowires to provide desired characteristics for semiconductor device 1100. For example, thin film of nanowires 1000 can be formed of a sufficient number or density of nanowires to achieve a desired operational current density or current level desired for the particular application. For example, the current level may be in the nanoamp range, including two nanoamps, and greater and lesser current levels. For instance, in the transistor example of FIG. 11, thin film of nanowires 1000 can be formed to have a current level in the channel of greater than about ten nanoamps. By using larger numbers of nanowires, and/or higher mobility nanowires, higher current levels are possible, including current levels in the microamp range, the milliamp range, and even greater amounts.

For example, to achieve the required operational current density, a minimum number of nanowires can be included in the thin film of nanowires for a given area on the substrate. Hence, each formed semiconductor device will have a sufficient number of nanowires to carry current at an operational current level. For example, the required number of nanowires per unit area can be one nanowire, two nanowires, and any other greater number of nanowires, including 5, 10, 100, 1000 or more.

In an embodiment, a thin film of nanowires 1000 can be formed to have asymmetric mobility. For example, this can be accomplished by asymmetrically aligning the nanowires of thin film of nanowires 1000, and/or by doping the nanowires in a particular manner. Such asymmetric mobility can be caused to be much greater in a first direction than in a second direction. For example, asymmetric mobilities can be created in the order of 10, 100, 1000, and 10000 times greater in the first direction than in the second direction, or to have any other asymmetric mobility ratio between, greater, or less than these values. For example, this can be done by substantially aligning nanowires in a single direction to create high mobility in the direction parallel to the direction of the nanowires, and creating lower mobility a direction perpendicular to the direction of the nanowires.

The nanowires of thin film of nanowires 1000 can be doped in various ways to improve performance. The nanowires can be doped prior to inclusion in semiconductor device 1100, or after inclusion. The nanowires can be doped prior to being formed into a thin film, or after being formed into a thin film. A thin film of nanowires can be doped after being formed on the substrate. Furthermore, a nanowire can be doped differently along portions of its long axis, and can be doped differently from other nanowires in thin film of nanowires 1000. Some examples of doping schemes for individual nanowires, and for thin films of nanowires are provided as follows. However, it will be apparent to persons skilled in the relevant art(s) from the teachings herein that nanowires, and thin films thereof, can be doped according to additional ways, and in any combination of the ways described herein.

Figure 12A:
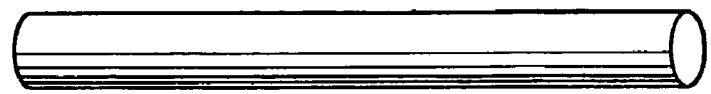

FIG. 12A shows a nanowire 1200 that is a uniformly doped single crystal nanowire. Such single crystal nanowires can be doped into either p- or n-type semiconductors in a fairly controlled way. Doped nanowires such as nanowire 1200 exhibit improved electronic properties. For instance, such nanowires can be doped to have carrier mobility levels comparable to alternative single crystal materials. In addition, and without being bound to any particular theory of operation, due to a one-dimensional nature of the electron-wave traversing inside the nanowire channel, and a reduced scattering probability, nanowires can be fabricated to achieve even higher mobility than a bulk single crystal material. Carrier mobility levels up to 1500 $cm^2/V \cdot s$ have been shown for single p-type Si nanowires, and carrier mobility levels up to 4000 $cm^2/V \cdot s$ have been shown for n-type InP nanowires.

Figure 12B:
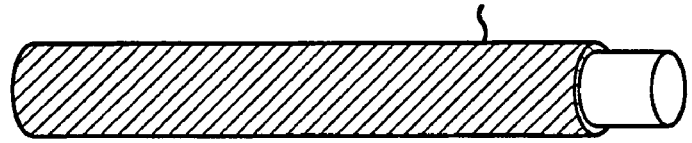

FIG. 12B shows a nanowire 1210 doped according to a core-shell structure. As shown in FIG. 12B, nanowire 1210 has a doped surface layer 1202, which can have varying thickness levels. Thickness levels can be only a molecular monolayer on the surface of nanowire 1210. Such surface doping can separate impurities from a conducting channel of the nanowire, and suppress an impurity-related scattering event, and thus can lead to greatly enhanced carrier mobility. For example, when nanowires are doped according to the core-shell structure, "ballistic" transport can be achieved inside the nanowires. Further detail on doping of nanowires is provided below.

Figure 12C:

FIG. 12C shows a nanowire 1220 that is uniformly doped, and coated with a dielectric material layer 1204, according to another type of core-shell structure. Dielectric material layer 1204 can be chosen from a variety of dielectric materials, such as $SiO_2$ or $Si_3N_4$. The use of dielectric material layer 1204 can simplify fabrication of semiconductor device 1100, as described elsewhere herein. The dielectric layer can be formed by oxidizing the nanowire, coating the nanowire, or otherwise forming the dielectric layer. For example, other non-oxided high dielectric constant materials can be used, including silicon nitride, $Ta_2O_5$, $TiO_2$, $ZrO_2$, $HfO_2$, $Al_2O_3$, and others. Nitridation of nanowires can be accomplished with processes similar to those employed in oxidation of nanowires. These materials can be applied to nanowires by chemical vapor deposition (CVD), solution phase over-coating, or simply by spin-coating the appropriate precursor onto the substrate. Other known techniques can also be employed.

Figure 12D:

FIG. 12D shows a nanowire 1230 that is doped with a doped surface layer 1202 according to the core-shell structure shown in FIG. 12B, and is also coated with a dielectric material layer 1204, as shown in FIG. 12C.

FIGS. 13A and 13B show examples of semiconductor device 1100, according to example doping embodiments of the present invention. As shown in FIG. 13A, the top surface of substrate 1108 is coated with a dopant layer 1302. Dopant layer 1302 includes electron-donor or electron acceptor doping materials. Properties of semiconductor device 1100 can be controlled by the introduction of dopant layer 1302. The electron-donor or electron acceptor materials introduce negative or positive charge carriers into the nanowires to achieve n- or p-channel transistors, respectively. Very high mobility levels can be attained in this configuration for semiconductor device 1100 because the dopants are separated from the actual conducting channel.

As shown in FIG. 13B, dopant layer 1302 covers a region of substrate 1108 substantially localized around thin film of nanowires 1000. In embodiments, dopant layer 1302 applied to semiconductor device 1100 can be patterned to have two or more areas doped according to different n- and p-type characteristics. For example, in the embodiment of FIG. 13B, dopant layer 1302 has a first portion 1304 doped with an n-type characteristic, and a second portion 1306 doped with a p-type characteristic. In such an embodiment, a p-n junction can be achieved according to a variety of electronic and optoelectronic devices, including LEDs.

As described above, dopant layer 1302 can be introduced on substrate 1108 prior to or after actual fabrication of semiconductor device 1100.

Collections of nanowires manufactured with these materials are useful building blocks for high performance electronics. A collection of nanowires orientated in substantially the same direction will have a high mobility value. Furthermore, nanowires can be flexibly processed in solution to allow for inexpensive manufacture. Collections of nanowires can be easily assembled onto any type of substrate from solution to achieve a thin film of nanowires. For example a thin film of nanowires used in a semiconductor device can be formed to include 2, 5, 10, 100, and any other number of nanowires between or greater than these amounts, for use in high performance electronics.

Note that nanowires can also be used to make high performance composite materials when combined with polymers/materials such as organic semiconductor materials, which can be flexibly spin-cast on any type of substrate. Nanowire/polymer composites can provide properties superior to a pure polymer materials. Further detail on nanowire/polymer composites is provided below.

As described above, collections or thin films of nanowires can be aligned into being substantially parallel to each other, or can be left non-aligned or random. Non-aligned collections or thin films of nanowires provide electronic properties comparable or superior to polysilicon materials, which typically have mobility values in the range of 1–10 $cm^2/V \cdot s$. Furthermore, non-aligned collections or thin films of nanowires can provide properties comparable or superior to single crystal material, if a sufficiently high density of nanowires is used.

Aligned collections or thin films of nanowires provide for materials having performance comparable or superior to single crystal materials. Furthermore, collections or thin films of nanowires that include aligned ballistic nanowires (e.g., core-shell nanowires as shown in FIG. 12B) can provide dramatically improved performance over single crystal materials.

Aligned and non-aligned, and composite and non-composite thin films of nanowires can be produced in a variety of ways, according to the present invention. Example embodiments for the assembly and production of these types of thin films of nanowires are provided as follows.

Randomly oriented thin films of nanowires can be obtained in a variety of ways. For example, nanowires can be dispersed into a suitable solution. The nanowires can then be deposited onto a desired substrate using spin-casting, drop-and-dry, flood-and-dry, or dip-and-dry approaches. These processes can be undertaken multiple times to ensure a high degree of coverage. Randomly oriented thin films of nanowires/polymer composites can be produced in a similar way, providing that the solution in which the nanowires are dispersed is a polymer solution.

Aligned thin films of nanowires can be obtained in a variety of ways. For example, aligned thin films of nanowires can be produced by using the following techniques: (a) Langmuir-Blodgett film alignment; (b) fluidic flow approaches, such as described in U.S. patent application Ser. No. 10/239,000, filed Sep. 10, 2002, and incorporated herein in its entirety by reference; and (c) application of mechanical shear force. For example, mechanical shear force can be applied by placing the nanowires between first and second surfaces, and then moving the first and second surfaces in opposite directions to align the nanowires. Aligned thin films of nanowires/polymer composites can be obtained using these techniques, followed by a spin-casting of the desired polymer onto the produced thin film of nanowires. For example, nanowires can be deposited in a liquid polymer solution, alignment can then be performed according to one of these or other alignment processes, and the aligned nanowires can then be cured (e.g., utraviolet cured, crosslinked, etc.). An aligned thin film of nanowires/polymer composite can also be obtained by mechanically stretching a randomly oriented thin film of nanowires/polymer composite.

Thin films of nanowires can be formed on virtually any substrate type, including silicon, glass, quartz, polymeric, and any other substrate type describe herein or otherwise known. The substrate can be large area or small area, and can be rigid or flexible, such as a flexible plastic or thin film substrate type. Furthermore, the substrate can be opaque or transparent, and can be made from a conductive, semiconductive, or a non-conductive material.

Nanowire film contacts, including sources, drains, and gates, for example, can be patterned on a substrate using standard photolithography, ink-jet printing, or micro-contact printing processes, for example, or by other processes.

A dielectric layer can be applied to a thin film of nanowires on a substrate to electrically insulate gate contacts, for example. The deposition of a dielectric layer can be done using evaporation, solution cast of polymer or oxide dielectrics, and by other processes. Such a deposition of a dielectric layer on a substrate may not be necessary if their own dielectric layers insulate the nanowires.

Note that nanowire films can be patterned on a substrate using various processes, including lithography techniques. Deposition and patterning of thin film of nanowires can be done simultaneously using various processes, such as ink-jet printing or micro-contact printing methods.

Note that the order in which contacts are patterned can be varied. For example, gates 1104, sources 1102, and drains 1106 shown in FIG. 11 can be patterned simultaneously with each other, or at different times. They can all be patterned prior to deposition of the thin film of nanowires 1000, or afterwards. Sources 1102 and drains 1106 can be patterned prior to deposition of the thin film of nanowires 1000, while gates 1104 are patterned afterwards. Alternatively, gates 1104 can be patterned prior to deposition of the thin film of nanowires 1000, while sources 1102 and drains 1106 are patterned afterwards. Either of sources 1102 or drains 1106 can also be patterned prior to deposition of the thin film of nanowires 1000, while the other is patterned afterwards.

Note that in some embodiments, more than one layer of a thin film of nanowires can be applied to a substrate in a given area. The multiple layers can allow for greater electrical conductivity, and can be used to modify electrical characteristics of a respective semiconductor device. The multiple layers can be similar, or different from each other. For example, two or more layers of thin films of nanowires having nanowires aligned in different directions, doped differently, and/or differently insulated, can be used in a particular semiconductor device. A contact area of a particular semiconductor device can be coupled to any one or more of the layers of a multiple layer thin film of nanowires. Note that a thin film of nanowires can be formed as a monolayer of nanowires, a sub-monolayer of nanowires, and greater than a monolayer of nanowires, as desired.

DION TFT Proof-of-Concept Demonstration

In order to demonstrate DION TFT technology, a small-scale proof-of-concept of a multi-nanowire TFT device is described. A $SiO_2$ substrate is first patterned with a metal gate electrode (Ti/Au), which is then coated with a thick layer (60 nm) of $Al_2O_3$ to form a gate dielectric. A moderate density film of heavily p-doped silicon nanowires are then shear deposited on the substrate, leaving an array of roughly oriented nanowires extending across the gate electrode. The surface is then patterned and developed using standard E-beam resist to expose the source and drain electrode regions. Aluminum is then deposited using a standard sputtering system. Because the nanowires are heavily doped, no contact doping is required. The remaining resist is then removed, removing all of the wires that are not pinned down by the source and drain electrodes. The transistor was tested by applying a 1 Volt source-drain potential and sweeping the gate voltage. While the resulting device is rather non-uniform, with wires poorly aligned and in many cases broken, the resulting transistor shows remarkably good performance, with an on/off ratio around $10^4$, and hole-mobility close to 100 $cm^2/V \cdot s$. By increasing the number of nanowires per device, the total on-current can be increased to as high as 1 mA, demonstrating the capabilities of multi-nanowire TFTs (the basis of DION technology) for high-performance macroelectronic devices. FIG. 14 shows an overview of a multifunctional mixed nanowire thin film. The figure shows that all different functions obtained in current nanoelectronic research can be flexibly integrated together on a single macroelectronic substrate.

These results coupled with an improvement in nanowire quality and uniformity, an incorporation of an intrinsic gate-dielectric and gate-electrode, improvements in deposition uniformity and density, and optimization of electrical interface technology demonstrate that DION TFTs can realize true single-crystal semiconductor performance on a lightweight flexible plastic substrate.

As a breakthrough technology, DION TFT technology can benefit from further development of materials, DION thin-films fabrication processes, and electrical interfacing and device fabrication processes. The results of these efforts will enhance the performance of DION TFT's in applications.

Synthesis of multiple high-performance nanowire materials (including n-doped silicon, p-doped silicon and n-doped InAs, InP and/or other III–V semiconductors) and fabrication of unique multi-layer core-shell structures containing a semiconducting core, a gate-dielectric inner-shell and a gate-electrode outer-shell are specific areas in which further developments will redound to the benefit of current DION TFT technology. Fundamental nanowire materials are a foundation of DION technology. A substantial knowledge base of the fabrication and functionalization of unique nanomaterials, including inorganic semiconductor nanowires already exists.

Film fabrication involves deposition technologies appropriate for the fabrication of mixed-composition DION thin-films. These include both flow-based and dry-transfer technologies. Further developments will emphasize control of film density, nanowire orientation, film uniformity, adhesion of nanowires to the film-substrate, and overall cost. Among different deposition technologies, a specific deposition technology can be identified that is compatible with the defined process flow for the complete device fabrication, and with the cost, size, and complexity requirements for devices for a distributed sensor network application (described further below). This development will leverage existing knowledge of the fabrication of low-density nanowire devices for applications such as chemical and biological sensors, and the assembly of nanowires into functional configurations.

Electrical interfacing involves processes for patterning and electrical interfacing to DION thin-films to form DION TFTs, DION Schotky diodes and other devices. Further development of these processes can leverage existing infrastructure and know-how developed for TFTs based on traditional semiconductor materials, including photo-patterning, etching, doping, ohmic contact, etc. Among different processes, a specific process can be identified such that all functionalities within the DION thin-film can be accessed using a single linear process compatible with the end application, as well as antenna and sensor deposition (described below). This development will leverage current knowledge of nanowire-based chemical and biological sensors, which includes the fabrication of high-quality and reproducible electrical contacts to single-nanowire devices.

As noted, the present invention is a revolutionary and broad-reaching technology platform for the fabrication of multifunctional high-performance macroelectronic integrated circuits on flexible plastic substrates over large-areas at low cost. This will be achieved by fabricating dense, oriented thin films of two or more different high-performance inorganic semiconductor nanowires on a single substrate. Each of these different materials can then be electrically interfaced to fabricate a variety of electronic and electro-optic devices with performance equivalent to or exceeding that of the single crystal material from which the nanowires are formed. Hundreds or thousands of nanowires can span between each pair of source and drain electrodes to produce a single crystal path across each device with thousands of independent conducting channels to ensure high carrier mobility and high current capacity. FIGS. 15A, 15B, and 15C show preliminary results for p-doped silicon nanowire thin-film transistors ($\mu \sim 100$ and on/off $\sim 10^4$). FIG. 15A shows a dark field optical image of a nanowire-TFT. FIG. 15B shows a transfer characteristic of source-to-drain current vs. source-to-drain voltage. FIG. 15C shows a transfer characteristic of source-to-drain current vs. number of nanowires within the channel.

The general approach for the fabrication of DION TFTs comprises the steps of: (1) synthesizing a batch of high-quality, single-crystal inorganic semiconductor nanowires with intrinsic gate-dielectrics and gate-electrodes incorporated into multiple shells around each wire; (2) harvesting the nanowires and suspending them in solution so they can be transferred to a desired substrate; (3) depositing the nanowires onto a desired substrate such that they form a dense monolayer (i.e., only one wire thick) thin-film with all nanowires substantially aligned in the same direction; and (4) using standard semiconductor fabrication processes to pattern, develop, etch, and metallize the source, drain, and gate electrodes to form functioning DION TFT devices with transistor channels running parallel to the direction of the aligned wires. By using nanowires that are much longer than typical macroelectronic device dimensions (100 µm NWs vs. 10 µm channel-lengths), devices can be produced wherein a large percentage of wires span the entire gap between the source and the drain electrodes. Those few nanowires that are positioned so that they only cross partway may not contribute to the conductive properties of the device since the relative resistance of coupling between nanowires is many orders of magnitude higher than the high-mobility path through a single nanowire. FIG. 16 shows a schematic of a DION TFT.

An additional attribute of this new concept of macroelectronics is that the active semiconductor material growth is separated from the final device supporting substrate. This not only enables the production of TFTs at low temperatures to be compatible with plastic substrates, but also allows the incorporation of two or more different types of semiconductors onto a single substrate. In this way, different unique functional elements can be intimately integrated together to achieve hybrid integration in a way not possible with conventional thin film technologies.

In certain aspects, the present invention employs novel nanowire materials and unique multi-layered core-shell nanowire structures to facilitate the production of multiple high-performance functionalities on a single substrate that can all be interfaced using a single linear device-fabrication process. In particular, three and four layer core-shell structures can be fabricated in which the interior core is formed from a semiconductor chosen to provide the desired electronic functionality (e.g., CMOS compatibility, RF signal processing capabilities, light emission, etc.). The first shell is an insulating dielectric layer that acts as the gate-dielectric in the final device. The outer layer is a conductive layer that acts as a conformal gate electrode around each individual wire in the final device. In the case of nanowires with III–V core materials for extreme mobility, which do not form a high-quality oxide or nitride, an intermediate layer (such as CdS) known to act as a high-quality interface between the semiconductor and the dielectric can be added. FIG. 17 shows schematics of a multi-core-shell nanowire comprising a semiconductor core, a passivation shell, an insulating gate dielectric shell, and a conducting gate shell.

The present invention includes at least three separate functionalities in DION thin-films by synthesizing three different nanowire materials: (1) high performance p-doped silicon (or SiGe) for PMOS circuits, (2) high-performance n-doped silicon (or SiGe) for NMOS circuits, and (3) extreme mobility n-doped III–V materials (e.g., InAs or InP) for RF signal processing. Low power CMOS devices can also be realized by combining the nanowire materials for the PMOS and NMOS circuits. Additional materials, such as electroluminescent nanowires, piezoelectric nanowires, or photovoltaic nanowires can also be integrated into these films.

The fabrication of CMOS circuits and high-speed, high-frequency DION electronics for RF signal processing is of particular interest as neither of these functionalities is available today at any cost on flexible plastic using traditional technologies. CMOS circuits offer superior performance and power-consumption for digital logic as compared with either NMOS or PMOS alone). Furthermore, CMOS technology is pervasive in modern electronic systems. Incorporation of extreme-mobility III–V semiconductor nanowires into mixed-composition DION films can facilitate low-cost RF signal processing, on the same monolithic substrate, for power collection and active transmission and reception. Both of these functionalities are critical for a variety of applications, and specifically for distributed RF sensor networks.

There are several key technical abilities for fabricating the materials for using DION TFTs in distributed RF sensor networks. In particular, DION thin-film technology leverages previous work in nanowire electronics that demonstrated the feasibility of making extremely high-quality nanowire materials. However, these feasibility studies have focused on single rather than multiple nanowire devices. In the case of single-wire devices, wire-to-wire uniformity is not a concern, as each device only samples a single nanowire. Wire-to-wire uniformity is important for DION thin-film technology. Additionally, distributed RF sensor networks require a substantial amount of nanowire material to coat surfaces to realize electronics fabrication over an area of 4 ft². Thus, nanowire material needs to be fabricated on a relatively large scale.

An electronic device is only as useful as the material from which it is made. The devices fabricated from DION thin-films require high homogeneity within and between the nanowires that make up the underlying thin-film semiconductor. In this case, this uniformity arises when each device samples a homogeneous ensemble average of the nanowires within a batch (i.e., on average, each device contains the same number and composition of nanowires). Achieving this true ensemble sampling within each device can be achieved by increasing the number of wires per device (in terms of the density of the nanowires or the size of the device) or by decreasing the variance in wire-to-wire uniformity (in terms of overall properties). Since practical limits exist for the maximum size of even a "macroelectronic" device (e.g., due to capacitive charging rates) the uniformity of the nanowires and of the deposition process should be optimized.

Synthetic process of nanowires should satisfy four conditions: (1) it should be flexible enough to permit the synthesis of nanowires from a number of different semiconductor compositions and dopant compositions and concentrations, (2) it should be computer controlled and standardized to eliminate user-to-user and batch-to-batch variability between samples, (3) it should be able to produce nanowires with uniform electronic properties in the quantities needed for nanowire-based, large-area devices (i.e., capable of producing at least milligrams of material per batch), and (4) it should be inherently scalable.

The process should allow the precise control of all major physical parameters of the nanowires (e.g., length, diameter, composition and dopant composition/concentration) both from wire to wire and from batch to batch. This can be realized by outfitting a manual synthetic process into a standard computer controlled, commercial CVD oven. The processes can facilitate the incorporation of different semiconductor materials and dopants (e.g., n-doped silicon or n-doped InAs). Using this system, materials synthesis can be optimized to produce nanowires with uniform electronic properties that yield macroelectronic devices with a coefficient of variation of less than 10% for all relevant electronic parameters. In addition to improved uniformity of materials, a commercial CVD furnace can facilitate scaling the production of nanowires for growth on 24 individual 4 in. wafers. This represents a 2500-fold increase in volume over the manual synthetic process and allows further scalability as this technology is commercialized.

With controlled nanowire synthesis and device fabrication/testing methods, the optimum materials for a specific macroelectronics technology can be determined by examination of the phase-space of a variety of materials. This can be done for each composition within the mixed-composition DION thin-films. Nanowire-based macroelectronic devices can have operating parameters that are quite different from single-wire-based devices. The range of materials characteristics necessary for optimum performance can be predicted through theoretical modeling, but should be confirmed by synthesizing a sufficient number of uniform nanowires to scan the parameter space of possible nanowire compositions to find the best conditions for nanowire growth.

The synthetic process can also be used to develop methods for forming intrinsic, high-quality, gate-dielectric shells on the outside of each nanowire and growing highly-doped amorphous silicon shells as gate-electrodes around the nanowire. A dielectric shell eliminates the need for an external dielectric material and can greatly simplify the device-fabrication process. In addition, since the dielectric shell is formed off the substrate in a CVD reactor, this step can be done at a high-temperature, allowing a much higher-quality dielectric to be formed without subjecting the substrate to high temperatures. A conformal gate can provide better performance than a flat-gate over these cylindrical channels. In particular, the ability to apply an electric field uniformly around each nanowire from all sides can result in much lower threshold-voltages and a steeper sub-threshold swing (since there will be no variation in gate distance from each nanowire in a device).

With adequate process control and precision, as can be achieved with a computer controlled CVD system, high-quality gate-dielectrics and intrinsic gate-electrodes on nanowires can be prepared with the necessary levels of wire-to-wire and batch-to-batch uniformity. This process can be performed and optimized for all three types of nanowire materials (described above), each requiring slight modifications to the shell configuration. In particular, an intermediate layer of CdS between the III–V core and the outer shell dielectric layer can be included.

In addition to multi-layer core-shell silicon nanowires to optimize performance in mixed-composition DION films for CMOS circuits, group III–V nanowire materials without shells may be employed for certain applications. Group IV semiconductors for CMOS, including higher-mobility SiGe nanowire cores, and III–V materials that include a multi-layer shell system and enhanced mobility can also be used. Also included in the present invention are processes for depositing DION thin films and mixed-composition DION thin-films onto an arbitrary substrate and for electrically interfacing to each region of the film. All of these steps should be performed with a specific emphasis on compatibility with roll-to-roll processing. The general process steps involved in fabricating a mixed-composition DION thin-film circuit are depicted in FIG. 18.

A variety of different potential deposition processes can be employed, depending upon the desired density, alignment, speed, maximum deposition temperature and maximum cost. Typically, such processes can be integrated into a single linear fabrication process for patterning and processing the mixed-composition DION films to allow the complete fabrication of mixed DION film devices using a single linear process that is compatible with roll-to-roll processing and fabrication. This process can be dramatically simplified (and the cost reduced) by the use of the multi-shell nanowire structures described herein, which already include the gate-dielectric and gate-electrode around each nanowire, eliminating the need for post-deposition of these layers. This process can involve patterning the DION film with photoresist, to expose the source and drain regions of the nanowires for each TFT, and etching to remove both the electrode material and the insulating layer. This leaves only the semiconductor core exposed along with a self-aligned gate inherently integrated into the transistor channel. FIG. 19 schematically shows etching of shell materials in a multi-core-shell nanowire to expose the core material for source drain contact in a nanowire TFT. The gate is an inherently integrated shell material.

Within mixed-composition thin-films, there are multiple feasible architectures that can be used to access the different materials using a single linear monolithic process. These include, among others: (1) fabricating alternating stripes of different materials on a single substrate, (2) fabricating a checkerboard pattern of different materials on a single substrate, (3) fabricating parallel and overlapping thin-films of different materials insulated from each other and etching through the film during processing to access the layers of interest for each device, and (4) fabricating a specifically designed substrate with materials deposited regionally to accommodate a specific electronic circuit design. FIG. 20 shows several possible configurations of a mixed-composition DION film. A number of approaches for deposition can be used to produce these mixed-composition DION films, including multiple channel flow, photolithographic patterning, selective chemical/biological patterning, contact-printing, color-ink-jet printing, or screen printing.

For the overall patterning and processing of the deposited DION films, three types of exemplary roll-to-roll compatible processing can be used: (1) direct-write lithography, such as screen-printing, (2) traditional TFT large-area macroelectronics photolithography, and (3) laser direct-write lithography. All of these processes are adequate to achieve sufficient circuit complexity at a low cost. Each has its own advantages and disadvantages.

Photolithography is the process-of-choice for traditional macroelectronics. It has been used for many years in the fabrication of equipment such as TFT-backplanes from a-Si for flat-panel displays. While photolithography is the most expensive option of the three identified above, it is still routinely used to fabrication TFT arrays at less than $30 per ft$^2$. The primary advantage to photolithography is that it is possible to achieve relatively high resolution features (<1 µm), which ensures sufficient circuit performance and complexity. The second advantage is that photolithography using traditional macroelectronics steppers is an extremely well developed process, which allows leveraging of the substantial expertise within the TFT industry for process development. The main disadvantage of photolithography is that it is a step-and-repeat process, such that any roll-to-roll process developed will never be truly continuous. In addition, capital equipment and operating costs for large-scale photolithography are much higher than the other two processes, which substantially increases overall startup costs.

Screen-printing for lithography has the extreme benefit of being fast and cheap. In addition, it is possible to develop a truly continuous roll-to-roll screen-printing process for depositing resist in a continuous motion. In fact, today, certain manufacturers use high-speed screen-printing to print their metal antennas across their passive RFID tags at a rate of more than 1200 ft. per hr. for a 30 in. wide web. The primary disadvantage of screen-printing is resolution. While it has been demonstrated that screen-printing can be used to generate feature sizes down to 10 microns in size, traditional high-resolution screen-printing has a resolution between 25 and 50 microns. The cost of capital equipment and operation of screen-printing is low. One advantage of a low-resolution system such as screen-printing is that it is not as affected by surface roughness or flatness of the flexible thin-film substrate material. A lower resolution lithography process can not only decrease the cost of production and increase the speed of production, but also simplify development of components to handle and position flexible substrates for high-resolution lithography. This can facilitate high yield fabrication processes.

Similar to screen-printing, a scanned laser rastered back and forth across a web traveling perpendicular to the direction of the scan is able to expose a traditional photolithographic resist in a continuous manner at a low cost and a relatively high speed. In addition, such a system allows for higher-resolution than traditional screen-printing. Laser-scanning is not as fast as screen-printing, or as high-resolution as step-and-repeat photolithography, but it is a reasonable intermediate between the two. Such systems are currently available commercially for a number of applications. They can also be used to perform contact annealing or laser activation of dopants for source-drain contacts.

The particular process employed will often depend upon the particulars of the material and application to which the material is being put. Typically, factors such as resolution, cost, speed and roll-to-roll compatibility are taken into account in selecting a process.

Vapor-deposited metal electrodes can be used to fabricate DION TFTs. Fortunately, commercial roll-to-roll metal vapor-deposition systems are readily available. The specific metal and post-processing can be determined empirically based on performance results, theoretical modeling, and an existing and extensive knowledge base in fabricating electrical contacts to single-nanowire devices. The most difficult electrical contact is the gate electrode that conformally coats around each wire to provide extreme uniformity in threshold voltage and extremely low absolute threshold voltage. Fortunately, the synthesis of the underlying multi-layer nanowire materials that are the building blocks of the DION films accounts for fabrication of the gate electrode. During processing, only a thin-layer of patterned metal is applied to the region of the gate electrode contact to make ohmic contact to the outer conductive gate electrode shell. Source and drain contacts are a different issue. In the case of mixed-composition DION thin-films containing heavily doped n- and p-doped nanowires, high-quality ohmic contacts between the metal and semiconductor can be formed directly. This is a unique capability for DION thin-films, which cannot be achieved with other materials.

Inversion-mode devices, which use lightly-doped nanowires and the gate voltage to define the majority carrier, can also be fabricated. In this case, the source and drain contact regions of each device should be post-doped before metallization. This can be done through either traditional ion-implant processes (a standard in the TFT industry) or through solution deposition of either n- or p-dopants onto exposed regions of the DION film followed by laser-activation of each region. The latter process is appealing in that it does not require any elevated temperatures and it has been successfully used in the fabrication of single-wire devices. Ion-implant processes can also be used, particularly with low-temperature process parameters.

The universal electronic substrate concept is used to produce high performance CMOS circuits by hybrid integration of different high quality p- or n-type semiconductor materials onto a single substrate at the device level. FIG. 21 schematically illustrates an example of using a mixed-composition DION thin-film to form a CMOS circuit. This hybrid integration allows arbitrarily choosing among high mobility p-type and n-type materials. These materials can be integrated together to realize a substantial improvement in performance. Hybrid integration of different semiconductor materials have been intensively researched in the bulk semiconductor materials, but only with limited success due to serious issues in lattice mismatching and process compatibility. On the other hand, nanowire thin film technology readily facilitates hybrid integration since different high quality single crystal semiconductor nanowire materials can be synthesized separately and flexibly assembled onto a single substrate over a large area.

The following technical abilities should be established in order to use DION technology to manufacture practical devices in commercial quantities: (1) synthesis of engineered multi-shell nanowires at a sufficient scale and uniformity, (2) the deposition of nanowires to form mixed-composition, dense, robust, highly-oriented thin films with a uniformity and reproducibility necessary to enable the fabrication of low-cost, high-performance, high-yield electronics, and (3) optimization of the electrical interface for both ohmic and insulated electrical contact to each device within a mixed-composition DION film (i.e., the nano-to-macro world interface). In addition, there are other technical abilities related specifically to a distributed sensor network application.

Synthesis of p- and n-channel nanowire materials with specified material parameters is included in the present invention. Of particular interest are materials such as Si, Ge, and an alloy of Si and Ge for p-channel materials since these are materials of high hole mobility. In particular, the hole mobility of ~1900 cm$^2$/V·s for Ge is highest of all semiconductors in bulk form. For n-channel materials, Si and Ge materials are also important. In addition, other high electron mobility materials including group III–V materials (e.g., InP: $\mu_e$~5000 cm$^2$/V·s, InAs: $\mu_e$~30,000 cm 2/V·s) can be used for high electron-mobility TFTs. Multi-core-shell nanowire structures can be used for modulation doping to separate dopants from the active conducting channel for ultra-high carrier mobility. The nanowire surface can also be passivated using various core-shell structures and can be furnished with an outer gate dielectrics shell and a circumferential conducting gate shell.

Silicon nanowire synthesis can be carried out using a gold nanoparticle catalyzed CVD process. Briefly, a predetermined precursor gas mixture, SiH$_4$ and B$_2$H$_6$ or PH$_3$ in He, can pass over catalyst-gold particles deposited on an oxide coated silicon substrate at a total pressure between 20 and 50 Torr while the gold nanoparticles are heated up to a temperature of about ~450° C. Upon contact with the gold nanoparticles, SiH$_4$/B$_2$H$_6$/PH$_3$ will decompose and silicon and boron (or phosphorus) atoms can diffuse into the gold nanoparticle and generate a liquid alloy droplet. As the droplet begins to saturate with these precursors, Si/B (or Si/P) atoms will precipitate out and initiate nanowire growth. By continuously supplying SiH$_4$ and B$_2$H$_6$ (or PH$_3$), nanowire growth can proceed indefinitely until the process is terminated. The quality of the nanowires is dependent on the quality of the gold nanoparticles, the diameter distribution of the gold nanoparticles, and the growth conditions, including temperature, ratio of SiH$_4$ to B$_2$H$_6$ or PH$_3$, partial pressure of the SiH$_4$, and resident time of the precursor gases in the reactor. The growth can be carried out using a computer controlled 8 in. semiconductor furnace using 4 in. silicon oxide coated silicon wafers as the substrate.

Most semiconductor materials have a significant surface state density due to dangling bonds and some trapped charges at the surface. Due to their extreme surface-to-volume ratios, nanowires are much more affected by these surface effects, which can significantly limit device performance. Methods to deal with the effects of surface states have been well developed in the semiconductor industry for traditional semiconductors. A number of strategies are used to minimize the affect of surface states, including direct thermal annealing under an inert or hydrogen/forming gas atmosphere, and annealing in hydrogen plasma followed by thermal anneal or rapid thermal annealing. Each of these processes can be done off-line, before the nanowires come into contact with the plastic substrate material.

As an alternative and general approach, a core-shell structure can be used as a generic approach to passivate any surface trapping states. In this case, the shell can be selected to be a larger bandgap material than the core so that carriers cannot penetrate the shell and are therefore electrically insulated from any surface environment. In addition, a high quality insulating passivation shell can also be employed as an integrated gate dielectric layer in TFT devices. The quality of the dielectric coating can be a key factor in determining the performance of nanowire-TFTs. In particular, the threshold voltage and leakage current can be primarily determined by the quality and thickness of the shell and the semiconductor-shell interface. It is important to balance these two parameters, by producing a defect-free shell as thin as possible.

In the case of silicon, the issue of surface passivation and gate dielectrics can be simultaneously addressed by using a high quality SiO$_2$ coating. Methods and underpinning scientific principles for high quality dielectric coating have been well established for planar single crystal silicon and, lately, for amorphous and polysilicon. Pinhole-free gate dielectrics with uniform thickness around the surface of the nanowires (which samples several distinct crystallographic directions) can also be formed. In general, methods can be categorized into direct oxidation or CVD deposition for silicon oxide dielectrics. Direct oxidation is particularly compatible with the unique structural nature of silicon nanowires.

The direct oxidation of 60 nanometer diameter silicon nanowires can be carried out in the nanowire growth furnace. After nanowire growth is terminated, the reactant gas mixture is pumped from the reaction tube, which is replenished with a mixture of oxygen (5%) and helium to a pressure between 100 mTorr and 760 Torr at a temperature below 150° C. The temperature of the furnace can then be slowly raised to between 300° C. and 800° C. The oxidation temperature, together with the ratio of oxygen to helium, the partial pressure of oxygen, and the duration of oxidation determines the thickness and the quality of the generated silicon oxide. These conditions can be optimized until a desired thickness (2–20 nm) and coating quality is obtained. (Recall that FIG. 7 illustrates a semiconductor/dielectric core-shell structure.) A slow oxidation is desired in order to minimize defects and dangling bonds which can result in trapped charges.

If pinhole defects or the inability to stop dopants from the gate from migrating into the oxide render a simple oxide layer insufficient to act as a good gate-dielectric, then direct nitridation of silicon dioxide coated nanowires can be used to generate a more stable oxynitride coating. The higher dielectric constant and lower permeability to mobile ions can make oxynitride a better gate material. Alternatively, a pure nitride layer can be formed with an even higher quality and dielectric constant. In the case of nitride or oxynitride, a plasma assisted direct nitridation method can be employed using NO or NH$_3$.

To further enhance device performance and simplify the device fabrication process, a conducting-shell surrounding the gate dielectrics can be used, which can function as a circumferential gate. For example, in the case of a Si/SiO$_2$ core-shell structure, a doped amorphous or polysilicon shell can be deposited onto the Si/SiO$_2$ core-shell nanowires to realize a circumferential gate. This can be done as an added step in the CVD reactor, following oxide or oxynitride formation. In order to ensure that the silicon electrode deposits onto the surface of the wire, rather than resulting in continued nanowire growth, the catalyst colloid should be removed prior to the gate-electrode deposition. This can be done with a metal etch of the wafer prior to silicon deposition.

Single crystal silicon nanowires offer the opportunity to produce TFTs with performance approaching that of single crystal materials. However, the ultimate performance of these materials is limited by the intrinsic properties of silicon materials. A major advantage of the nanowires of the present invention is the ability arbitrarily to incorporate any materials into final device applications. New nanowire materials can be identified and synthesized as necessary to further enhance the mobility of the materials, particularly for high-speed, high-frequency applications. Specifically, n-type materials should be synthesized since, in semiconductor materials, electron mobility is greater than hole mobility. The selection of good candidates for high electron mobility can be based on a number of bulk material properties including intrinsic electron mobility, work function, and surface properties. Surface properties are particularly important because of the large surface to volume ratio of nanowire materials. III–V group materials are particularly good candidates since they generally have high electron mobility (e.g., $\mu_e$~5000 cm$^2$/V·s for InP, and ~30,000 cm$^2$/V·s for InAs), and are currently widely used for high-speed electronics. Additionally, these materials have useful optical properties and can be used for macroelectronic LEDs and infrared (IR) detectors using a DION thin-film platform. InP nanowire materials are discussed further below. InP is an especially useful material due to its high electron mobility and its moderate surface properties. Generally, the synthetic process of the present invention can be applicable to many different materials.

A metal (e.g., gold) cluster mediated approach can be used to synthesize InP nanowires with a system as illustrated at FIG. 22. FIG. 22 shows a schematic of a generic reactor for fabrication of semiconductor nanowires. Thermal heating or pulsed laser heating can be used to generate a vapor of InP precursor from InP powder or a solid InP target. The gaseous precursor can be carried over to the substrate by a carrier gas and can react with Au colloid nanoparticles to produce nanowires in a similar way to that of silicon nanowires. The diameter of the Au colloid can be used to control the diameter of the resultant nanowires, and the growth time can be controlled to produce nanowires with a desired length. The doping can be controlled by the amount of the dopant source in the raw materials. Synthesis of InP nanowires can be further developed leveraging the existing knowledge base for the synthesis of silicon nanowires. Pressure, flow rate, and temperature can be carefully controlled to determine the material properties. The morphology and electronic properties of InP nanowires can be characterized in a similar manner to that of silicon nanowires. Co-deposition of In and P precursors, as well as dopants, can be used to achieve stoichiometric deposition.

Physical and chemical characterization is important to gauge the materials properties of synthesized nanowires, including morphologies, diameter, length, chemical compositions, and overall uniformity, and to direct further optimization of nanowire synthetic protocols. SEMs and atomic force microscopes (AFMs) can be used for characterization of the length and diameter distribution of the nanowires. High resolution TEMs can be used to measure the thickness and uniformity of the dielectric coating and the quality of the crystal lattice of individual wires. X-ray diffractometry can be used to measure overall crystal quality and orientation of the films. An EDX attached to a TEM can be used to assess the chemical composition of single-nanowires. Specific software suites have been developed for rapid physical characterization of nanowires.

Single nanowire FETs have been demonstrated. However, large manufacturing variations from device to device have delayed use of these devices in practical applications. These variations can be due to a lack of synthetic control, reliable electrical contacts, and/or large numbers of random surface trap states. Achieving reliable and controllable electrical characteristic is important for any commercial or military application of DION thin-film technology. In order to achieve a high level of control over device characteristics, the electronic properties of individual nanowires should be highly reproducible and controllable. Electronic quality control of the nanowires can be characterized and optimized using a single nanowire FET structure, since this allows for a comprehensive analysis of materials statistics (e.g., no ensemble averaging). With well-controlled electronic properties, single-nanowire TFT devices can be fabricated and characterized on different substrates including flexible plastics. This process can use methods for controllably penetrating the gate-dielectric shell in areas where source and drain electrodes are to be applied, and for potentially doping these regions to improve electrical contact. Methods for deposition of gate electrode materials that do not penetrate the gate-dielectric shell can also be used. However, this process can be risky due to the small contact area per nanowire and the high etch-resolution it requires.

Single nanowire FETs can be used to test metallization processes for use in the fabrication of DION TFTs. Single nanowire FET devices can be fabricated on a SiO$_2$/Si surface using either electron-beam lithography or photolithography. A standard lithographic platform has been developed for electrical evaluation of single nanowire devices. FIGS. 23A and 23B illustrate a standard nanowire FET testing platform. FIG. 23A shows a single dye on a 4 in. wafer containing 12 individual devices with different gate widths and lengths. By controlling the density of nanowires over these electrode pairs, single nanowire devices of different configurations can be tested. FIG. 23B shows a low-magnification of an entire wafer full of test-devices. The mask sets and processes used for this test pattern were originally developed for evaluation of single nanowire devices, but can also be used for evaluation of DION films for rapid feedback of materials performance.

Silicon substrate can be used as a global back gate, and two metal electrodes can be used as source and drain electrodes. Planar semiconductor technology can be used as a reference point for choosing an appropriate contact metal, etchant and device fabrication protocol. Prior to metallization, appropriate surface cleaning procedures can be performed to remove the dielectric shell from the nanowire surface and to ensure a good contact between the nanowire and the contact metal. Various strategies, including ion gun cleaning and hydrofluoric acid etching, can be employed to remove the surface dielectrics prior to metallization of source-drain electrodes. Different metallization recipes (e.g., Ti/Au, Ni/Au, Al, In) can be tested and optimized using either electron-beam evaporation or sputtering process. The device behavior can be characterized using a semiconductor analyzer. Various measurement configurations, including gate-dependent two-terminal measurements and four-terminal measurements, as well as electric force microscopy can be employed to characterize the device behavior. The results from the electrical test can further be used as feedback to optimize nanowire synthetic process and metallization processes until a reliable procedure is obtained. This can be the standard metallization process for the fabrication nanowire-TFTs. A single nanowire FET can also be used for nanowire qualification tests. A database can be constructed in terms of synthetic conditions and the electronic parameters of nanowires. The database can be further used to guide development of more controllable synthesis and device fabrication processes.

Because high-temperature annealing processes are not compatible with plastic substrates, direct metal contacts are preferable to p/n diode contacts, which are normally used in conventional FET or TFT fabrication processes. Different metals can be tested for different semiconductor materials based on existing knowledge in the semiconductor industry. Sufficient analysis of the work function the nanowire materials, as well as various metal candidates, can be carried out to identify the best contact metals. Particular attention can be paid to identifying a common contact metal for different nanowire materials (e.g., Si and InP nanowires) since device fabrication can be greatly simplified if a single metallization process can be used in a mixed nanowire thin film.

DION TFTs fabricated with different surface densities of nanowires can be demonstrated and characterized using a similar device structure as that of the single-naowire FETs. DION thin film can be deposited using protocols as described below. With a reliable protocol identified for the fabrication of single nanowire devices, this protocol can be applied to DION TFTs. TFT devices can be fabricated using DION thin films with different surface densities to achieve individual TFT devices with variable number of nanowires bridging the source and drain electrodes. A semiconductor analyzer can be used to characterize behavior of the devices, such as current level, on/off ratio, threshold voltage, and gate leakage current as a function of nanowire surface density. The behavior of the device can be theoretically modeled to calculate critical device parameters, including carrier mobility values. The modeling can in turn be used to direct the design of device structures to achieve desired device functions. These studies can be carried out on $SiO_2/Si$ or $Si_3N_4Si$ substrate using silicon substrate as the back gate, as this is an easy way to realize device fabrication and modeling. A reliable protocol can be formed to fabricate DION TFTs with variable nanowire surface density and controllable device behavior. Statistical analysis of a large number of devices can be used to determine the minimum density of nanowires required on a substrate for a given device feature-size to avoid the effect of statistical fluctuations in the number of connections from impacting device reproducibility.

Once optimum deposition and materials characteristics are selected for a given application, the same analysis can be performed using an independent gate electrode deposited either underneath or over the top of the nanowires between the source and drain electrodes. FIG. 24 schematically illustrates a DION thin-film transistor using a global back-gate. For testing, the silicon substrate on which films are formed can be used as the global gate. This configuration represents a fully functioning DION TFT, and can mimic the format used in the next step as the materials are transferred to plastic (for which no global back-gate can be used).

Locally-gated TFT structures can be fabricated using semiconductor/dielectric core-shell nanowires, where the dielectric shell is used as the gate dielectrics and an additional metal electrode can be employed as the gate electrode. FIG. 25 shows a schematic view of locally gated nanowire thin film transistors. This configuration can be tested to measure switching voltage, on/off ratio, leakage currents, and reproducibility. All of these tests can be done first on plastic substrate, such as polyetheretherketone (PEEK) or polyethylene terephthalate (PET). In order to achieve reliable device performance, the surface roughness of the plastic substrate should be minimized by, for example, coating with a layer of cured SU8 photoresist. Additionally, surface modification with thin oxide coatings such as SiO2 or Al2O3 can be used to improve device adhesion to the plastic surface.

Theoretically, the structure of the device can be sufficiently modeled to derive key transistor parameters, including carrier concentration and mobility, threshold voltage, on/off ratio, etc. In particular, results observed from both single-nanowire devices and DION TFTs fabricated from the same materials can be compared to completely understand the influence on wire-to-wire variations and characteristics on the ensemble device performance. The results from the electrical test and theoretical modeling can further be used as feedback to optimize nanowire synthetic, deposition, and metallization processes.

The materials and substrates described herein can be processed using a cost-effective process for the fabrication of high performance CMOS circuits on a mixed nanowire thin film by using the high quality materials described above.

Oriented nanowire arrays are important in ensuring a high-mobility conducting channel between the source and the drain of the nanowire-TFT. To obtain highly oriented nanowire thin films over a large area, a number of strategies can be used, including shear alignment, fluidic flow alignment, electrical field alignment, Langmuir-Blodgett film, and inkjet printing. Fluidic flow and shear nanowire deposition over large area substrates can generally be employed into an approach to such processing that is compatible with roll-to-roll processes. Prior to nanowire thin film deposition, generic surface modification approaches to modifying the substrate and nanowire surface are typically desirable to ensure a complementary interaction and a stable thin film formation.

Since most of the nanowire materials described herein can be terminated with a (native) silicon dioxide shell, alkyl-trimethoxysilane can generally be used to attach an alkyl chain to the nanowire. The terminal group of the alkyl chain can be controlled to yield either a hydrophobic or hydrophilic surface, or a surface with a special function group to be complementary to other function groups on a substrate. In the case of nanowires terminated with other surfaces, different chemicals can be uses when necessary. For example, for InP or CdS, the trimethoxysilane head group can be replaced with a thiol group to provide robust surface functionalization.

Surface modification can facilitate subsequent thin film deposition onto substrates like plastics. However, there is a risk that these surface groups may have detrimental effects on the electronic properties of nanowires. The impact of different shell and core-shell structures can be explored to minimize the impact of surface ligands on the electronic properties of nanowires. In addition, methods for removing the organic molecules from nanowire surfaces subsequent to nanowire thin film formation can also be employed before patterning and electrode deposition. Techniques such as oxygen plasma or ozone cleaning processes appear to be worth exploring.

The surface chemistry of the substrate material is also important and a usefully controlled parameter for proper adhesion of nanowires to the substrate surface. Since all nanowire surfaces can be terminated with an oxide shell, the surface chemistry required for the substrate is similar to that needed for the adhesion of the various nanowire materials.

Hydrophobic plastic substrates can be modified with an oxygen plasma oxidation process followed by attachment of a monolayer of 3-aminopropyl-group to the surface using 3-aminopropyltrimethoxysiline. It is also possible to modify the surface by first coating the plastic surface with a thin layer of $SiO_2$ flowed via standard $SiO_2$ surface modification chemistry. If adhesion is found to be a problem, disiloxane compounds can be used to anchor the nanowires to the surface. If necessary, these organic molecules can be removed after metallization, at which time the electrodes will pin nanowires to the substrate surface. In such an anchoring method, careful control of flocculation of the nanowires prior to deposition is required, since a chemical compound that can bind $SiO_2$ nanowires to a $SiO_2$ surface can also bind them to each other. This can be resolved by treating the substrate surface with the anchor and then removing excess prior to deposition, or by using a gate-dielectric shell that has a chemical reactivity different from that of $SiO_2$.

The fluidic flow approach has been applied to align nanowires at low-densities for nanoelectronics applications over widths of hundreds of micrometers and lengths of a few centimeters. Fluidic flow alignment can be extended to very large areas. In order to achieve alignment over large areas, a fluidic channel with a lateral dimension comparable to the substrate size should be used. The height of the channel can be controlled to be less than 500 μm so that a major portion of the nanowire solution is proximate to the substrate surface. The shear flow near the surface of the substrate can enable the alignment of the nanowire along the flow direction. Different nanowire solution concentrations and times can be used to control the nanowire surface density on the substrate. When desired, the substrate can also be functionalized to enhance the complementary interaction between the substrate and the nanowires to achieve higher surface coverage. A systematic study can be conducted to enable reproducible nanowire deposition on a surface. The surface coverage can be studied with an optical microscope and an SEM, and a rational statistical approach can be developed to quantitatively characterize the surface coverage. Density can even be monitored optically in real-time during the deposition process by imaging the scatter from the nanowires through a dark-field microscope for feedback to the flow-system. These studies can be first conducted on a glass substrate and then implemented on the plastic substrates.

Several critical issues should be noted and carefully controlled: (1) the rubber stamp poly-dimethylsiloxane (PDMS) fluidic channel used for small scale alignment may not be applicable at inch- to tens-of-inch-dimension due to the flexible nature of PDMS. To overcome this issue, a solid channel can be employed using glass or stainless steel. The perimeter of the channel can be sealed using either an O-ring or a thin layer of PDMS. (2) At such a large dimension scale, care will be required to insure that the flow across and along the whole channel is uniform. Particular attention should be paid to design of the fluidic channel entrance and outlet. Great care should also be taken to design the solution delivery scheme. A programmable pump can be used to ensure a constant solution delivery rate. Without further precautions, it is likely to deposit a much higher nanowire density in the area near the channel entrance than near the outlet, which is often observed in micro-channel fluidic alignment without careful design of the channel entrance. This density variation can largely be compensated alternatively by reversing the flow direction during the alignment process and by enhancing the interaction between nanowires and the surface of the substrate through chemical functionalization.

To achieve mixed nanowire thin films that compromise two or more types of nanowires (e.g., p- and n-type silicon nanowiress, or Si and InP nanowires). Deposition is an important step. Approaches used for single composition oriented nanowire can be leveraged and modified. In one embodiment, photolithography can be used and be followed by a multiple-step fluidic flow assembly approach to achieve a mixed nanowire thin film. In another embodiment, more complicated approaches for a single step mixed thin film deposition can be used. An example process to form a mixed nanowire thin film can include: (1) the substrate surface is patterned using photolithography with some region exposed to receive a first type of nanowire thin film and another region covered with photoresist, (2) a first type of nanowires (e.g., p-Si) is applied to the substrate using a fluidic flow approach, (3) lift-off is performed to have a substrate with some region of the surface covered with a p-Si nanowire thin film, and (4) the nanowires are anchored by depositing a gate metal. Steps (1) to (4) can be repeated to assemble a different type of nanowire (e.g., n-Si) onto a different region of the substrate surface to produce a mixed nanowire thin film.

Device fabrication over a large area is important to macroelectronic applications. There are several possible barriers to large area device fabrication, particularly on plastics. First, the device fabrication process should be carried out below the glass transition temperature ($T_g$) of the plastics. To this end, a low-temperature device fabrication process with a maximum process temperature <100° C. can be developed which is compatible with most plastic substrates. Second, there are expected issues in alignment in large area lithography due to the flexibility of the plastic substrate. This can be addressed by using a relatively rigid plastic substrate with a thickness above 1 mm. Thinner substrates can be laminated onto glass substrates during the fabrication process. When the device fabrication process is completed, the plastic substrate can be released from the glass substrate to obtain flexible electronics. Finally, to simplify the overall device fabrication process, the knowledge base of existing fabrication technology can be leveraged. Preferably, a single metal can be used to make contact to both types of nanowire thin films. Lower-cost approaches, including inkjet printing, screening printing, or scanning laser lithography, can be assessed to determine which are compatible with roll-to-roll large-volume production process.

Photolithography has been routinely used for micro- and macroelectronics fabrication. An example photolithography-based process for device fabrication on mixed nanowire thin film includes: (1) deposition of a mixed nanowire thin film, (2) formation of patterns using photolithographic processes and metallization of gate electrodes, (3) etching of a shell layer in core-shell nanowires and metallization of source and drain electrodes.

A 12-stage shift register having approximately 104 transistors can be built. A target clock speed for the shift register is 25 MHz. In order to provide this level of performance on a large-area, flexible substrate, silicon nanowires can be used in a core-shell structure. Preferably, electron and hole mobilities of, respectively, 400 $cm^2/V \cdot s$ and 200 $cm^2/V \cdot s$ can be achieved with a lower limit of, respectively, 100 $cm^2/V \cdot s$ and 100 $cm^2/V \cdot s$. Available data on single-nanowire mobilities indicate that the mobilities achievable for these silicon wires could be as high as, respectively, 1500 $cm^2/V \cdot s$ and 400 $cm^2/V \cdot s$. Based on the actual achieved mobilities with CMOS silicon DION TFTs, the resolution of lithography required to achieve a 25 MHz clock speed can be determined and a specific lithographic process (i.e., photolithography, scanning laser lithography, and jet/screen printing) can be selected. An exemplary process is described below.

In a first step, nanowires are grown in a nanowire reactor. The Very Large Scale process described above can be used to provide 80 nm diameter silicon nanowires with doping of about $10^{18}$ per cm$^3$. Subsequent thermal oxidation can reduce the diameter to approximately 60 nm and provide the bulk of the gate insulator. A two-step nitridation process can then be used to produce silicon nitride-rich diffusion barriers, which guard against threshold voltage shifts due to mobile ion penetration. This can bring the gate oxide to its final thickness of approximately 20 nm. A final synthetic step can be to grow a doped plasma enhanced chemical vapor deposition (PECVD) amorphous silicon layer around the surface of the nanowires. This provides a conformal gate contact to the gate oxide with a low barrier potential difference with the silicon channel, and hence a lower threshold voltage. The channel doping can be relatively high so that the threshold voltage will likewise be relatively high. At this point, the nanowires comprise a three-layer core-shell, with single-crystal silicon in the center, surrounded by an oxynitride gate dielectric, which in turn is coated with a doped amorphous silicon conformal gate electrode.

The nanowires can then be removed from the reactor, harvested, and deposited on a flexible PEEK plastic substrate using the deposition process described above for mixed-composition DION thin-film fabrication. Using the lithographic process described above (e.g., standard photolithography or screen-print-lithography), gate metal contacts can then be patterned and used as a mask to remove the exposed amorphous silicon. Amorphous silicon will remain only under the gate contact (i.e., this can be a self-aligned process, which can reduce lithographic complexity and cost and power consumption and increase device performance). The source and drain contact areas can then be patterned and the gate oxide can be etched off in the source and drain contact areas using a standard oxynitride etch. Ohmic contacts can be applied for the source and drain through the resist pattern using E-beam evaporation. Based on previous experience with single-nanowire electrical interfacing, only low-temperature (<150° C.) or no contact annealing should be required. Finally, the entire device can be passivated with a layer of silicon nitride. If necessary, excess nanowires can be removed at this point with a chemical wash, which would release them from the substrate in regions where they are not pinned down by the source and drain electrodes. Alternatively, excess nanowires can be etched away using a traditional silicon etch.

At mobilities of 400 cm$^2$/V·s and 200 cm$^2$/V·s for, respectively, electrons and holes, the patterning resolution should be ~5 um, with a design gate (electrical) length of ~10 μm, and sub-10 μm spaces between the gate metal and the source and drain metal. Doping of the source and drain can be self-aligned. Devices can be composed of approximately 1000 nanowires aligned in parallel to provide adequate output current to charge the interconnect lines and the gate capacitance of the next stage. These interconnect lines can be as much as 25 μm wide and 1 cm long and still achieve the desired rise and fall times. The overall device size can be approximately 250 μm wide and 10–50 μm long. Devices can be grouped into cells providing low-level functionality to the digital designer (inverters, NAND gates, etc.). These cells can be on an order of 500 μm$^2$. This allows for generous wiring alleys and yet a 100 transistor circuit will still be well under 1 cm$^2$.

The skilled artisan will appreciate that exact design rules will be dictated by the actual mobilities achieved, and could range to larger than 20 μm for DION films with mobilities of 1500 cm$^2$/V·s and 400 cm$^2$/V·s for, respectively, electrons and holes. Likewise, exact film performances will be used to define the lithographic design requirements.

Exemplary CMOS TFT Device Fabrication Process

Described below is an exemplary fabrication process for DION TFTs fabricated from high-mobility III–V materials, e.g., to achieve a mobility of greater than 1000 cm$^2$/V·s, rather than via complex circuit design. Since this material within a mixed-composition DION thin-film can be use for RF signal processing, the discussion focuses on n-channel device designs.

FIGS. 26A and 26B are, respectively, a schematic and a layout illustration of a static CMOS two-input NAND gate.

Synthesis of silicon nanowires can be further developed to achieve optimal performance. This includes development of high-k (relative permittivity) dielectrics shell materials and corresponding circumferential gate shell deposition. III–V group high electron mobility materials can also be further developed, particularly with regards to an advanced core-shell structure for surface passivation, gate dielectrics, circumferential gates, and modulation doping.

Silicon nanowire growth can be optimized to further enhance performance. Higher mobility SiGe alloy materials can also be developed, if even higher carrier mobility is required. Specifically, $Si_{1-x}Ge_x$ and Ge nanowires can be produced. An Au colloid catalyzed chemical vapor growth approach with a mixture of $SiH_4$ and $GeH_4$ or $GeH_4$ as the reactant source and $B_2H_6$ or $PH_3$ as the dopant source can be used to grow $Si_{1-x}Ge_x$ or Ge nanowires. Existing knowledge of the CVD process for $Si_{1-x}Ge_x$ thin film and experiences with silicon nanowire growth can be leveraged to optimize the growth conditions for and achieve high quality $Si_xGe_{1-x}$ or Ge nanowires. The resulting materials can be fully characterized and carefully analyzed with various microscopic (e.g., SEM, TEM, etc.) techniques, and electrical transport properties can also be thoroughly tested and optimized.

A Si/SiO$_2$ core-shell structure for silicon nanowire surface passivation and gate dielectrics has already been developed. Either direct thermal oxidation or CVD deposition of SiO2 onto silicon nanowires can produce the shell structure. For $Si_{1-x}Ge_x$ or Ge nanowires, this experience in Si/SiO$_2$ core-shell structures can be exploited. In the case of SiGe nanowires, core shell-structures can better be produced by CVD depositing a pure SiO$_2$ shell, rather than direct thermal oxidation of $Si_{1-x}Ge_x$ nanowires. Direct oxidation of $Si_{1-x}Ge_x$ nanowire will likely produce a mixed SiO$_2$/GeO$_2$, which tends to have many trapping states. To produce a shell of SiO$_2$ on SiGe nanowires, SiH$_4$ and GeH$_4$ will be depleted in the reaction chamber after the nanowire growth is terminated. The furnace temperature is changed to the desired temperature for oxide deposition and a mixture of SiH$_4$ and O$_2$ is introduced into the chamber to achieve oxide deposition. The temperature, SiH$_4$ and O$_2$ partial pressures, and time can be carefully controlled to deposit an oxide shell of desired thickness. The resultant materials can be thoroughly analyzed with a TEM. The electronic properties of SiGe/SiO$_2$ nanowires can be tested in a FET structure. From those cases in which the SiGe/SiO$_2$ interface is optimized for suppressing interface trapping states, a SiGe/Si/SiO$_2$ core-shell structure can be developed. In this situation, when SiGe nanowire growth is terminated, a shell of intrinsic silicon with a controlled thickness can be epitaxially deposited on the surface of SiGe nanowires. Lastly, an outer $SiO_2$ shell can be produced using the same approached developed in $Si/SiO_2$ core-shell system.

Characterization results of silicon nanowires suggest that faceted silicon nanowires can be formed under controlled growth conditions. This knowledge can be leveraged to investigate epitaxial growth of a strained $Si_{1-x}Ge_x$ layer to further improve mobility. After termination of silicon nanowire growth, the condition of the reactor can be changed to support epitaxial growth of a thin layer of $Si_{1-x}Ge_x$. This can be followed by a thin layer of silicon, and finally of a layer of $SiO_2$ to yield a core shell structure with a silicon nanowire core, an active layer of strained $Si_{1-x}Ge_x$, a capping layer of silicon (to reduce traps), and a dielectric layer of $SiO_2$.

Thermal or laser vaporization can be used to produce III–V group nanowires, such as from InP. InP nanowires synthesized this way can be sufficient for testing and small scale device fabrication. However, this process cannot be scaled to device implementation over large areas because of the intrinsic limitations of thermal and laser evaporation processes. A pilot production scale CVD process for InP nanowires (similar to that used for growth silicon nanowires) can be used to produce nanowires at a wafer scale or larger. In this approach, $InCl_3$ (trimethyl indium) and $PH_3$ can be used as the reactant source. $SiH_4$, $H_2S$, or $H_2Se$ can be used as the dopant source. The growth temperature, partial pressure of each gas component, and overall base pressure can be adjusted to control the overall quality of the resulting nanowires. This CVD approach can also be explored for producing nanowires of other III–V materials, such as InAs. The resulting nanowires can be fully characterized using approaches similar to those described above.

High performance III–V group materials are typically limited by surface trapping states. In order to eliminate such trapping states, various core-shell structures can be developed. It has been reported that CdS is an excellent capping layer for surface passivation of InP thin films. InP/CdS core-shell structures can be implemented using two approaches. First, at the end of the InP nanowire synthesis process, the substrate temperature is lowered in order to freeze the Au/InP eutectic droplet. Then, CdS can be evaporated to uniformly coat the InP nanowire surface to achieve an InP/CdS core-shell structure. Alternatively, the InP/CdS nanowires can also be produced in a solution phase by epitaxially coating CdS onto pre-synthesized InP nanowires. This approach has been successfully implemented for InP/CdS quantum dots systems. The CdS shell in the InP/CdS structure can also be used as a gate dielectric. However, if the CdS shell is not of adequate quality for a gate insulator, an additional dielectric layer of $SiO_2$ can be further deposited using an approach similar to that described above.

To further improve the performance of nanowire-TFT devices, high-k dielectric materials can be used in the nanowire core-shell structure. High-k dielectrics (e.g., $ZrO_2$, $HfO_2$, etc.) have been actively pursued to replace $SiO_2$ as gate insulators for silicon devices. High-k gate insulators afford high capacitance without relying on ultra-small film thickness. This allows for efficient charge formation in transistor channels while reducing direct-tunneling leakage currents. To implement high-k materials in a nanowire core-shell structure, an Atomic Layer-by-layer Deposition (ALD) system is used to grow a $ZrO_2$ shell on the surface of the chosen nanowires. A $ZrCl_4$ precursor and an $H_2O$ oxidizer in a high purity $N_2$ carrier gas can be used as the reactant source. The deposition process can be carried out at a controlled temperature and base pressure to ensure a high quality $ZrO_2$ thin film. The thickness of the $ZrO_2$ layer can be characterized by a TEM.

Exploiting the quantum electronic effect in small diameter nanowires with a modulation-doped core-shell structure can produce higher electron mobility TFTs. In a manner analogous to the process of producing conventional two dimensional (2D) semiconductor superlattices and 2D electron gas, a multi-core-shell nanowire structure can be produced to separate the dopants from the active conducting channel to further enhance the carrier mobility. For example, ultra-high electron mobility can be realized in a structure comprising an intrinsic semiconductor core (e.g., GaAs), an inner-shell of a thin spacing layer (an intrinsic material of a larger bandgap, e.g., AlGaAs), and an outer-shell of a doping layer (a doped semiconductor, e.g., n-type AlGaAs). In this way, the dopants are only present in the outer shell material, separated from the active core, while the electrons can readily tunnel through the spacing layer into the active core material, which significantly reduces impurity-related scattering in the core. In addition, when the diameter of the nanowire cores are smaller than a critical value (e.g., ~20 nm for GaAs), quantum mechanical phenomena can further suppress scattering and lead to very high mobility values (e.g., theoretical calculations predict mobility up to $10^8$ $cm^2/V \cdot s$ for modulation-doped GaAs nanowires). To implement this approach, one type of nanowires is first grown using an approach similar to that described above. The catalytic activity of the end Au droplet can be terminated by suddenly changing growth conditions. A second vapor phase can then be introduced with conditions controlled to cause uniform epitaxial growth on the nanowire surface and thereby produce a core-shell structure. Such a process can be repeated many times to produce a multi-core shell structure, if desired. The doping type of the core-shell structure can be flexibly changed and controlled to obtain desired properties. Lastly, the surface of the nanowires can be terminated with various gate dielectrics as described above.

In some cases, it may be desirable to provide a nanowire structure that separates the dopants from the active conducting channel. Such a structure comprises an intrinsic semiconductor core (e.g., GaAs), an inner-shell of a thin spacing layer (an intrinsic material of a larger bandgap, e.g., AlGaAs), and an outer shell of a doping layer (a doped semiconductor, e.g., n-type AlGaAs). By separating the dopants from the active conducting channel (core) and exploiting the quantum-confinement effect, a very high carrier mobility can be realized. To further enhance the device performance of these new nanowires the surface can be coated with a conducting shell to surrounding the gate dielectric as a circumferential gate. For example, a doped amorphous or polysilicon shell can be deposited onto any nanowire surface in a way similar to that developed for $Si/SiO_2/p^+Si$ core shell nanowires as described above. Similarly, the surface of the nanowires can be coated with a thin metal layer by, for example, electro-less metal deposition.

The product of each synthetic step can be carefully studied with optical microscopy, SEM, or TEM to analyze the morphology, diameter, or length of the nanowires. EDX can be used to assess the chemical composition of the nanowires. The information can further be used as feedback to synthesis to optimize the overall procedure and achieve precise control of the material parameters.

Direct doping of nanowires during synthesis has been described with regards to including a dopant precursor gas in a reactant mixture and modulated doping by coating undoped wires with a shell containing a dopant. For these doped nanowires, a direct metal contact can be used for source and drain electrodes. However, in some cases, the metal contact may not be good enough for low-doped materials or intrinsic materials (particularly for devices that operate in the inversion mode). To this end, contact doping is another alternative. Since nanowires have a very small diameter (~20 nm) and a very high surface to volume ratio, a quick contact with a precursor and an extremely short diffusion can be sufficient to drive enough dopants into the nanowires. In general, the approach includes steps of surface cleaning, chemical absorption of a dopant precursor onto the nanowire surface, and a quick supply of the energy to drive the dopant into the nanowires. Standard surface cleaning techniques, such as wet etching, plasma etching, and heating under ultrahigh vacuum (to remove native oxides from the silicon nanowire surface) can be used. The precursor can be a gaseous material (e.g., $PH_3$ for n-doping silicon wires), and in situ generated species (e.g., a p-dopant generated by a heavily doped p-Si layer). The energy source can be a resistive heating source, such as rapid thermal processing (RTP) lamps, or a focused laser. Laser heating can also be used for contact doping on plastic substrates.

The fluidic flow approach can also be implemented in a different and more scalable version. FIG. 27 schematically illustrates a system for roll-to-roll compatible flow-based DION film deposition. The apparatus can comprise an inclined surface for mounting the substrate, a spray-bar parallel to the substrate, and a pump system to produce flow through the spray-bar. Solution is sprayed onto the surface of the substrate while the substrate is continuously moved upwards by a motor in a roll-to-roll process. Downward flowing solution can orient nanowires in the flow direction. Further alignment can be induced by rubbing the nanowires with a micro scale brush similar to the manner in which liquid crystal is oriented in an LCD manufacturing process. The motion of the substrate and the substrate inclination are tailored to produce optimum wire uniformity and density. If a very high density deposition is required, the process can be repeated. The nanowires that are not deposited remain in solution, undamaged, and can be recycled. Nanowire concentration in the effluent can be monitored and solvent can be added or removed (by evaporation) as needed. If necessary after deposition is complete, the substrate mounting surface can be heated to ensure rapid solvent evaporation. A second spray-bar can also be added to the apparatus. This second spray bar can spray pure solvent to wash away all undeposited nanowires. This can minimize the deposition, as the solution evaporates, of randomly oriented nanowires. An optimum surface chemistry of the nanowires and the substrate, as well as the deposition parameters (solvent viscosity and volatility, nanowire concentration, substrate inclination angle, spray rate, and spray bar motion profile) can be determined through an iterative process.

In certain alternative aspects, a Langmuir-Blodgett film approach can be adopted for larger scale nanowire deposition. This can provide uniform alignment over very large areas. However, the results from fluidic flow alignment can still be used for initial test of device fabrication and characterization. In order to achieve uniform alignment over large areas, a large scale assembly approach can be developed based on Langmuir-Blodgett (LB) films. Langmuir-Blodgett alignment has been used to form thin films of nanoparticles and to align nanorods. This approach can be extended to the alignment of nanowires through the incorporation of appropriate surface chemistry (as described above) to produce an oriented nanowire thin film. In this approach, the nanowires can first be functionalized and suspended in non-polar solvent. Such a non-polar nanowire suspension can then be transferred onto the surface of the water in an LB trough. At sufficiently low-densities, the nanowires form an isotropic distribution with random orientation. As the surface is compressed in one dimension, however, it becomes increasingly difficult for the nanowires to remain pointed in random directions. The nanowires can undergo a transition to a more ordered anisotropic phase with uniaxial symmetry, particularly a nematic or smectic phase.

This transition has been observed both in Monte-Carlo simulations and in real experiments in the case of alignment of thin film nanorods (having an aspect ration <10). Although the larger aspect ratio of nanowires would suggest a greater ability to align by LB, there is a risk that the length of nanowires could cause problems because they would not be able to rotate as freely to reach their lowest energy state within the film (the equivalent of a local minima). In this case, mild agitation can be incorporated to help prevent films from forming at these high-energy minima so that eventually the lowest energy aligned state is reached. In addition, directional capillary forces and van der Waals attractions between nanowires can be used to further enhance the parallel alignment of the nanowires and the formation of an oriented nanowire thin film. This issue can also be addressed by inducing some pre-alignment prior to surface compression. A number of strategies can also be employed to achieve this goal. For example, a flow process can be combined to achieve some pre-alignment. An electrical field can also be applied to enhance alignment of the wires.

Once aligned, the film can be further compressed to increase the degree of orientation. Then the film can be transferred onto a desired substrate. In addition to the rate at which the substrate is removed from the LB trough, the nanowire density can be controlled by the ratio of surfactants and nanowires and by the amount of surface compression. Different transfer protocols can be developed to avoid disturbing the alignment during the transferring process. The surface coverage can be characterized using an approach similar to that described above.

In other respects, printing technologies can be employed that are compatible with a large volume roll-to-roll process and that can be integrated with the overall device fabrication process. For example, a contact printing approach can include the following. First, with a printing ribbon continuously running through a nanowire solution at a controlled speed, the shear flow near the ribbon surface can align the nanowires along one direction. The surface chemistry of the nanowires and the substrate, as well as the time of duration of the ribbon in the solution, can be controlled to achieve a desired nanowire density on the ribbon. After passing through the nanowire solution, the ribbon can continue to move across the desired device substrate. Computer controlled motion van bring the ribbon and the substrate into contact. By this shearing method, the aligned nanowires can be transferred onto the substrate by controlling the electrostatic interactions or the complementary chemical interactions. This method can be programmed to directly print aligned nanowire thin film onto the substrate in a desired pattern. The substrate can be continuously fed though the system in a roll-to-roll fashion.

Various approaches can be employed for mixed nanowire thin film deposition. These include, e.g., a "multiple-layer" fashion and a "stripped or check-board pattern" format. To achieve a multiple layer mixed nanowire thin film, any of the previous approaches can be used to form a first layer of nanowire thin film. This can be followed by device fabrication on the first layer. Then a planarizing insulating layer can be deposited. This can be a polymeric material, such as SU8 resist. Next, a second layer of a different type of nanowires is aligned onto the surface of the insulating layer. Again, this can be followed by device fabrication on the second layer. In this "multi-layer" fashion, since each layer is nearly independent from the other layers, all wire deposition and device fabrication processes for each layer can be carried out using the technologies described above. Interlayer electrical connection can be done by photolithographically patterning the intermediate insulating layer to have open windows in it. This can be followed by metallization to form an inter-layer connection.

Stripped patterns of mixed nanowire thin film can be formed in a number of different ways:

A mixed nanowire thin film can be obtained by using multiple parallel channel flows such that alternating channels have different nanowire solutions flowing through them. In this approach, a mixed nanowire thin film can be obtained in a single flow process with resolution of about ~10-μm.

A mixed nanowire thin film can also be obtained with a successive electrostatic assembly process. In this process, the substrate is first patterned with a pattern array of electrodes. These can be used to apply an electric field for electrostatic assembly. To achieve a mixed film, the substrate is processed multiple times with different electrodes energized.

A mixed nanowire thin film can also be obtained by first patterning selected regions of the substrate surface with different chemical or biological functionalities. Two types of nanowires could be functionalized with different chemical/biological groups, each of which is complementary to a particular surface function on the selected area of the substrate surface. Two different nanowires could then be exposed on the substrate to achieve a mixed nanowire thin film with two different types of nanowires on different areas of the substrate surface.

A mixed nanowire thin film can also be obtained using a multiple step contact printing approach. In this approach, a patterned stamp is first made from an elastic conformal material (e.g., PDMS). The first type of nanowires is then assembled onto the stamp surface. The nanowires could then be stamped onto the device substrate to obtain the first type of nanowire thin film on a selected area of the substrate. This process can then be repeated to apply a different type of nanowire thin film on a different region of the substrate surface.

The mixed nanowire thin film can also be formed by modifying the printing approach, developed for the single composition nanowire thin film deposition process, to include a "color" printing technology. Different nanowires are considered analogous to different colors in a conventional color printer. For example, for the contact printing technology described above, the substrate is successively run below multiple ribbons with different nanowires to achieve a mixed nanowire thin film with a computer controlled pattern. This process is compatible with a roll-to-roll process.

The present invention can lead to significant increases in both complexity (greater than one thousand devices) and performance (at least 100 MHz clock rates). These improvements can be accompanied by substantial improvements in CMOS mobilities, with exemplary values for electrons and holes in an inversion-mode device of, respectively, 1000 $cm^2/V \cdot s$ and 400 $cm^2/V \cdot s$. For electrons and holes in a Ge/Si/SiO2 core-shell-shell structure with an intrinsic germanium conducting channel and a doped silicon shell to supply carriers, performance could be as high as, respectively, 3000 $cm^2/V \cdot s$ and 1500 $cm^2/V \cdot s$. The skilled artisan will appreciate that: (1) inversion-mode devices can be produced to reduce threshold voltage, (2) source and drain doping can be self-aligned to reduce output impedance, and (3) devices can be produced to have lower threshold voltages, lower power supply voltages, and reduced power dissipation.

Example Applications of Nanowire Films of the Present Invention

Numerous electronic devices and systems can incorporate semiconductor devices that use thin films of nanowires, according to embodiments of the present invention. Some example applications for the present invention are described below for illustrative purposes. The present invention is not limited to these applications. The applications described herein can include aligned or non-aligned thin films of nanowires, composite or non-composite thin films of nanowires, and can include any other nanowire or nanowire film variation(s) described above.

Lightweight Distributed Sensor Networks for Perimeter Security

An initial application is described below, namely, lightweight distributed sensor networks for perimeter security. The system can comprise multiple units of integrated macroelectronic circuits containing sensors, logic, and RF communications that are printed on lightweight, flexible plastic substrates. When distributed around a secure perimeter, each of these units can monitor its local environment for one or more stimuli. Upon detection of a specific signal, the information can be communicated back to a base station through individual sensor elements.

The basic concept is to fabricate a multi-functional monolithic device onto a lightweight flexible substrate that is capable of sensing one or more aspects of its environment, electronically processing that information, and transmitting it back to a base station. One or more specific sensors can be developed. The present invention can support a large variety of different sensor types. In particular, DION-based sensors can be fabricated as motion sensors, light sensors, sound sensors, etc. With the technology of the present invention, a lightweight and low-cost distributed sensor unit that can be dispersed around a secure perimeter to monitor for a variety of signals. FIG. 28 schematically illustrates the concept of a distributed sensor network of the present invention. The figure shows the components of such as system and how it would operate in a practical application.

The form-factor and cost-factor of each sensor unit enable this application. By fabricating the devices on a flexible plastic substrate, a sensor can be camouflaged (i.e., the sensor can be made to look like something that would normally be found in its surroundings, such as a leaf on a tree). By fabricating the devices at a low cost, a large number of sensors will be able to be deployed in a cost-viable manner to secure a location. This effectively realizes a low-cost network of independent sensors. In a preferred aspect, the low-cost electronic substrates can be printed onto a single lightweight flexible substrate.

This application extends the concept of "high-performance electronics distributed over a large area" to include electronics that: (1) are distributed even beyond a single substrate and (2) incorporate electrical and non-electrical interconnections between functional elements within a "mega-electronics" integrated system (i.e., large than "macroelectronics"). The technology for high-performance macroelectronics is particularly critical for a practical realization of this application. First, the cost of production should be low to allow sensor nodes to be distributed over large areas around a secure perimeter. Second, the flexible substrate allows the device to be camouflaged (e.g., cut and painted to look like a leaf, a gum wrapper, etc. that would go unnoticed in the area in which it is deposited). This approach to this type of application is very different from conventional approaches. In the past, efforts have been made to make the tags very small so that they are hard to see. Unfortunately, small size also reduces the size of the antenna, which not only reduces read range, but also dramatically complicates the design of the system. The unique form-factors enabled by DION electronics can make the sensors hard to detect not merely because they are small, but more specifically because they blend in with their environment. In addition, this technology can also be used to fabricate other unique form-factors, such as "smart" wallpaper, smart paper, smart folders, or smart anything that does not look like a sensing tag.

The distributed sensor network of the present invention can be realized by production of: (1) specific printable sensor materials, (2) printable antenna-designs compatible with the network requirements, (3) software and hardware to process the incoming information, and (4) specific multifunctional nanowire thin-film circuits capable of sensor, RF, and electonic signal processing.

In an embodiment, the distributed sensor network comprises a plurality of passive RF-sensor elements (e.g., "sensing tags"), complemented with a small number of active beacons around the secure perimeter. The active beacons provide RF power to and query the passive units and coordinate the flow of data to the base station. Optionally, the base station could be connected via internet or satellite to a central command headquarters, which could be monitoring numerous such sensor networks worldwide. FIG. 29 shows a schematic illustration of an RFID/Sensor tag system. The figure illustrates a basic circuit design of an RFID/Sensor tag system, based upon the nanowire based substrates described herein.

The circuits can receive sensor output and convert it to digital data for input to the RFID tag circuit. The output from the sensor typically is an analog signal, which is converted to a digital bit stream at a desired degree of resolution. For certain applications, the mere fact that a sensor has sensed something is sufficient. In such an application a single bit value of zero or one can be satisfactory. In another application, a 32 bit digital output could be required so that an analog-to-digital circuit can be placed at the "front end" of the tag IC and will interface with one tag IC input pad connected to the sensor. These configurations can be replicated for multiple sensors.

The circuit can receive the output of the sensor circuit and append the digital data to the tag ID memory register. This latter circuit can be placed at the "back end" of the tag ID so that it receives the digital output of the "front end" circuit and loads the data into the ID output register. The tag ID can be configured in sections such that the front part comprises a unique tag ID number, which uniquely identifies the tag, and back part includes the sensor data. If the sensor is not detecting anything, the back part will contain a string of 32 zeroes. Once the sensor has detected something, its output will be sent out along with the tag ID number. In this way, the reader will be able to determine both a sensor event and the sensor location by means of the tag ID number.

In another embodiment, the distributed sensor network comprises a collection of active RF-sensor elements powered by thin-film batteries or photovoltaic nanowire materials integrated into the multi-composition DION thin film.

This application is only one of many potential applications that can be enabled by the DION thin-film technology. In particular, the performance, cost, and ability to fabricate multifunctional electronic elements can be especially valuable in the development of systems such as lightweight, portable X-ray imagers for security applications, phased array antennas for wireless communications, radar scanners for security applications, for flexible displays, for lightweight, space-constrained electronics, and numerous other applications.

Beam-Steering of Antennas in RFID Tags

According to an application of the present invention, thin films of nanowires or nanotubes are used in radio frequency identification (RFID) tags and/or RFID tag readers to provide enhanced performance characteristics. The nanowire films of the present invention described above enable the use of beam-steering arrays in tags and/or readers. Such enhanced RFID tags can use the power of an incoming RF signal to tune the phase of the array to maximize the power of the incoming signal (i.e., effectively pointing the antenna of the tag toward the reader). Furthermore, the enhanced RFID tags are low-cost, and can receive a signal efficiently at any orientation. By focusing an antenna of a tag toward the reader, the signal transmitted by the tag is concentrated, dramatically increasing the range over which the tag can be detected. A result is that less energy is lost due to isotropic signal transmission, because the tag directs its transmitted signal toward the reader.

Furthermore, as a result of these enhancements, tags can receive and process information more quickly than traditional tags, dramatically increasing the read rate of a group of tags by a reader. The combination of a macro-electronic substrate with the steerable antenna in an RFID tag allows the RFID tag to communicate at any orientation relative to the reader, and from greater distances from the reader (>100 meters) than conventionally possible. Furthermore, the present invention is applicable to passive and active RFID tag types.

A reader can incorporate a nanowire-enabled beam-steering array to provide similar performance enhancements. A beam-steering array incorporated into a reader can focus an antenna of the reader towards a transmitting tag to detect the tag at any orientation relative to the reader, and to increase the range over which the tag can be detected. As a result of this, the reader will be able to process greater numbers of tags more quickly. Furthermore, a major reduction in interference from nearby tags can be achieved. This is because tags tend to be located in different locations, and the antenna will tend to be focused on fewer tags, such as a single tag, at any one time.

The following subsection describes an example RFID tag and reader environment incorporating a nanowire-enabled beam-steering array of the present invention. The subsequent subsection provides further detail of nanowire-enabled beam-steering arrays, followed by a subsection describing nanowire-enabled adjustable phase delay embodiments that, can be incorporated into a beam-steering array and other devices.

RFID Tag and Reader Embodiments Incorporating a Nanowire-Enabled Beam-Steering Array FIG. 30 illustrates a RFID communications environment 3000, according to an example embodiment of the present invention. In environment 3000, reader 3002 communicates with one or more tags 3004, shown for example in FIG. 30 as tags 3004a–3004c. While three tags 3004a–3004c are shown in FIG. 30 for illustrative purposes, environment 3000 can include any number of tags 3004, including hundreds, thousands, and even greater numbers.

Tags 3004 are typically affixed to items that are to be monitored. The presence of a tag 3004, and therefore the presence of the item or object to which the tag 3004 is affixed, can be checked and monitored by reader 3002. Reader 3004 monitors the existence and location of the items having tags 3004 affixed thereto through wireless interrogations. Typically, each tag 3004 has a unique identification number that reader 3002 uses to identify the particular tag 3004 and the respective item.

For example, as shown in FIG. 30, reader 3002 transmits an interrogation 3006 to a group of tags 3004, typically at a radio frequency. Interrogation 3006 is received by one or more tags of the group, such as by tags 3004a–3004c. Each of tags 3004a–3004c individually process the received interrogation 3006, and may respond if appropriate. As shown in FIG. 30, tags 3004a–3004c can transmit respective responses 3008a–3008c. Readers 3002 and tags 3004 can communicate according to a variety of protocols that would be known by persons skilled in the relevant art(s).

FIGS. 31A and 31B illustrate block diagrams showing detailed example configurations for tag 3004 and reader 3002, respectively, according to embodiments of the present invention. The configurations of tag 3004 and reader 3002 shown in FIGS. 31A and 31B are provided for illustrative purposes. The present invention is applicable to other tag and reader configurations, and other communication environments, as would be understood by persons skilled in the relevant art(s). For example, in one environment, tags 3004 include beam-steering functionality, while readers 3002 do not. In another environment, tags 3004 do not include beam-steering functionality, while readers 3002 do include beam-steering functionality. In still another environment, both tags 3004 and readers 3002 include beam-steering functionality.

As shown in FIG. 31A, tag 3004 includes an antenna 3102, a transceiver 3104, a storage 3106, a beam-steering array 3108, and a tag controller 3110. Tag 3004 further includes a substrate 3118 on which these components are mounted, attached, printed, or otherwise formed. The components of tag 3004 can include any electronic hardware, software, and/or firmware as necessary. Note that as is further described below, in an alternative embodiment, beam-steering array 3108 can perform the functions of antenna 3102. Thus, in such an embodiment, antenna 3102 may not be necessary.

Antenna 3102 is used to receive and transmit EM signals, such as interrogation 3006 and response 3008a, respectively. Antenna 3102 can be any type of antenna appropriate for use in an RFID tag.

Transceiver 3104 is coupled to antenna 3102. Transceiver 3104 can be any type of transceiver, or combination of receiver and transmitter appropriate for use in an RFID tag. Transceiver 3104 performs frequency down-conversion and/or de-modulation of an EM signal received by antenna 3102, as needed, and outputs an information signal 3114 to tag controller 3110. Furthermore, transceiver 3104 receives information signal 3114 from tag controller 3110, and performs modulation and/or frequency up-conversion of information signal 3114 as required by RFID tag 3004. The up-converted signal is transmitted by antenna 3102.

Tag controller 3110 controls operation of tag 3004. Tag controller 3110 can include any hardware, software, firmware, or any combination thereof necessary to perform its functions. For example, tag controller 3110 and storage 3106 can be present in an application specific integrated circuit (ASIC). Tag controller 3110 processes information signal 3114 when received from transceiver 3104. For example, tag controller 3110 processes information signal 3114 to determine whether a received interrogation 3006 is directed at the respective tag 3004, and generates an appropriate response. Tag controller 3110 outputs the generated response to transceiver 3104.

Storage 3106 can store information related to tag 3004, including an identification number. Tag controller 3110 accesses storage 3106 to determine the stored information. Tag controller 3110 can use the stored identification number to determine whether an interrogation 3006 is directed to the respective tag 3004. Storage 3106 can be read-only storage (e.g., a read-only memory (ROM) device), or can also be write-capable for storing additional information.

As shown in FIG. 31A, tag 3004 includes beam-steering array 3108. In an embodiment, an EM signal transmitted from antenna 3102 meets, encounters, impinges upon, or is otherwise received by beam-steering array 3108. For example, antenna 3102 can transmit the EM signal directly toward beam-steering array 3108, or antenna 3102 can isotropically transmit the EM signal to reach beam-steering array 3108. Beam-steering array 3108 re-directs the EM signal as directed by tag controller 3110.

Note that in an alternative embodiment, as is further described below, beam-steering array 3108 additionally performs the function of antenna 3102. In such an embodiment, antenna 3102 is not necessary. Thus, as shown in FIG. 31A, transceiver 3104 can optionally be directly coupled to beam steering array 3108 via link 3120, and beam-steering array 3108 transmits the EM signal directly.

Tag controller 3110 includes an array controller 3112 portion that controls beam-steering array 3108. Array controller 3112 generates an array control signal 3116 that is received by beam-steering array 3108. Array control signal 3116 can be a serial signal, or a parallel signal bus. Array control signal 3116 controls a plurality of phase-adjustment elements of beam-steering array 3108 to control re-direction of the EM signal transmitted by antenna 3102, or control direction of the EM signal transmitted by an array of antenna elements of beam-steering array 3108. Array controller 3112 can cause beam-steering array 3108 to direct or re-direct the EM signal by directing the EM signal in any direction, by focusing the EM signal, by spreading the EM signal, and by performing any combination thereof.

In a similar fashion, when tag 3004 is in a receiving mode, beam-steering array 3108 can direct its array of antenna elements towards an incoming EM signal. In an embodiment, array controller 3112 controls the plurality of phase-adjustment elements of beam-steering array 3108 to receive or to control re-direction of the EM signal transmitted by reader 3002. For example, beam-steering array 3108 can re-direct an EM signal received from reader 3002 at any direction towards antenna 3102, or can directly receive the EM signal from reader 3002.

In an embodiment, array controller 3112 includes a scanning algorithm. The scanning algorithm can be used to scan for an optimal direction in which the EM signal broadcast by reader 3002 is strongest, in effect, directing beam-steering array 3108 toward the reader 3002. Thus, signal reception by tag 3004 is improved. Such scanning algorithms will be apparent to persons skilled in the relevant art(s) from the teachings herein. Once this optimal direction is determined, tag 3004 can direct its resulting response 3008 toward reader 3002. Thus, the response by tag 3004 is more likely to be received by reader 3002, and tag 3004 can transmit from further distances because the transmitted response 3008 is concentrated.

FIG. 31B illustrates a block diagram for reader 3002, according to an example embodiment of the present invention. As shown in FIG. 31B, reader 3002 includes an antenna 3122, a transceiver 3124, beam-steering array 3108, and reader controller 3130. These components of reader 3002 have a similar function to the corresponding components of tag 3004. Transceiver 3124 is coupled to reader controller 3130 by an information signal 3134. Beam-steering array 3108 is coupled to reader controller 3130 by an array control signal 3136. Note that reader 3002 can be a handheld or non-handheld unit. Furthermore, in an embodiment, reader 3002 is coupled to a network or computer system by a wireless or wired communication link 3150.

Reader controller 3130 includes an array controller 3132, which is similar to array controller 3112 of tag 3004. In a transmit mode for reader 3002, array controller 3132 controls a plurality of phase-adjustment elements of beam-steering array 3108 to control re-direction of an EM signal transmitted by antenna 3122. For example, the EM signal can be directed towards a particular tag 3004, or group of tags 3004. Furthermore, when reader 3002 is in a receive mode, array controller 3132 controls the plurality of phase-adjustment elements of beam-steering array 3108 in reader 3002 to re-direct an EM signal being received from a tag 3004 towards antenna 3122 of reader 3002.

Alternatively, as described above for tag 3004, beam-steering array 3108 of reader 3002 additionally performs the function of antenna 3122, so that antenna 3122 is not required to be present. Array controller 3132 can control the plurality of phase-adjustment elements of beam-steering array 3108 to control a transmit and a receive direction for the plurality of antenna elements. Thus, as shown in FIG. 31B, transceiver 3124 can optionally be directly coupled to beam steering array 3108 via link 3140.

Note that in an embodiment, array controller 3132 can include a scanning algorithm similar to that of array controller 3112 (shown in FIG. 31A). For example, the scanning algorithm can be used to find the direction in which an EM signal broadcast by a tag 3004 is strongest, in effect, directing beam-steering array 3108 of reader 3002 toward the broadcasting tag 3004.

A variety of embodiments for beam-steering array 3108 are possible, and are within the scope and spirit of the present invention. Furthermore, in embodiments, beam-steering array 3108 incorporates thin films of nanowires. The thin films of nanowires enable phase adjustment functionality of beam-steering array 3108. The following subsections describe example detailed embodiments for beam-steering array 3108.

Beam-Steering Array Embodiments

Embodiments for beam-steering array 3108 are described in this section. As described above, beam-steering array 3108 allows directing an EM signal in any any direction, focusing the EM signal, spreading the EM signal, and any combination thereof. The thin films of nanowires of the present invention are incorporated into beam-steering array 3108 to enable phase adjustment functionality, as further described below. Note that the present invention is applicable to all types of beam-steering arrays, including reflector types and multi-antenna element array types. For illustrative purposes, reflector types and multi-antenna element array types are described in the subsections below. However, it is to be understood that the present invention is also applicable to other types of beam-steering arrays.

Reflector-Type Beam-Steering Array Embodiments

This subsection describes example beam-steering arrays that operate as a beam reflector. Although the following description shows particular reflector configurations for illustrative purposes, it is to be understood that the nanowire technology described herein is applicable to any type of beam reflector, and such beam reflectors are within the scope and spirit of the present invention.

FIG. 57 shows an example beam-steering reflector 5700 operating in a transmitting mode. An antenna 5702 (shown as a horn antenna for illustrative purposes) transmits an EM signal 5704 that arrives at beam-steering reflector 5700. Beam-steering reflector 5700 re-directs EM signal 5704, shown as re-directed EM signal 5706. Note that in a receiving mode, beam-steering reflector 5700 operates in an analogous manner.

Beam-steering reflector 5700 shown in FIG. 57 is a reflector-type variation of beam-steering array 3108, and is based on the concept of frequency-selective surfaces (FSSs). Tunable FSSs are the basis for beam-steering reflector 5700. FSSs have the ability to reflect RF signals with a predetermined phase ($\phi$). Furthermore, an FSS can be fabricated in thin printed-circuit-like systems. By configuring the FSS to be tunable, the phase $\phi$ of the FSS can be con-trolled. For example, beam-steering reflector 5700 includes a plurality of cells forming a substantially flat surface 5710. By configuring each cell of surface 5710 to be controlled independently, $\phi$ profiles, or contours, can be imparted onto surface 5710 of beam-steering reflector 5700. As such, a substantially flat surface 5710 of beam-steering reflector 5700 can have characteristics similar to a parabolic reflector, without the disadvantage of the space required by a three-dimensional (3D) surface. Surface 5710 can further be tuned or adjusted, making beam-steering reflector 5700 steerable. Furthermore, beam-steering reflector 5700 does not require moving parts to be steerable.

Sheets of a material displaying the properties of a perfect magnetic conductor (PMC) can be used as an FSS to enable beam-steering reflector 5700. Such PMC surfaces can include doubly periodic, resonant electrical LC (inductance-capacitance) circuits, the behavior of which at resonance approximates that of a theoretical PMC. Thus, such PMC surfaces have properties frequency-dependent, and are therefore suitable as a FSS.

Tunable-phase PMC surfaces have an embedded inductance L or capacitance C that is electrically adjustable. Based upon conventional assembly techniques, these surfaces allow electrical manipulation of the surface's resonant frequency ($f_r$) and hence adjustment of the surface's $\phi$. Due to the cost and limitations of the present manufacturing techniques, these surfaces have been very limited in size, only 3"×6"(7.6×15.2 cm), and have been suitable only as concept demonstrations in on-the-bench tests. The macroelectronics of the present invention, including thin films of nanowires on large area substrates, allow the fabrication of useful sizes of tunable FSS reflector for beam-steering reflector 5700.

FIG. 33 shows a view of surface 5710 of an example beam-steering reflector 5700. As shown in FIG. 33, beam-steering reflector 5700 includes a plurality of cells 3302, including cells 3302a–3302c. Cells 3302 of beam-steering reflector 5700 are each resonant. Furthermore, according to the present invention, each resonant cell of the plurality of cells 3302 of beam-steering reflector 5700 can be configured to be individually tunable. Hence, different areas of surface 5710 of beam-steering reflector 5700 can be made to have different reflection phases. By configuring beam-steering reflector 5700 to have a non-uniform reflection phase characteristic, a reflected beam can be focused, spread, or steered as desired.

FIG. 34 shows a cross-sectional view of an example, fixed-frequency PMC structure 3400. Three cells 3302a–3302c are shown in the example of FIG. 34. FIG. 35 shows a perspective view of a portion of PMC structure 3400, having a 2×2 array of cells 3302a, 3302b, 3302d, and 3302e. As shown in FIG. 34, PMC structure 3400 includes a first electrically conductive layer 3402, a second electrically conductive layer 3404, and a dielectric layer 3406. Dielectric layer 3406 is positioned between first and second electrically conductive layers 3402 and 3404.

First and second electrically conductive layers 3402 and 3404 can be any electrically conductive material, including a metal such as copper or aluminum, or a combination of metals/alloy. Dielectric layer 3406 can be any electrical insulator, and can be selected to enhance an inductance and/or capacitance characteristic of a cell 3302. Second electrically conductive layer 3404 is typically coupled to a ground or other reference potential. PMC structure 3400 can be fabricated using standard two-layer printed-circuit-board (PCB) manufacturing techniques, for example.

As shown in FIG. 34, each cell 3302 includes a "patch" or portion 3410 of first electrically conductive layer 3402 that is separate from other portions 3410. As shown in FIG. 35, portions 3410 can be substantially rectangular, although they can have other shapes, alternatively. Furthermore, each cell 3302 includes an electrically conductive via 3412 formed therethrough that electrically couples the respective portion 3410 to second electrically conductive layer 3404. Each portion 3410 and corresponding via 3412 forms a thumbtack-like structure on second electrically conductive layer 3404.

FIG. 36 illustrates an inductance and capacitance involved in a resonance of cells 3302a and 3302b of a portion of PMC structure 3400. The resonance within PMC structure 3400 allows for the beam-steering function of beam-steering reflector 5700. The resonance occurs because of a capacitance, C, and an inductance, L. Capacitance C exists between each portion 3410 and the ground plane (or other reference potential) of electrically conductive layer 3404. Inductance L exists due to each portion 3410, a corresponding via 3412, and the ground-plane (or other reference potential plane) of second electrically conductive layer 3404. Thus, capacitance C and inductance L contribute to a resonant frequency, $f_r$, of a cell 3302. An incident EM signal wave impinging on fixed-frequency PMC structure 3400 will be reflected in-phase if it has a frequency of the resonant frequency, $f_r$, of the FSS. An incident EM signal wave impinging on PMC structure 3400 with frequency f will be reflected with varying amounts of $\phi$, if it is off-frequency ($f \neq f_r$), approaching 180° if far from resonance frequency $f_r$ ($f << f_r$ or $f >> f_r$). For illustrative purposes, FIG. 37 shows a schematic view of a transmission-line equivalent model 3700 of any one pair of cells 3302 of fixed-frequency PMC structure 3400.

Using microwave analysis techniques, it can be shown how PMC structure 3400 shown in FIG. 36 displays the properties of a PMC, that is, having $\phi=0°$. FIG. 40 shows a plot 4000 of a curve 4010 representing $\phi(f)$, or reflection coefficient phase versus frequency. Curve 4010 shows values for $\phi$ ranging between ±180°. An example PMC operating range 4002 for $\phi$ between ±90° is also shown (although the present invention can have other ranges for $\phi$). As shown in FIG. 40, range 4002 is relatively narrow. By adjusting the resonant frequency $f_r$ of a cell 3302, curve 4010 can be made to "slide" left or right. This causes an operating point (i.e., a $\phi$ value at a particular operating frequency) to move upwards, i.e., towards +90°, or downwards, i.e., towards −90°, in phase, thus providing phase control.

To accomplish phase control in this manner, and to create a phase-adjustable and phase-conformal surface, either the capacitor value C, the inductor value L, or both C and L must be adjusted. For example, these values can be adjusted electronically. To accomplish this, large areas are required in the beam-steering reflectors to mount the required electrical components. Furthermore, high electronic performance is required for the necessary RF processing. The large-area macroelectronic substrate of the present invention, incorporating films of nanowires, provides these capabilities.

PMC structure 3400 can be configured to be tunable, according to the present invention, to form beam-steering reflector 5700. To configure PMC structure 3400 as beam-steering reflector 5700, the resonant frequency $f_r$ (and hence the $\phi$ at a particular f) of the FSS cells 3302 of PMC structure 3400 must be configured to be actively controllable. In an embodiment, analog or continuous phase-adjustment of cells 3302 can be accomplished by incorporating active loads, such as variable-C varactor diodes or L transformations of tunable elements through transistors. In another embodiment, discrete phase-adjustment of cells 3302 can be accomplished by switching reactive components having various values in and out of the resonant circuit of cells 3302.

FIG. 38 shows a cross-sectional portion of a beam-steering reflector 5700, where active phase-adjustment elements are coupled to a PMC structure to provide discrete tunability, according to an example embodiment of the present invention. In the embodiment of FIG. 38, a tunable beam-steering array structure is created by coupling a circuit to each cell that can be discretely tuned with various L values (and/or C values). As shown in FIG. 38, cells 3302 are similar to those shown in FIG. 34. However, in FIG. 38, each cell 3302 includes an electrically conductive via 3802 having a first end coupled to portion 3410, and a second end 3804 extending through an opening 3806 in second electrically conductive layer 3404. Furthermore, for each cell 3302, a pair of inductors 3810a and 3810b are coupled between second end 3804 of via 3802 and second conductive layer 3404 through a corresponding switch 3830a and 3830b, respectively. Inductors 3810 operate as phase-adjustment elements for cells 3302. Selective control of switches 3830 allow inductors 3810 to be discretely coupled to cells 3302 to provide adjustment of the resonant frequency of cells 3302, thus providing tunability to beam-steering reflector 5700. FIG. 39 shows a schematic view of a transmission-line equivalent model 3900 of any one pair of cells 3302 of beam-steering reflector 5700. Note that FIG. 39 shows an adjustable inductor L, which can be adjusted by switching in different valued inductors, or by varying a length of an inductor, or by other techniques described elsewhere herein, or otherwise known.

Note that although the example of FIG. 38 shows two inductors 3810a and 3810b for each cell 3302, the present invention is adapted for tuning cells with any number of inductors 3810 and corresponding switches 3830, including greater numbers of inductors and switches. Furthermore, other circuit component types than inductors can be used as phase-adjustment elements for cells 3302, including capacitors.

According to embodiments of the present invention, the function of switches 3830 is provided by nanowire-based devices. Such nanowire-based devices include diode or field effect transistor (FET) types. In the embodiments described herein, each of cells 3302 incorporate one full set of adjustment controls to maximize tunability and phase-control flexibility. Note that in alternative embodiments, not every cell 3302 requires phase control. Thus in some embodiments, every other cell 3302, or other multiples of cells 3302, will include phase adjustment control.

In embodiments, cells 3302 are approximately 5–10 mm in length/width, although they can have other sizes. Thus, it is impractical to mount standard packaged commercial devices to cells 3302. For example, FIG. 41 shows a scale drawing where three conventional inductors 4102*a*–4102*c* and corresponding switches 4104*a*–4104*c* are mounted to a cell 3302. The components used are commercial-off-the-shelf (COTS) technology. Inductors 4102*a*–4102*c* are shown as commercially available 0603 inductors, and switches 4104*a*–4104*c* are shown as commercially available SOT-23 FETs. Note that because of the sizes of the components present in the COTS example of FIG. 41, little free area exists on cell 3302. Furthermore, additional circuit components required for RF bypassing, filtering, and bias control, are not present on cell 3302. Thus, a practical three-switched inductor implementation using commercially available components is difficult to implement.

FIG. 42 shows a scale drawing of a cell 3302 that mounts a nanowire-based phase-adjustment circuit 4200, according to an embodiment of the present invention. In FIG. 42, phase-adjustment circuit 4200 includes phase adjustment elements 4202*a*–4202*c* and nanowire-based transistors 4204*a*–4204*c*. In the example of FIG. 42, phase adjustment elements 4202*a*–4202*c* are shown as microstrip inductors. In FIG. 42, a significant amount of free space is available on cell 3302. Space exists on cell 3302 in FIG. 42 to add additional components required for a practical design. Thus, as shown by a comparison of FIGS. 41 and 42, the use of nanowire-based transistors 4204 enable the implementation of practical tunable cells 3302.

FIG. 43 shows an expanded view showing further detail of example nanowire-based transistor 4204*a*, according to an embodiment of the present invention. Nanowire-based transistor 4204*a* is formed by a film of nanowires, in a similar fashion as described above for semiconductor device 1100 shown in FIG. 11, or other nanowire-based transistors described elsewhere herein. For example, as shown in FIG. 43, nanowire-based transistor 4204*a* includes a drain contact 4302*a*, a gate contact 4206*a*, a source contact 4304*a*, and a thin film of nanowires 4320. Thin film of nanowires 4320 can be formed or patterned as described above for thin film of nanowires 1000 shown in FIG. 10, or as described elsewhere herein. The nanowires of thin film of nanowires 4320 can be aligned or non-aligned, can include a polymer if required, and can include any other variation described herein. Thin film of nanowires 4320 operates as a "channel" for nanowire-based transistor 4204*a*, and can be P-doped, N-doped, or a combination of P- and N-doping, depending on the desired characteristics for nanowire-based transistor 4204*a*.

As shown in FIG. 43, thin film of nanowires 4320 has a length greater than a length 4310. Length 4310 is substantially equal to a distance between drain contact 4302*a* and source contact 4304*a*. Thus, the length of thin film of nanowires 4320 is enough for thin film of nanowires 4320 to adhere to, and make sufficient electrical contact with drain contact 4302*a* and source contact 4304*a* for nanowire-based transistor 4204*a* to operate. Nanowires of thin film of nanowires 4320 may be formed or selected to have a length of length 4310 or greater, or may have other lengths.

As shown in FIG. 42, the relatively small sizes of nanowire-based transistors 4204 leaves a large area on cell 3302 for placement of phase-adjustment elements 4202, such as the microstrip inductors shown, and for other required components. Thus, greater numbers of phase-adjustments elements may be mounted on cell 3302 to provide greater degrees of phase adjustment, and therefore, a greater degree of beam-steering control for beam-steering reflector 3200, when incorporating nanowire-based transistors 4204.

Note that integrated circuit dies containing control electronics could be attached and wire-bonded to a cell 3302 instead of using the COTS or nanowire devices. However, conventional wire-bonding machines have been designed for the manipulation of wafer-sized objects, typically 3"–6" (7.6–15.2 cm) diameter wafers. Thus, expensive retrofits to these machines would be required to build active FSSs of any size and complexity. As such, the use of nanowire-based high-performance macroelectronic substrates for cells 3302 is critical for practical implementations of beam-steering arrays.

Various processes can be used to integrate phase adjustment elements 4202 and nanowire-based transistors 4204 of nanowire-based phase-adjustment circuit 4200 in cells 3302. For illustrative purposes, example processes are described below for integrating nanowire-based phase-adjustment circuits with cells 3302. However, the present invention is not limited to these examples.

FIG. 44 shows an example embodiment for formation of a beam-steering reflector 700, where a PMC structure 4402 is formed separately from nanowire-based phase adjustment circuits 4410*a*–4410*d*, and subsequently combined. Note that PMC structure 4402 can be fabricated using conventional manufacturing techniques. Nanowire-based phase adjustment circuits 4410*a*–4410*d* are formed on a substrate 4404. Substrate 4404 can be formed from any substrate material, including KAPTON. Openings (not shown in FIG. 44) are formed in substrate 4404 to provide access to ends 3804*a* and 3804*b* of vias 3802*a* and 3802*b* for nanowire-based phase adjustment circuits 4410*a*–4410*d*. Substrate 4404 is subsequently attached to PMC structure 4402, using an adhesive material, such as an epoxy or laminate material.

Note that in an alternative embodiment, nanowire-based phase adjustment circuits can be formed directly on a PMC structure. For example, FIG. 45 shows an example where nanowire-based phase adjustment circuits are formed on PMC structure 4402. As shown in FIG. 45, an electrically insulating/dielectric material layer 4502 is applied to second electrically conductive layer 3404 of PMC structure 4402. Nanowire-based transistors can then be formed directly on dielectric material layer 4502. In the example of FIG. 45, two nanowire-based transistors are in the process of formation. As shown in FIG. 45, after applying dielectric material layer 4502 to PMC structure 4402, dielectric material layer 4502 is metallized with first and second sets of contacts 4520*a* and 4520*b*, and with vias. Phase-adjustment elements can also be applied. For example, inductors 4530*a* and 4530*b* are shown formed on dielectric material layer 4502 in FIG. 45. Inductors 4530*a* and 4530*b* can be created on dielectric material layer 4502 using microstrip or stripline techniques, as well as by applying wirewound type inductor devices.

Subsequently, as shown in FIG. 46 for a single nanowire-based transistor 4204, a thin film of nanowires 4602 is applied to dielectric material layer 4502 and bonded to contacts 4520. As shown in the example of FIG. 46, nanowires 4604 of thin film of nanowires 4602 are coated with a dielectric material 4610 to create a gate dielectric. In this manner, a plurality of nanowire-based transistors 4204 can be created. A via 4620 through dielectric material layer 4502 is shown in FIG. 46 that electrically couples a source electrode of nanowire-based transistor 4204 to second electrically conductive layer 3404 of PMC structure 4402, which typically operates as a ground or other reference potential plane.

In another embodiment for forming a beam-steering reflector 3200, thin films of nanowires can be applied to a surface, such as substrate 4404. Gate, source, and drain contacts are patterned on the thin films of nanowires. A dielectric material, such as dielectric material layer 4502, is then formed on the substrate, covering the thin films of nanowires and contacts. For example, the dielectric material can be a low-$T_p$ dielectric. Vias are drilled and conductively filled. A PMC structure can then be formed on the dielectric material. Thus, in this embodiment, the resulting thin films of nanowires are on the same surface of the substrate as the PMC structure.

Numerous other processes for forming beam-steering reflector 3200 will be apparent to persons skilled in the relevant art(s) from the teachings herein. Alternative embodiments for nanowire-based phase adjustment circuits are described in the following subsection.

Multi-Antenna Element Beam-steering Array Embodiments

This subsection describes example beam-steering arrays that incorporate a plurality of individual antenna elements. Although the following description shows particular antenna configurations for illustrative purposes, it is to be understood that the nanowire technology described herein is applicable to any type of antenna incorporating a plurality of individual antenna elements, and such antennas are within the scope and spirit of the present invention.

FIG. 47 shows an example beam-steering array 4700, according to an example embodiment of the present invention. Beam-steering array 4700 shown in FIG. 47 is a multiple antenna element variation of beam-steering array 608, shown in FIGS. 6A and 6B. As shown in FIG. 47, beam-steering array 4700 includes a plurality of antenna elements 4702a–4702n. Beam-steering array 4700 can include any number of antenna elements 4702, as required by a particular application. In the embodiment shown in FIG. 47, antenna elements 4702a–4702n are formed on a common substrate 4704. Substrate 4704 can be any substrate type suitable for mounting antenna elements, such as the substrates described elsewhere herein, or otherwise known. In alternative embodiments, antenna elements 4702a–4702n can be formed on more than one substrate, including each of antenna elements 4702a–4702n being formed on a separate substrate. In further embodiments, antenna elements 4702a–4702n may not be required to be formed on substrates at all.

Antenna elements 4702a–4702n each include a respective one of antennas 4706a–4706n, one of adjustable phase shifters 4708a–4708n, and one of antenna input/output lines 4710a–4710n. For each antenna element 4702, antenna 4706 receives and transmits a signal. Antenna input/output line 4710 conducts a signal to be transmitted to antenna 4706, and conducts a received signal from antenna 4706. Adjustable phase shifter 4708 adjusts a phase shift of the signals conducted through antenna input/output line 4710 to and from antenna 4706.

Each of antenna elements 4702a–4702n are tunable. Thus, antenna elements 4702a–4702n can be collectively used as a beam-steering array, as described above for beam-steering array 3108. For example, by adjusting a phase of signals passing through antenna input/output lines 4710a–4710n with adjustable phase shifters 4708a–4708n, a cumulative signal transmitted by antenna elements 4702a–4702n can be re-directed, including selecting a particular direction, focusing, and spreading the transmitted signal. Furthermore, adjustable phase shifters 4708a–4708n can be used to receive signals from particular directions.

Note that in an embodiment, antenna input/output lines 4710a–4710n supply the same signal to each of their respective antenna elements 4702a–4702n. In alternative embodiment, one or more of antenna input/output lines 4710a–4710n supply different signals to the respective antenna elements 4702a–4702n. For example, in such an embodiment, one or more of antenna input/output lines 4710a–4710n may supply signals phase-shifted by different amounts for transmission, so that some or all of antenna elements 4702a–4702n may not require adjustable phase shifters 4708a–4708n, and may instead have no phase shift, or have "hard-wired" phase shifts. The "hard-wired" phase shifts may be implemented using nanowire-enabled transistors, or other nanowire-enabled elements. A reflector-type beam-steering array as described above may be similarly configured.

Embodiments for adjustable phase shifter 4708 are described in the following subsection. These embodiments are provided for illustrative purposes, and are not limiting.

Adjustable Phase Shifter Embodiments

Embodiments for an adjustable or variable phase shifter that can be used as adjustable phase shifters 4708a–4708n shown in FIG. 47 are described in this subsection. The adjustable phase shifter can be used other applications than described above, including any variety of applications that require adjustable phase delays for an electrical signal. The adjustable phase shifter can be used to provide any number of phase delays, nearly approximating a continuous adjustable phase delay in some embodiments. When applied to a beam-steering array, an adjustable phase shifter can be used to provide a very fine degree of directional control for an antenna beam.

Electronically controllable variable phase shift networks are useful for many applications. At radio frequencies (e.g., above approximately 300 kHz), phase shift networks can be used in antenna beam-steering arrays, such as described above, so that each antenna element either radiates or reflects radiation with a controllable phase shift. By suitably adjusting the phase of each element of an array of antenna elements or reflectors, the antenna radiation pattern can be modified. As described above, this can be used to scan for a transmission power maximum of an antenna more rapidly than can be accomplished mechanically. This can also be used to point an antenna toward a minima (or null) direction, to eliminate an interfering signal.

Preferably, such phase shift networks are small, inexpensive, low loss, and adjustable in small increments. For some antenna designs, it is advantageous to be able to apply the phase shifter to a flexible fabric at a low temperature. Conventionally, solid state devices such as FETs, PIN diodes, and/or varactor diodes are used in adjustable phase shifters. However, these devices are fabricated on rigid semiconductor substrates. The devices are coupled to each other and to the antenna using solder or wire bonding. Furthermore, such devices frequently require additional circuit components for biasing purposes. These disadvantageous attributes increase cost, require elevated temperatures during processing, and limit the substrate types to which the devices can be attached. Amorphous transistors could possibly overcome some of these difficulties, but their performance at RF and microwave frequencies is inadequate.

The present invention discloses an adjustable phase shifter that overcomes these limitations. FIG. 48 shows a flowchart 4800 providing example steps for forming an adjustable phase shifter on a substrate, according to embodiments of the present invention. The steps of FIG. 48 do not necessarily have to occur in the order shown, as will be apparent to persons skilled in the relevant art(s) based on the teachings herein. Other structural embodiments will be apparent to persons skilled in the relevant art(s) based on the following discussion. The steps of flowchart 4800 are described in detail below.

Flowchart 4800 begins with step 4802. In step 4802, a conductor line is formed on the substrate, wherein the conductor line includes a first conductive segment and a second conductive segment. For example, FIG. 49 shows a conductor line 4902 formed on a substrate 4900. Conductor line 4902 can be any type of electrical conductor, including a metal trace or transmission line. For example, conductor line 4902 can be formed over a ground plane in a transmission line structure. Conductor line 4902 can alternatively be a microstrip, stripline, coplanar waveguide, or other conductor type. Furthermore, substrate 4900 can be any type of substrate on which conductors for electrical signals can be formed, including any type of substrate described elsewhere herein, or otherwise known. Conductor line 4902 can be formed on substrate 4900 using any conventional process.

As shown in FIG. 49, conductor line 4902 includes a first conductive segment 4904 and a second conductive segment 4906. A third conductive segment 4908 is also included in conductor line 4902, in series between first and second conductive segments 4904 and 4906. In an embodiment, first and second conductive segment 4904 and 4906 are coplanar transmission line-like strips, forming a ¼ wavelength long transmission line. Third conductive segment 4908 effectively forms an electrical short at an end of the transmission line. Such a ¼ wavelength transmission line, when shorted at one end, electrically appears as an inductor at the other end. By changing a length of the formed transmission line, as described below, the apparent inductor changes value. Thus, conductor line 4902, configured in this manner, can be used to change a phase delay of a signal, such as a signal coupled to one of antennas 4706a–4706n, shown in FIG. 47.

In step 4804, a thin film of nanowires is formed on the substrate in electrical contact with the first conductive segment and the second conductive segment. For example, FIG. 50 shows a thin film of nanowires 5002 formed on substrate 4900, according to an embodiment of the present invention. Thin film of nanowires 5002 is similar to thin film of nanowires 1000 shown in FIG. 10, for example. Thin film of nanowires 5002 can be patterned or formed, and can include any of the variations described herein for nanowires. As shown in FIG. 50, thin film of nanowires 5002 is formed to be in electrical contact with both of first and second conductive segments 4904 and 4906 of conductor line 4902.

In step 4806, a plurality of gate contacts are formed in electrical contact with the thin film of nanowires. For example, FIG. 51 shows a plurality of gates contacts 5102a–5102n formed in electrical contact with thin film of nanowires 5002, to form an adjustable phase shifter 5100, according to an embodiment of the present invention. In this manner, a plurality of nanowire-based transistors 5116a–510n are formed in thin film of nanowires 5002, each controlled by one of gate contacts 5102a–5102n. First and second conductive segments 4904 and 4906 function as common source and drain contacts for nanowire-based transistors 5110a–5110n.

Gate contacts 5102a–5102n can be formed on substrate 4900 prior to applying thin film of nanowires 5002 to substrate 4900 in step 4804, or can be formed on thin film of nanowires 5002 after step 4804. Gate contacts 5102a–5102n can be any contact type, including a conductive polymer, metal, polysilicon, or other contact type describe herein or otherwise known. Any number of gate contacts 5102 can be formed, depending on the degree of phase adjustment control desired by the particular application. The greater the number of gate contacts 5102 that are present, the greater the degree of phase control. Furthermore, a spacing of gate contacts 5102a–5102n can be uniform or non-uniform. For example, the spacing of gate contacts 5102a–5102n can be distributed in a binary weighted fashion.

Control signals are coupled to each of gate contacts 5102. Different degrees of phase shift are provided by activating various gate contacts 5102a–5102n with the control signals. Activation of each of gate contacts 5102a–5102n causes the respective nanowire-based transistor 5110 to electrically short or bypass different portions of conductor line 4902. This provides different length electrical paths through conductor line 4902, thus providing different phase delays.

In this manner, adjustable phase shifter 5100 allows a phase of an electrical signal transmitted through conductor line 4902 to be adjusted by changing a voltage applied to at least one gate contact of the plurality of gate contacts 5102a–5102n. In an antenna application, such as described above, adjustable phase shifter 5100 provides a variable inductance, therefore adjusting a reflected phase of a given antenna element of an array.

Note that conductor line 4902, gate contacts 5102, and thin film of nanowires 5002 can be formed on substrate 4900 in any order.

The nanowires of thin film of nanowires 5002 can be aligned or non-aligned. For example, FIG. 52A shows an example adjustable phase shifter 5100, having a thin film of nanowires 5002 with aligned nanowires, according to an embodiment of the present invention. FIG. 52B shows a cross-sectional view of adjustable phase shifter 5100 of FIG. 52A. The nanowires are shown aligned parallel to an axis 5202 between first and second conductive segments 4904 and 4906. Furthermore, in the embodiment shown in FIG. 52A, the nanowires of thin film of nanowires 5002 have a length approximately equal to a distance between first and second conductive segments 4904 and 4906, although in other embodiments, the nanowires can have other lengths.

Note also in FIGS. 52A and 52B, not every nanowire of thin film of nanowires 5002 is incorporated into a nanowire-based transistor 5110. In other words, not every nanowire must be in electrical contact with a gate contact 5102. For example, a nanowire 5250 shown in FIGS. 52A and 52B is such a nanowire. Nanowires of thin film of nanowires 5002 can be formed to be non-electrically conductive in at least one direction (i.e., are in an inversion mode), so that if some nanowires are not included in any nanowire-based transistor 5110, they do not affect operation of adjustable phase shifter 5100.

In an embodiment, substrate 4900 can be configured as shown in FIG. 52B. As shown in FIG. 52B, substrate 4900 includes a dielectric material layer 5260 attached to an electrically conductive layer 5270, which can function as a ground or other potential plane.

Note that in embodiments, multiple sections of nanowire films can be formed on substrate 4902 to form nanowire-based transistors 5110. For example, FIG. 53 shows a plurality of thin films of nanowires 5002a–5002n formed on substrate 4902, according to an embodiment of the present invention. Each of the plurality of thin films of nanowires 5002a–5002n is activated by a respective one of gate contacts 5102a–5102n.

In embodiments, the amount of phase delay provided by a particular nanowire-based transistor 5110 is dictated by the change in length of the electrical path through conductor line 4902 provided by the nanowire-based transistor 5110. In further embodiments, loads can be applied to conductor line 4902 to provide additional or controlled phase delay amounts. For example, circuit components such as inductors, capacitors, and resistors can be used to provide altered phase delays.

FIG. 29 shows conductor line 4902 (substrate 4900 not shown) with incorporated loads to provide phase delay, according to an example embodiment of the present invention. As shown in FIG. 54, conductor line 4902 has first and second inductors 5402a and 5402b (shown as generic inductor elements) formed therein to provide phase delays. Furthermore, conductor line 4902 has first, second, and third capacitors 5404a–5404c (shown as generic capacitor elements) coupled thereto to provide altered phase delays. FIG. 55 shows conductor line 4902 of FIG. 54, with thin films of nanowires 5002a–5002c formed thereon to form a plurality of nanowire-based transistors 5110a–5110c. A phase delay provided by activating any one or none of transistors 5110a–5110c is affected by combinations of inductors 5402a and 5402b and capacitors 5404a–5404c. In embodiments, any number of inductors, capacitors, and/or other load components can be incorporated into conductor line 4902 to provide phase delays, as needed.

As described above, nanowires of thin film of nanowires 5002 can be coated with an insulating material that functions as a gate dielectric. In an embodiment, this insulating material can be removed from the nanowires in the source and drain regions of first and second conductive segments 4904 and 4906 to provide improved electrical contact.

Note that the nanowire-based transistors can be used as either high or low impedance switches, depending on the voltage applied to gate contacts 5102. Note that most of the parasitics (capacitance to ground, capacitance to gate, etc.) are absorbed into conductor line 4902, and thus do not adversely effect the adjustable phase shifter circuit. The nanowires can be N- or P-doped, and can be configured as either an enhancement or depletion mode transistor type.

Furthermore note that nanowire-based PIN diodes and nanowire-based varactors may be alternatively used instead of the nanowire-based switches described above, as would be understood by persons skilled in the relevant art(s).

Active Acoustic Cancellation Embodiments

This subsection describes example arrays of actuators used to substantially reduce or cancel acoustic signals, such as audible noise. According to embodiments of the present invention, thin films of nanowires or nanotubes are used to enable such acoustic cancellation over large areas. Although the following description shows particular acoustic cancellation configurations for illustrative purposes, it is to be understood that the nanowire technology described herein is applicable to other types of acoustic cancellation devices, and such acoustic cancellation devices are within the scope and spirit of the present invention.

Some conventional headphones incorporate technology that monitors noise around the headphones, and transmits a pattern of acoustic waves in an attempt to substantially cancel the outside noise. The transmitted pattern of acoustic waves is transmitted with an opposite phase to that of the noise. This transmitted pattern attempts to silence the noise, making it easier to hear what is being played through the headphones. One company that manufactures such headphones is Bose Corporation, of Framington, Mass.

This technology works by receiving incoming acoustic signals, such as noise, processing the incoming signal, and calculating a complementary frequency that is out of phase with the incoming signal. The calculated frequency is sent to an actuator, which transmits a canceling acoustic signal, causing at least partial acoustic cancellation. This technology, however, is limited to small area applications, such as the headphones.

According to the present invention, it is possible to provide acoustic cancellation to a very large area by creating an array of actuators, each having a corresponding receiver and processor to calculate a cancellation response from the position of the actuator. Such a large area active acoustic cancellation system has many useful applications. For example, large area active acoustic cancellation can be used to partially or completely cancel the sound emanating from objects such as a car, a bus, or even an airplane. In example military applications, sounds from objects such as a tank or submarine can be partially or completely cancelled.

Using conventional technology, it is impractical to produce the necessary electronics over a large area to support an array of actuators. Each required processor is typically a high-performance electronic device formed from a silicon wafer. The required electronics must further supply enough power to function at acoustic frequencies and provide substantial gain to drive the actuators.

The nanowire-enabled macroelectronic materials of the present invention described herein allow the formation of a large-area circuit capable of driving an array of actuators over a large area. Furthermore, the array is lightweight, conformal, and can be applied over any structure. Still further, by incorporating piezoelectric nanowires into a macroelectronic film, it is also possible to incorporate the actuators into a single substrate with the electronics to form a truly macroelectronic integrated active acoustic cancellation system. This actuators and electronics can be applied to a flexible substrate, and the flexible substrate can be attached to an object. Alternatively, the actuators and electronics can be applied directly to the surface of the object.

FIG. 56 shows an array 5600 of cells 5602a–5602n. Each of cells 5602a–5602n includes an actuator and related electronics used for active acoustic cancellation, according to an embodiment of the present invention. Embodiments of array 5600 can include any number of cells 5602, as required by the particular application. For example, greater numbers of cells 5602 can be used to cancel noise or other sounds over larger sized objects.

FIG. 32 shows an example implementation of array 5600 of FIG. 56, being used to monitor and cancel incoming sounds, according to an embodiment of the present invention. As shown in FIG. 32, an input sound wave 3200 encounters array 5600. Input sound wave 3200 includes waves of sound, including noise. Input sound wave 3200 include a plurality of input sound wave elements 3202a–3202d, which are the portions of input sound wave 3200 received at corresponding ones of cells 5602a–5602n of array 5600. Each of cells 5602a–5602d receives and processes the corresponding one of sound wave elements 3202a–3202d. Each of cells 5602a–5602d generate and transmit a cancellation sound signal 3204a–3204c, accordingly. Each of cancellation sound signals 3204a–3204d are generated to have substantially the same frequency and opposite phase of the corresponding one of received sound wave elements 3202a–3202d, to substantially cancel the corresponding one of received sound wave elements 3202a–3202d. In this manner, input sound wave 3200 is reduced or eliminated.

FIG. 58 shows an example detailed block diagram of a cell 5602 of FIG. 56, according to an example embodiment of the present invention. Cell 5602 includes an antenna 5802, a receiver 5804, a processor 5806, an actuator interface circuit 5808, and an actuator 5810. Alternative configurations for cell 5602, including additional or alternative components than shown in FIG. 58, are applicable to the present invention.

Antenna 5802 receives a first acoustic signal, which can be a sound wave element 3202, for example. Antenna 5802 is any element that can receive sound or audio signals, and produce an electrical signal representative of the received first acoustic signal.

Receiver 5804 is coupled to antenna 5802. Receiver 5804 receives the electrical signal output by antenna 5802, and generates a signal appropriate for processing by processor 5806. For example, in an embodiment, receiver 5804 may include an analog-to-digital converter to digitize an analog electrical signal output by antenna 5802. Receiver 5804 outputs a receiver output signal 5812.

Processor 5806 is coupled to receiver 5804. Processor 5806 receives and processes receiver output signal 5812. Processor 5806 determines information regarding signal 5812. For example, in an embodiment, processor 5806 can determine a frequency present in signal 5812 and an amplitude of signal 5812. Processor 5806 also determines a phase of signal 5812. Processor 5806 then uses the determined information to determine an amplitude, a frequency, and a phase of a desired cancellation signal. Processor 5806 outputs a control signal 5814 that corresponds to an amplitude, a frequency, and a phase of the desired cancellation signal. Processor 5806 can include any hardware, software, firmware, or any combination thereof necessary to perform its functions, including an integrated circuit processor and/or digital logic.

Actuator interface circuit 5808 is coupled to processor 5806. Actuator interface circuit 5808 conditions control signal 5814 prior to being input by actuator 5810. For example, actuator interface circuit 5808 can include a digital-to-analog converter to convert signal 5814 to analog, when signal 5814 is digital. Furthermore, actuator interface circuit 5808 can include one or more amplifiers to provide required gain and current for actuator 5810. Actuator interface circuit 5808 can also include switches/relays that gate current flow to actuator 5810. As described below, in an embodiment, actuator interface circuit 5808 can include one or more nanowire-enabled transistors to control current flow to actuator 5810. Actuator interface circuit 5808 outputs actuator input signal 5816. Actuator interface circuit 5808 can include any hardware, software, firmware, or any combination thereof necessary to perform its functions.

Actuator 5810 receives actuator input signal 5816, and outputs a second acoustic signal, which can be cancellation sound signal 3204, for example. Actuator 5810 is any element or elements that can convert an electrical signal to a sound or audio signal, including one or more audio speakers or piezoelectric devices. As described below, in an embodiment, actuator 5810 can include piezoelectric nanowires that are used to generate an acoustic, sound, or audio output signal.

FIG. 59 shows an example 2×2 array 3100 formed on a substrate 5900, with each of cells 3102a–3102d configured as shown in FIG. 58, according to an example embodiment of the present invention. In the configuration of FIG. 59, it is difficult to include the electronics and actuators of each of cells 3102a–3102d on a single substrate 5900. FIGS. 59 and 60 show example embodiments for array 3100, which include nanowire films. The inclusion of nanowire films enables the formation of array 3100 on a single substrate 5900. These embodiments are further described below.

FIG. 60 shows array 3100 of FIG. 59, with each cell 3102 incorporating a nanowire-based actuator interface circuit 6008, according to an example embodiment of the present invention. Incorporating nanowires in nanowire-based actuator interface circuit 6008 allows for higher levels of performance, reduced space requirements, flexibility, and additional benefits further described elsewhere herein. Example embodiments for nanowire-based actuator interface circuit 6008 are provided below.

FIG. 61 shows array 3100 of FIG. 60, where each cell 3102 incorporates a nanowire-based actuator 6110, according to an example embodiment of the present invention. For example, piezoelectric nanowires are incorporated in nanowire-based actuator 6110 to generate cancellation sound signal 3204. In an embodiment, one or more thin films of piezoelectric nanowires are present in nanowire-based actuator 6110. Each thin film of piezoelectric nanowires is configured to generate a respective frequency, so that a plurality of output frequencies can be present in cancellation sound signal 3204. Alternatively, variations in a current and/or voltage applied to a thin film of piezoelectric nanowires in actuator 6110 can be used to generate different frequencies. Furthermore, incorporating nanowires in nanowire-based actuator 6110 allows for high levels of performance, reduced space requirements, flexibility, and additional benefits described elsewhere herein. Example embodiments for nanowire-based actuator 6110 are provided below.

FIGS. 62 and 63 show example embodiments for nanowire-based interface circuit 6008 and nanowire-based actuator 6110, according to the present invention.

In the example embodiment of FIG. 62, nanowire-based actuator interface circuit 6008 includes a nanowire-based transistor 6202 (other components of nanowire-based actuator interface circuit 6008 not shown). Nanowire-based transistor 6202 includes a source contact 6204, a drain contact 6206, a gate contact 6208, and a thin film of nanowires 6210. Nanowires of thin film of nanowires 6210 can be coated with a dielectric material to create a gate dielectric. Gate contact 6208 receives a control signal that causes thin film of nanowires 6210, which operates as a channel for nanowire-based transistor 6202, to operate nanowire-based transistor 6202.

In FIG. 62, nanowire-based actuator 6110 includes a thin film of piezoelectric nanowires 6214. When nanowire-based transistor 6202 is "on", thin film of piezoelectric nanowires 6214 conducts a current between drain contact 6206 and a contact 6212. When thin film of piezoelectric nanowires 6214 is conducting current, thin film of piezoelectric nanowires 6214 produces a frequency transmitted in cancellation sound signal 3204.

FIG. 63 shows an embodiment where nanowire-based actuator interface circuit 6008 and nanowire-based actuator 6110 are overlapping. Nanowire-based actuator interface circuit 6008 and nanowire-based actuator 6110 include a nanowire-based transistor 6302. Nanowire-based transistor 6302 includes a source contact 6304, a drain contact 6306, a gate contact 6312, and a thin film of piezoelectric nanowires 6308. Nanowires of thin film of piezoelectric nanowires 6308 can be coated with a dielectric material to create a gate dielectric. Gate contact 6312 receives a signal that causes thin film of piezoelectric nanowires 6308, which operates as a channel for nanowire-based transistor 6302, to operate nanowire-based transistor 6302. When nanowire-based transistor 6302 is "on", thin film of piezoelectric nanowires 6308 conducts a current between source contact 6304 and drain contact 6306. When thin film of piezoelectric nanowires 6308 is conducting current, thin film of piezoelectric nanowires 6308 produces a frequency present in cancellation sound signal 3204.

The embodiments described above for nanowire-based actuator interface circuit 6008 and nanowire-based actuator 6110 are provided for illustrative purposes. The present invention is applicable to further embodiments for nanowire-based actuator interface circuit 6008 and nanowire-based actuator 6110, as would be understood by persons skilled in the relevant art(s) from the teachings herein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

What is claimed is:

1. A radio frequency identification (RFID) tag, comprising:
   an antenna;
   a beam-steering array that includes a plurality of tunable elements, each tunable element including:
      a plurality of phase-adjustment components;
      a switch corresponding to each phase-adjustment component, said switch including a transistor formed by a thin film of nanowires in electrical contact with source and drain contacts;
      wherein said switch enables said corresponding phase-adjustment component to change a phase of said tunable element;
   wherein an electromagnetic (EM) signal transmitted by said antenna is redirected by said beam-steering array.

2. The RFID tag of claim 1, wherein said beam-steering array focuses said EM signal.

3. The RFID tag of claim 1, wherein said each phase-adjustment element comprises an inductor.

4. The RFID tag of claim 3, wherein said inductor is a micro-strip inductor.

5. The RFID tag of claim 1, wherein said each phase-adjustment element comprises a capacitor.

6. The RFID tag of claim 1, wherein said nanowires are aligned substantially parallel to their long axis.

7. The RFID tag of claim 1, wherein said nanowires are randomly aligned.

8. The RFID tag of claim 1, wherein said nanowires are coated with a dielectric material to thereby form a gate dielectric.

9. The RFID tag of claim 1, wherein said nanowires have doped cores.

10. The RFID tag of claim 1, wherein said nanowires have doped shells.

11. The RFID tag of claim 1, wherein said nanowires have doped cores and shells.

12. The RFID tag of claim 1, wherein said nanowires are N-doped.

13. The RFID tag of claim 1, wherein said nanowires are P-doped.

14. The RFID tag of claim 1, wherein said beam-steering array is a beam-steering reflector, wherein said tunable elements are tunable cells that are co-planar.

15. The RFID tag of claim 14, wherein each tunable cell comprises a resonant structure.

16. The RFID tag of claim 15, wherein said switch enables the electrical coupling of said corresponding phase adjustment component to said resonant structure to change a phase of said tunable cell.

17. The RFID tag of claim 16, wherein each said resonant structure comprises:
   a first electrically conductive layer;
   a second electrically conductive layer;
   a dielectric layer between said first and said second electrically conductive layers; and
   an electrically conductive via through said dielectric layer having a first end coupled to said first electrically conductive layer and having a second end extending through an opening in said second electrically conductive layer.

18. The RFID tag of claim 17, wherein said nanowire film-based transistor is attached to said second electrically conductive layer, wherein a terminal of said nanowire film-based transistor is coupled to said second end of said electrically conductive via.

19. A radio frequency identification (RFID) tag, comprising:
   a beam-steering array that includes a plurality of tunable antenna elements, each tunable antenna element including:
      a plurality of phase-adjustment components;
      a switch corresponding to each phase-adjustment component, said switch including a transistor formed by a thin film of nanowires in electrical contact with source and drain contacts;
      wherein said switch enables said corresponding phase-adjustment component to change a phase of said tunable antenna element;
   wherein an electromagnetic (EM) signal transmitted by said beam-steering array is directed by controlling the phase of each of said plurality of tunable antenna elements.

20. The RFID tag of claim 19, wherein said tunable elements are tunable transmission line segments.

21. The RFID tag of claim 20, wherein said switch shorts said transmission line segment to change a length of said transmission line segment to change a phase of said transmission line segment.

22. A method for steering an electromagnetic (EM) signal related to a radio frequency identification (RFID) tag, comprising:
   (a) receiving the EM signal at a beam-steering array of the RFID tag, wherein the beam-steering array includes a plurality of tunable elements; and
   (b) adjusting a phase of a tunable element of the beam-steering array to re-direct the EM signal, including the step of:
      (1) actuating a switch corresponding to a phase-adjustment component coupled to the tunable element to change a phase of the tunable element, the switch including a transistor formed by a thin film of nanowires in electrical contact with source and drain contacts.

23. The method of claim 22, further comprising:
(c) prior to step (a), transmitting the EM signal from an antenna of the RFID tag;
wherein step (a) comprises receiving the EM signal from the antenna.

24. The method of claim 23, wherein step (b) comprises: re-directing the EM signal towards a reader.

25. The method of claim 23, wherein step (a) comprises: receiving the EM signal from a reader.

26. The method of claim 25, further comprising:
(c) scanning the beam-steering array to determine a direction from which the EM signal is received.

27. The method of claim 26, wherein step (c) comprises the steps of:
(1) performing step (b) for at least one tunable element of the beam-steering array;
(2) measuring an amplitude of the received EM signal;
(3) comparing the measured amplitude with a previously measured amplitude;
(4) repeating steps (1)–(3) until a maximum measured amplitude is determined.

28. The method of claim 26, wherein step (b) comprises: re-directing the EM signal towards an antenna of the tag.

29. The method of claim 22, wherein step (b) comprises: focusing the EM signal.

30. The method of claim 22, wherein step (b) comprises: spreading the EM signal.

31. The method of claim 22, wherein each phase-adjustment element comprises an inductor, wherein said actuating step comprises:
actuating the switch corresponding to the inductor coupled to the tunable element to change a phase of the tunable element.

32. The method of claim 22, wherein each phase-adjustment element comprises an capacitor, wherein said actuating step comprises:
actuating the switch corresponding to the capacitor coupled to the tunable element to change a phase of the tunable element.

33. The method of claim 22, wherein the beam-steering array is a beam-steering reflector, wherein the tunable elements are co-planar tunable cells comprising a resonant structure, wherein step (1) comprises:
actuating a switch corresponding to a phase-adjustment component coupled to the resonant structure to change a phase of the resonant structure.

34. A method for steering an electromagnetic (EM) signal related to a radio frequency identification (RFID) tag, comprising:
(a) transmitting the EM signal using a beam-steering array of the RFID tag, wherein the beam-steering array includes a plurality of tunable antenna elements; and
(b) adjusting a phase of a tunable antenna element of the beam-steering array to re-direct the EM signal, including the step of:
(1) actuating a switch corresponding to a phase-adjustment component coupled to the tunable antenna element to change a phase of the tunable element, the switch including a transistor formed by a thin film of nanowires in electrical contact with source and drain contacts.

35. The method of claim 34, wherein the tunable elements are tunable transmission line segments, wherein step (1) comprises:
actuating a switch corresponding to a phase-adjustment component to short the transmission line segment to change a length of the transmission line segment to change a phase of the transmission line segment.

* * * * *